United States Patent
Nakamura et al.

(10) Patent No.: US 7,558,103 B2
(45) Date of Patent: Jul. 7, 2009

(54) MAGNETIC SWITCHING ELEMENT AND SIGNAL PROCESSING DEVICE USING THE SAME

(75) Inventors: Shiho Nakamura, Fujisawa (JP); Yuichi Motoi, Kawasaki (JP); Shigeru Haneda, Yokohama (JP); Hirofumi Morise, Yokohama (JP); Takahiro Hirai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 11/729,982

(22) Filed: Mar. 30, 2007

(65) Prior Publication Data

US 2007/0211525 A1    Sep. 13, 2007

Related U.S. Application Data

(63) Continuation-in-part of application No. 11/517,559, filed on Sep. 8, 2006, now abandoned.

(30) Foreign Application Priority Data

Sep. 9, 2005    (JP)    ............... 2005-262579

(51) Int. Cl.
*G11C 11/00*    (2006.01)
(52) U.S. Cl. .............. 365/151; 365/164; 365/171; 977/725; 977/943
(58) Field of Classification Search ........... 365/151, 365/158, 164, 171, 173; 977/725, 933, 935, 977/943
See application file for complete search history.

(56) References Cited

U.S. PATENT DOCUMENTS 6,445,006 B1 *   9/2002   Brandes et al. ............... 257/76

| 6,574,130 B2 | 6/2003 | Segal et al. |
| 6,625,047 B2 * | 9/2003 | Coleman, Jr. ............... 365/51 |
| 7,095,645 B2 * | 8/2006 | Pinkerton et al. ........... 365/151 |
| 7,256,063 B2 * | 8/2007 | Pinkerton et al. ............. 438/53 |
| 7,348,591 B2 * | 3/2008 | Yamauchi et al. .............. 257/9 |

(Continued)

FOREIGN PATENT DOCUMENTS

JP    2004-221442    8/2004

OTHER PUBLICATIONS

Ohno et al., "Synthesis of carbon nanotube peapods directly on Si substrates" Applied Physics Letters 86, 023109 (2005).
Kong et al. "Synthesis, integration, and electrical properties of individual single-walled carbon nanotubes", Applied Physics A69, pp. 305-308, 1999.

(Continued)

*Primary Examiner*—VanThu Nguyen
*Assistant Examiner*—Alexander Sofocleous
(74) *Attorney, Agent, or Firm*—Nixon & Vanderhye, PC

(57) ABSTRACT

A magnetic switching element according to an example of the present invention includes a magnetic element, first and second electrodes which put the magnetic element therebetween, a current control section which is connected to the first and second electrodes, the current control section controlling a magnetization direction of a magnetization free section in such a manner that a current is made to flow between the magnetization free section and the magnetization fixed section, a movable conductive tube having a fixed end and a free end, and a third electrode connected to the fixed end of the conductive tube. A switching operation is performed in such a manner that a spatial position of the conductive tube is caused to change depending on the magnetization direction of the magnetization free section.

33 Claims, 36 Drawing Sheets

U.S. PATENT DOCUMENTS

| | | | |
|---|---|---|---|
| 7,362,605 B2 * | 4/2008 | Pinkerton et al. | 365/151 |
| 2004/0238907 A1 * | 12/2004 | Pinkerton et al. | 257/419 |
| 2005/0035367 A1 | 2/2005 | Bertin et al. | |
| 2006/0086994 A1 * | 4/2006 | Viefers et al. | 257/415 |
| 2007/0037414 A1 | 2/2007 | Yamauchi et al. | |

OTHER PUBLICATIONS

Matsumoto et al, "Single-Electron Transistor with Ultra-High Coulomb Energy of 5000 K Using Position Controlled Grown Carbon Nanotube as Channel", The Japan Society of Applied Physics (2003), vol. 42, pp. 2415-2518.

* cited by examiner

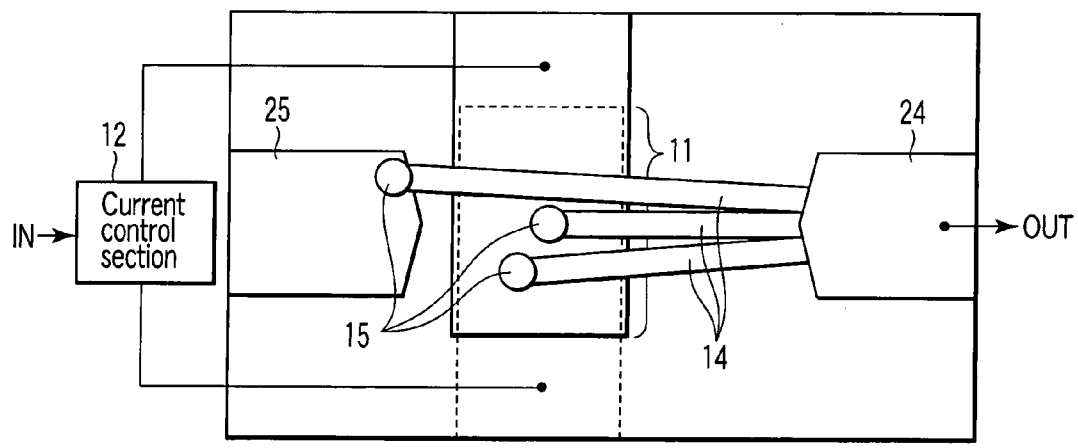
F I G. 13
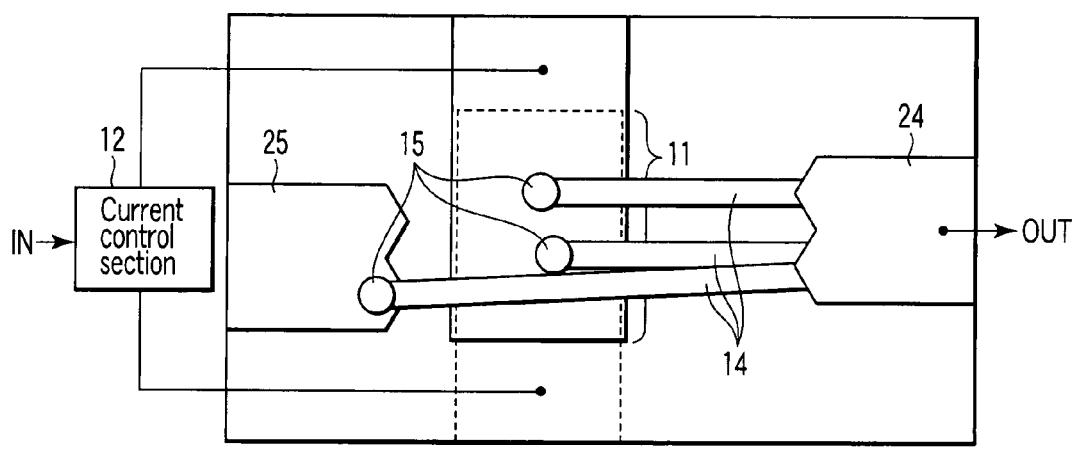
F I G. 14

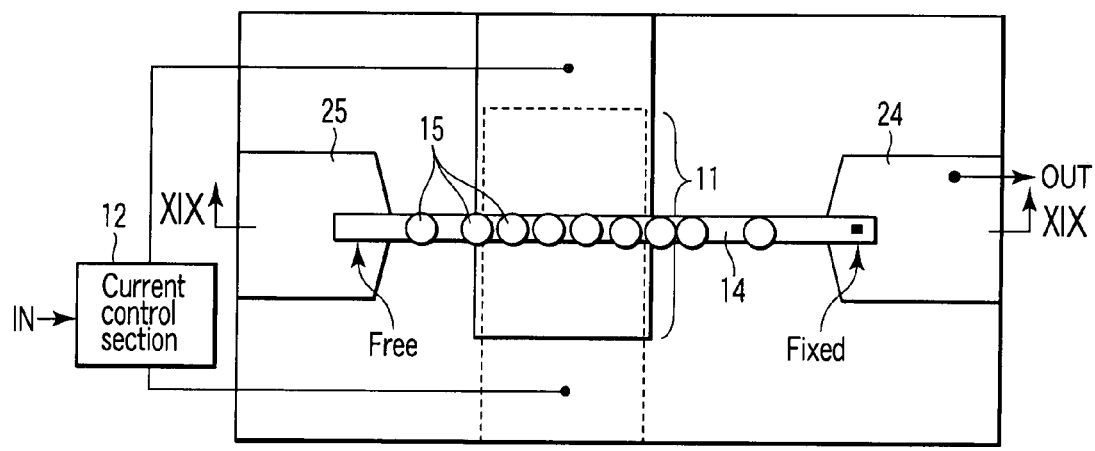
F I G. 18
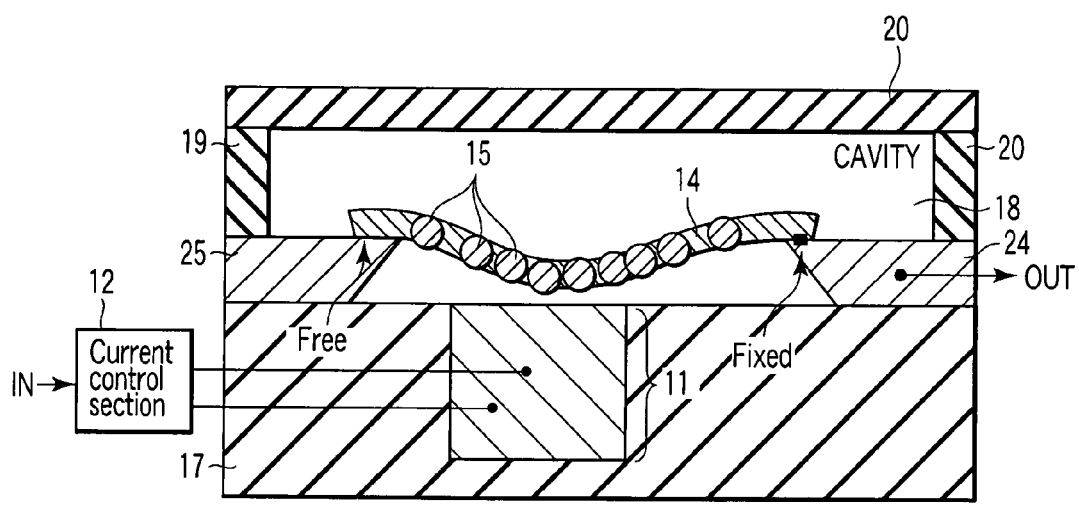
F I G. 19

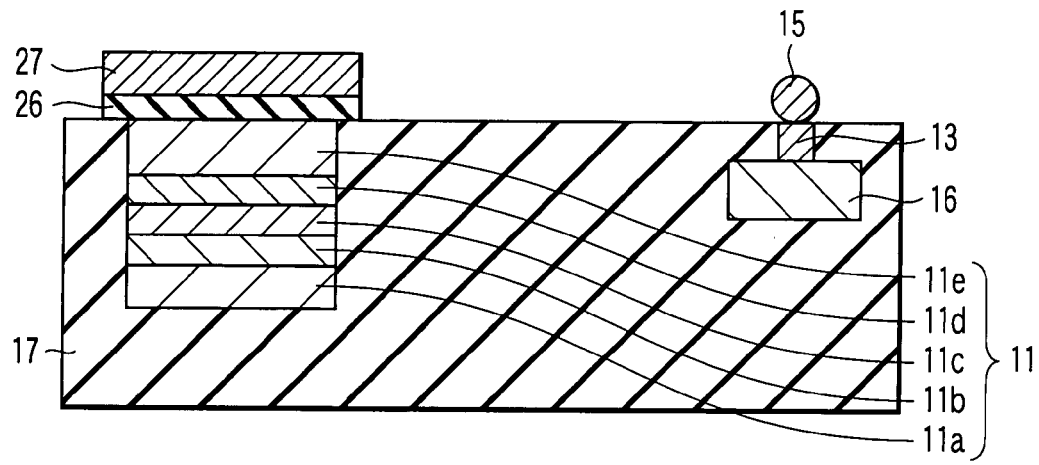
F I G. 22
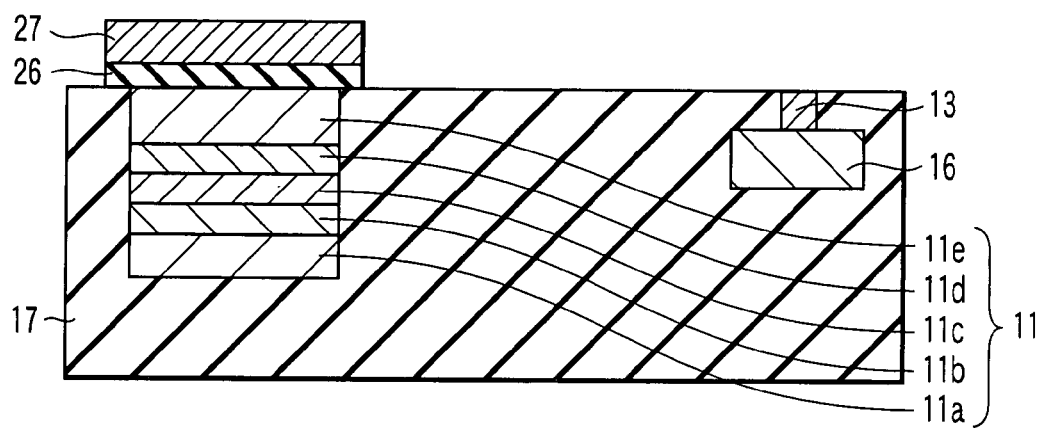
F I G. 23

CASE A   Spin injection current Off                    Spin injection current On
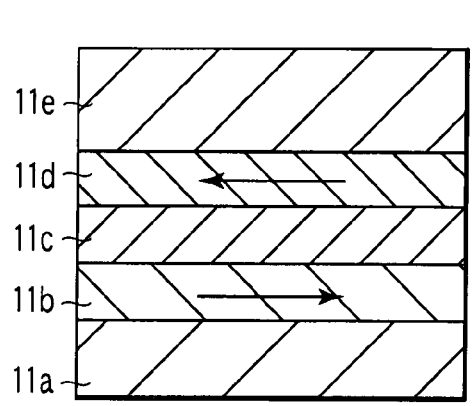 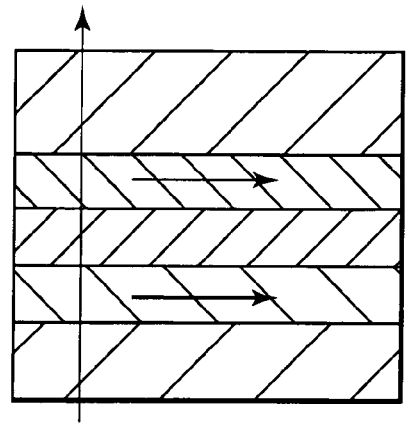
No magnetic field                                       Electron flow generate
(Switch ⇨ Off/On)                                       Magnetic field
                                                        (Switch ⇨ On/Off)
F I G. 26
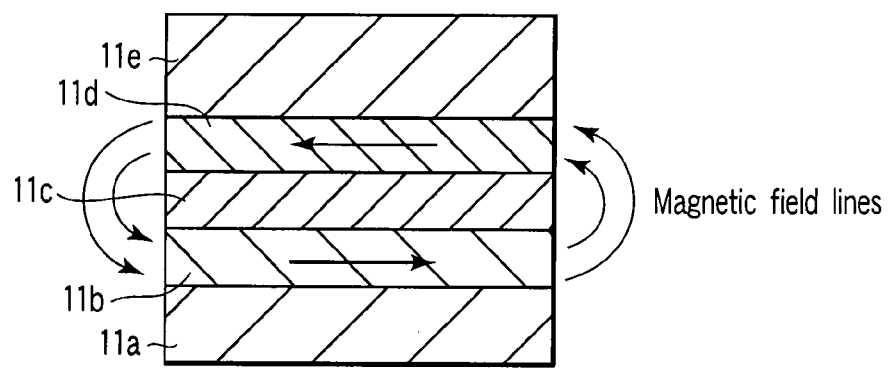
F I G. 27

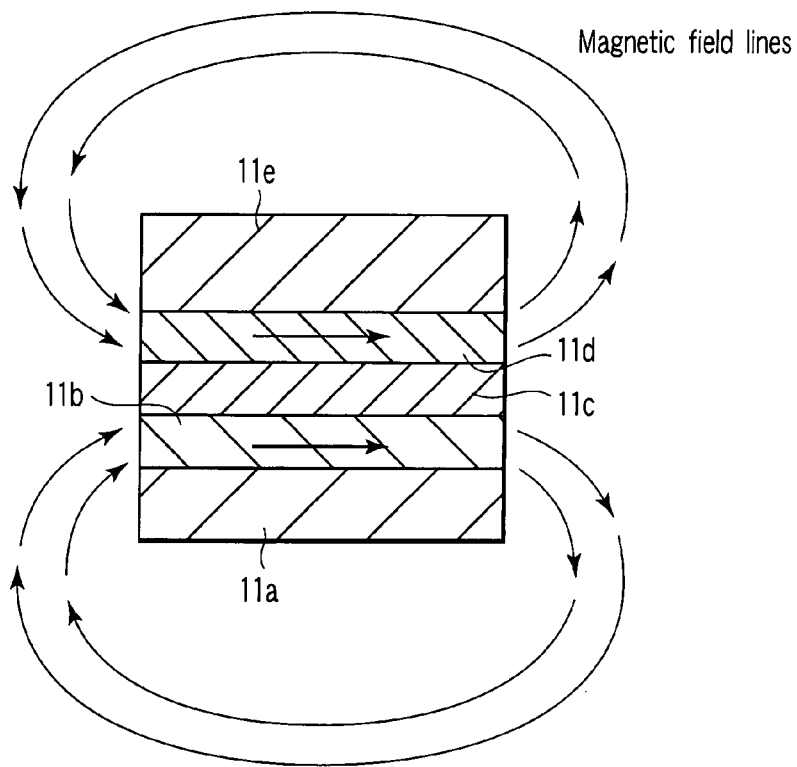
F I G. 28
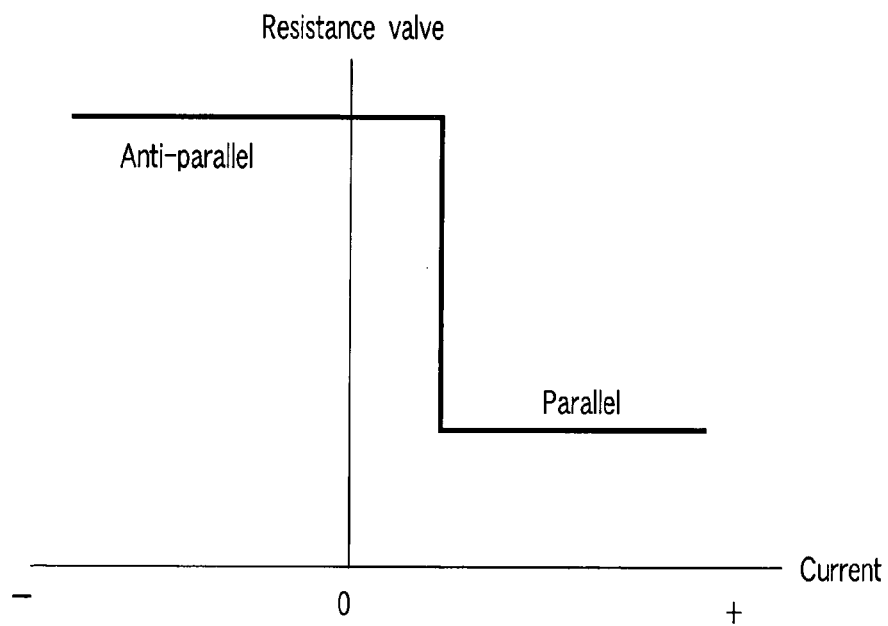
F I G. 29

CASE B  Spin injection current Off        Spin injection current On

CASE D  Spin injection current Off

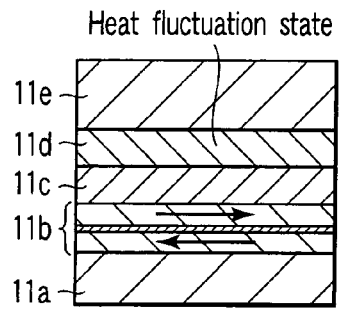

Heat fluctuation state

No magnetic field
(Switch ⇨ Off/On)

Spin injection current On

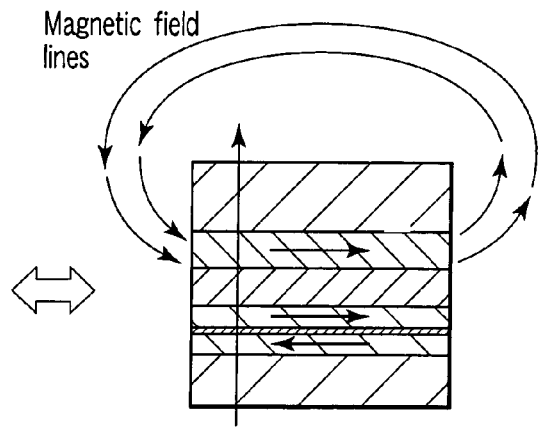

Magnetic field lines

Electron flow generate

Magnetic field
(Switch ⇨ On/Off)

FIG. 34

CASE E  Spin injection current (plus) On +
Magnetized state holds after spin
injection current cut off

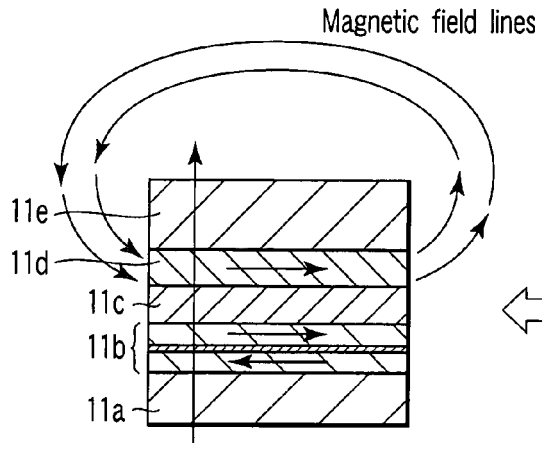

Magnetic field lines

Electron flow generate

Magnetic field
(Switch ⇨ On/Off)

Spin injection current (minus) On +
Magnetized state holds after spin
injection current cut off

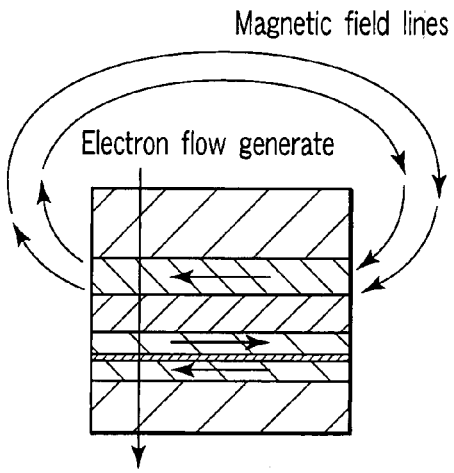

Magnetic field lines

Electron flow generate

Magnetic field
(Switch ⇨ Off/On)

FIG. 35

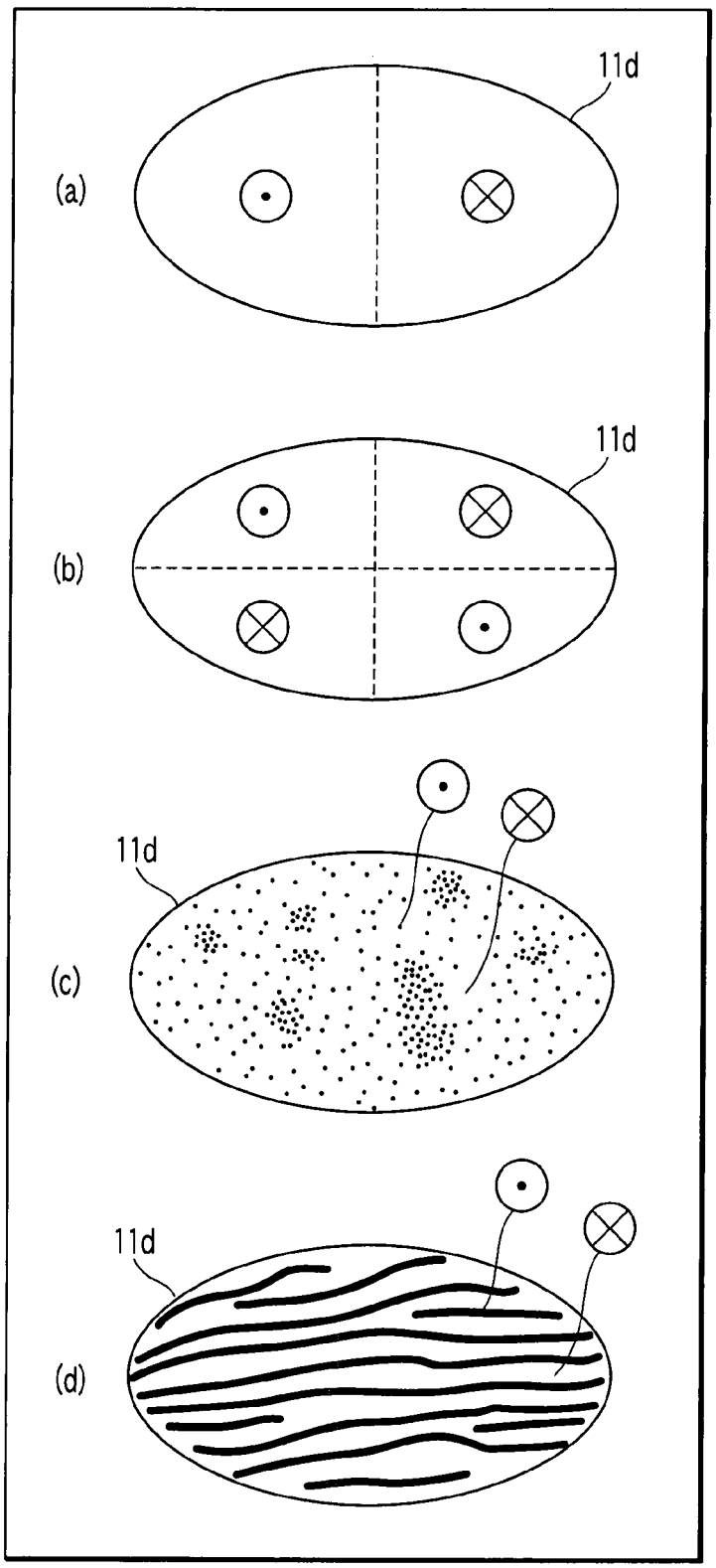
F I G. 50

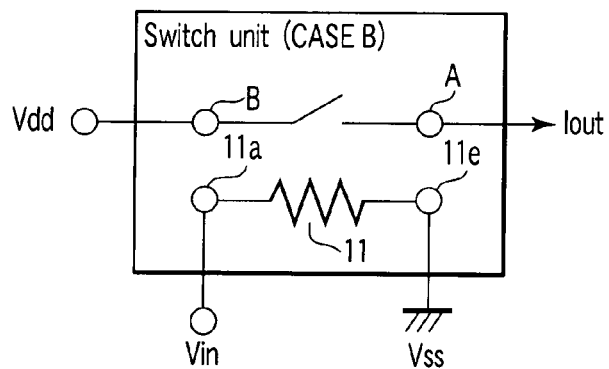
F I G. 51
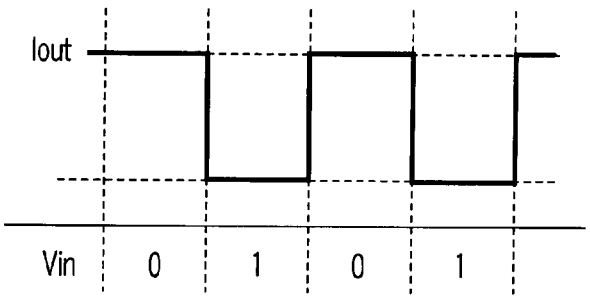
F I G. 52
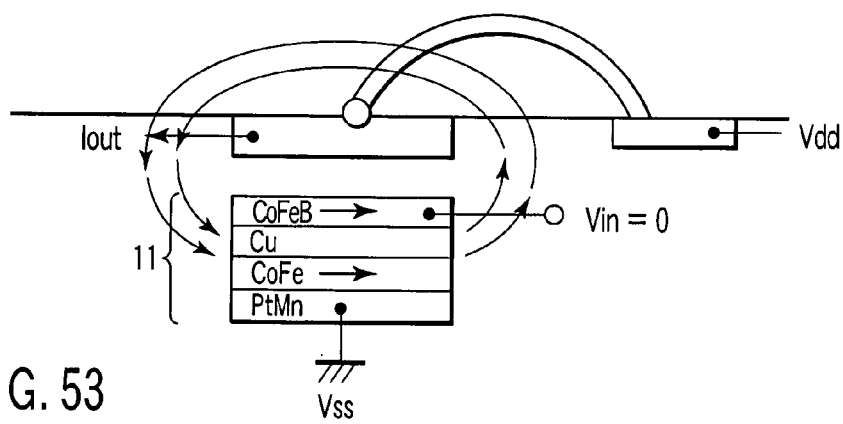
F I G. 53
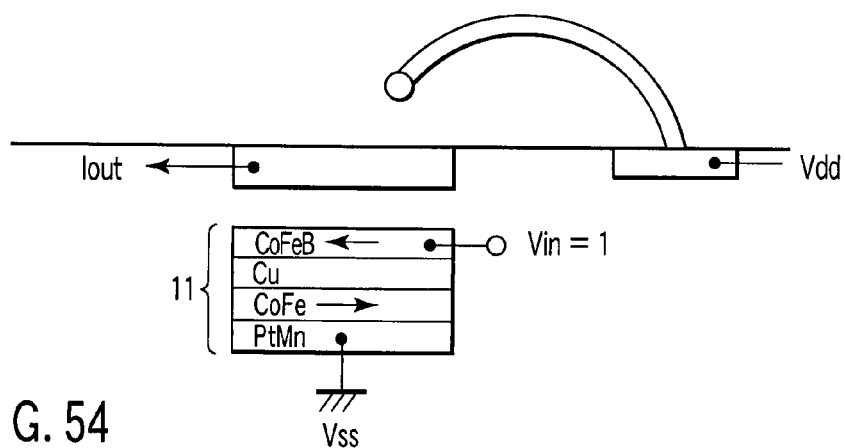
F I G. 54

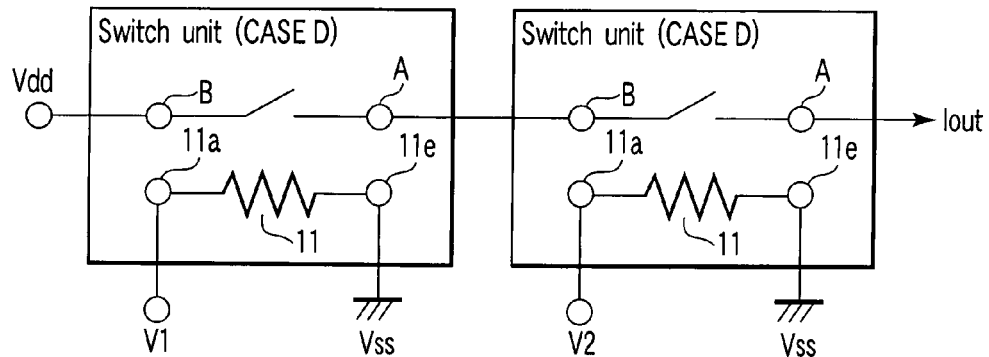
FIG. 55
FIG. 56
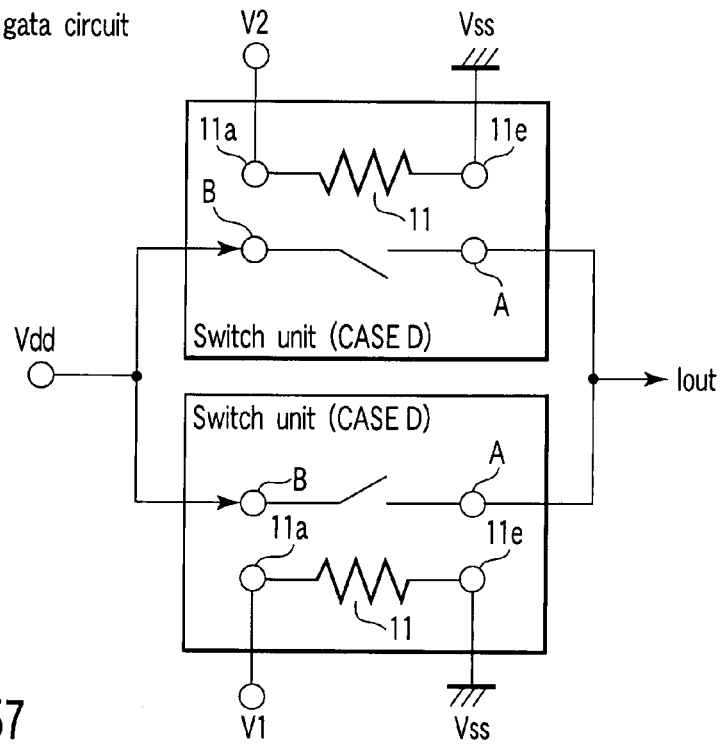
FIG. 57

Brief of 3D chip

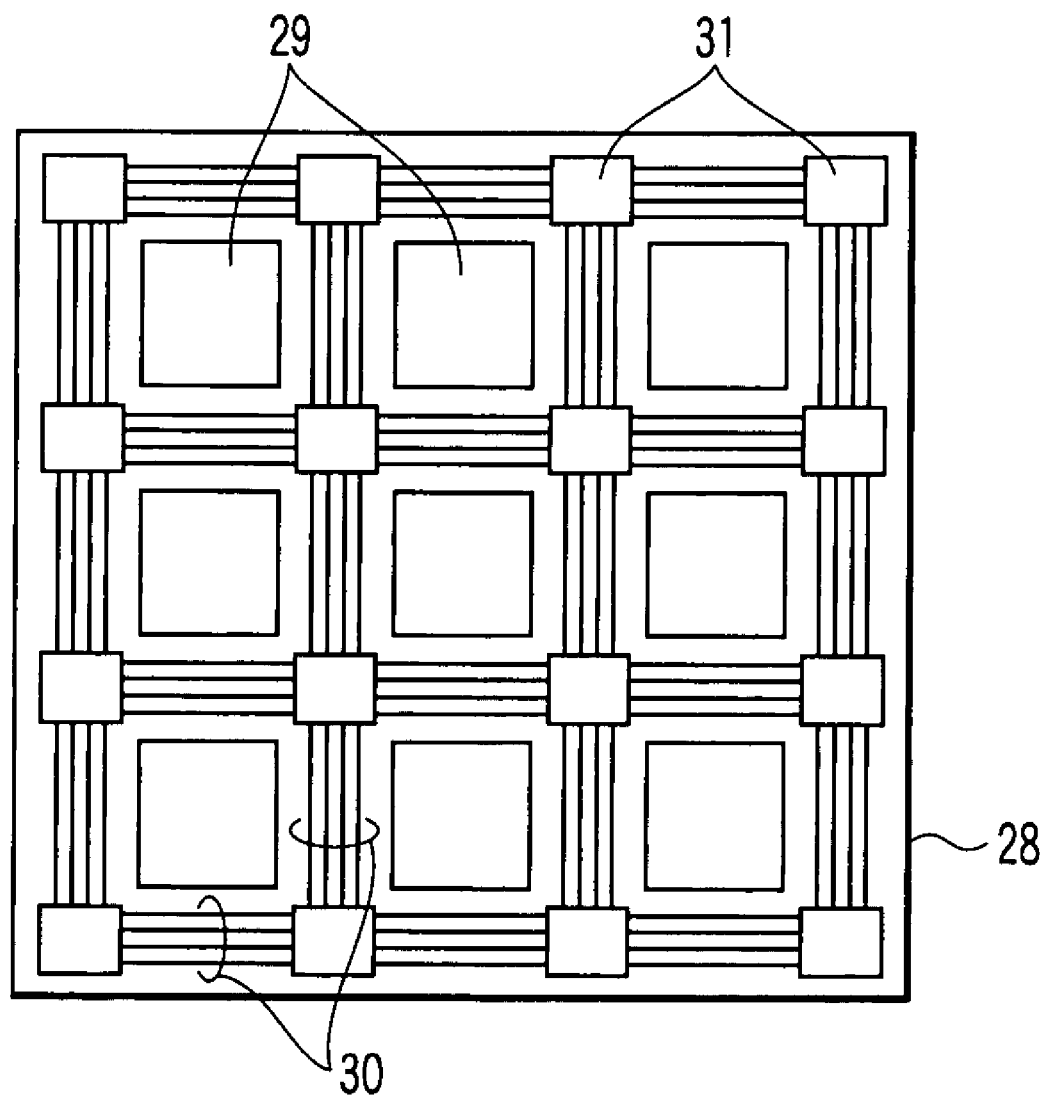
F I G. 63

MAGNETIC SWITCHING ELEMENT AND SIGNAL PROCESSING DEVICE USING THE SAME

CROSS-REFERENCE TO RELATED APPLICATIONS

This is a Continuation-in-Part application of U.S. patent application Ser. No. 11/517,559, filed Sep. 8, 2006, now abandoned, the entire contents of which are incorporated herein by reference.

This application is based upon and claims the benefit of priority from prior Japanese Patent Application No. 2005-262579, filed Sep. 9, 2005, the entire contents of which are incorporated herein by reference.

BACKGROUND OF THE INVENTION

1. Field of the Invention

The present invention relates to a switching element which uses a magnetic force.

2. Description of the Related Art

A switching element using a semiconductor represented by a MOSFET or a diode can be ultra-miniaturized and integrated, and therefore, such a switching element becomes one of indispensable devices in various existing electronic devices.

Meanwhile, development advances concerning microscopic machine such as a micro-machine or a nano-machine due to an improvement of a nano-technology of late. For example, in a medical field, a nano-machine will be materialized in the not-too-distant future.

By the way, a drive source of such a microscopic machine is a battery or radio wave. For this reason, energy loss is fatal for the micro machine.

Accordingly, accomplishment of power saving is desired with respect to the whole element in relation to the micro machine.

However, as for the switching element such as the MOSFET or diode, an ON/OFF resistance ratio is small and ON resistance is large, and thus, it is disadvantageous for accomplishment of power saving. For this reason, in the case where the switching element is applied to the microscopic machine, the problem that the battery life is dead soon takes place (for example, JP-A 2004-221442 (KOKAI), Appl. Phys. Lett. 86 023109 (2005), Appl. Phys. A69, 305-308 (1999), Jpn. J. Appl. Phys. 42, 2416 (2003)).

BRIEF SUMMARY OF THE INVENTION

A magnetic switching element according to an aspect of the present invention comprises, a magnetic element composed of a magnetization fixed section whose magnetization direction is fixed, a magnetization free section whose magnetization direction changes due to spin-polarized electrons, and a non-magnetic intermediate layer between the magnetization fixed section and the magnetization free section, first and second electrodes which puts the magnetic element therebetween, a current control section which is connected to the first and second electrodes, the current control section controlling the magnetization direction of the magnetization free section in such a manner that a current is made to flow between the magnetization fixed section and the magnetization free section, a movable conductive tube having a fixed end and a free end, a magnetic fine particle provided at the conductive tube, and a third electrode connected to the fixed end of the conductive tube.

A magnetic switching element according to another aspect of the present invention comprises, a magnetic element composed of a magnetization fixed section whose magnetization direction is fixed, a magnetization free section whose magnetization direction changes due to spin-polarized electrons, and a non-magnetic intermediate layer between the magnetization fixed section and the magnetization free section, first and second electrodes which put the magnetic element therebetween, a current control section which is connected to the first and second electrodes, the current control section controlling the magnetization direction of the magnetization free section in such a manner that a current is made to flow between the magnetization fixed section and the magnetization free section, a movable conductive tube having a fixed end and a free end, a third electrode connected to the fixed end of the conductive tube, a magnetic fine particle provided at the conductive tube, and a supporting stand which supports the free end of the conductive tube.

A signal processing device according to still another aspect of the present invention comprises switch units each comprising the magnetic switching element according to the aspect of the invention. A logic circuit is composed of combination of the switch units.

BRIEF DESCRIPTION OF THE SEVERAL VIEWS OF THE DRAWING

FIG. 13 is a cross sectional view showing a first modified example of the third embodiment;

FIG. 14 is a cross sectional view showing a second modified example of the third embodiment;

FIG. 18 is a plan view of a magnetic switching element according to a sixth embodiment;

FIG. 19 is a cross sectional view taken along a line XIX-XIX of FIG. 18;

FIG. 22 is a cross sectional view showing one process of a manufacturing method according to an example of the present invention;

FIG. 23 is a cross sectional view showing one process of a manufacturing method according to an example of the present invention;

FIG. 26 is a view showing CASE A of switching principles according to an example of present invention;

FIG. 27 is a view showing magnetic field lines generated from a magnetic element in an anti-parallel state;

FIG. 28 is a view showing magnetic field lines generated from a magnetic element in a parallel state;

FIG. 29 is a graph showing a relationship between a resistance value and a current that flows through the magnetic element of CASE A;

FIG. 34 is a view showing CASE D of the switching principles according to an example of the present invention;

FIG. 35 is a view showing CASE E of the switching principles according to an example of the present invention;

FIG. 50 is a view showing an example of the magnetic domain structure;

FIG. 51 is a circuit diagram showing an inverter circuit using a magnetic switching element;

FIG. 52 is a waveform diagram showing an input/output waveform of the inverter circuit of FIG. 51;

FIG. 53 is a view showing a state at the time of ON of the inverter circuit of FIG. 51;

FIG. 54 is a view showing a state at the time of OFF of the inverter circuit of FIG. 51;

FIG. 55 is a circuit diagram showing an AND gate circuit using a magnetic switching element;

FIG. 56 is a waveform diagram showing an input/output waveform of the AND gate circuit of FIG. 55;

FIG. 57 is a circuit diagram showing an OR gate circuit using a magnetic switching element;

FIG. 63 is a view showing a structure image of FPGA.

DETAILED DESCRIPTION OF THE INVENTION

A magnetoresistive element of an aspect of the present invention will be described below in detail with reference to the accompanying drawings.

1. Outline

In an example of the present invention, a switching element such as MOSFET for controlling ON/OFF operation electrically is not proposed, but a mechanical switching element for controlling ON/OFF operation mechanically is proposed.

A conductive tube, such as carbon nanotube, having sufficient intensity and elastic force is utilized as a moving element. Then, a switching operation is performed in such a manner that a magnetic fine particle is arranged at a tip end of the conductive tube and a physical position of the magnetic fine particle is controlled by a magnetic force.

A magnetic field which is basis of the magnetic force is generated by a magnetic element. The magnetic element contains a magnetization fixed section whose magnetization direction is fixed and a magnetization free section whose magnetization direction is changed. A magnetic field is controlled depending on the magnetization direction of the magnetization free section.

The magnetization direction of the magnetization free section is changed in such a manner that spin-polarized electrons are made to flow into the magnetic element. That is, switching can be controlled by controlling a spin-polarized current (or electrons) in a current control section.

Such switching elements are referred to as magnetic switching elements.

The magnetic switching element can be formed on a semiconductor substrate by using, for example, a semiconductor process. For this reason, it is possible to combine a semiconductor integrated circuit such as a CMOS logic circuit or a memory circuit with the magnetic switching element.

Further, if constituting a switch unit with the magnetic switching element, it is possible to form a signal processing device serving as a logic circuit by combining a plurality of switch units. Further, a 3D (dimension)-chip can be also formed while accumulating a plurality of switch units on the semiconductor substrate.

2. Embodiment

Now, embodiments of the invention will be described.

(1) FIRST EMBODIMENT

A first embodiment relates to a magnetic switching element in a state that a channel of an input signal IN and a channel of an output signal OUT are overlapped with each other, the input signal IN and output signal OUT cause the switch to operate ON/OFF.

A. Basic Structure

Figure 1:
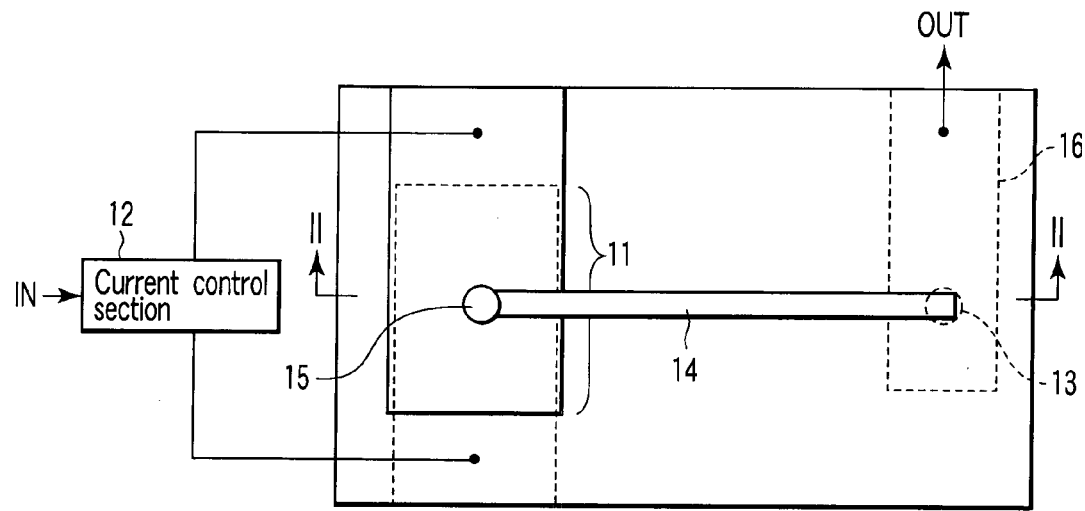
FIG. 1 is a plan view of a magnetic switching element according to a first embodiment.
Figure 2:
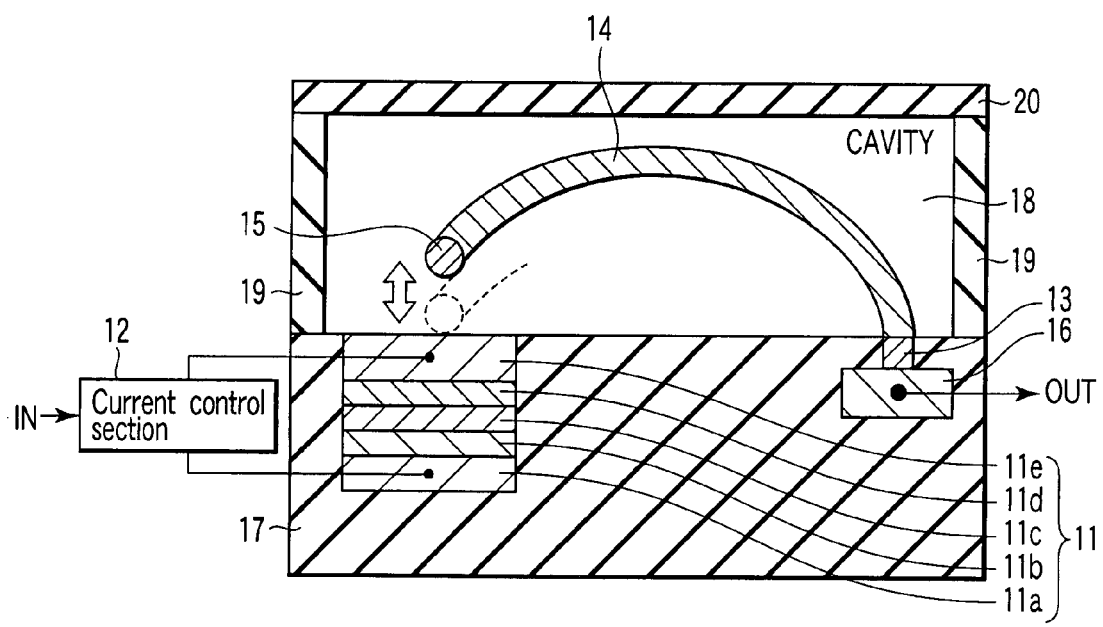
FIG. 2 is a cross sectional view taken along a line II-II of FIG. 1.

FIG. 1 is a plan view of the magnetic switching element according to the first embodiment. FIG. 2 is a cross sectional view taken along a line II-II of FIG. 1.

A magnetic field generation section 11 is composed of first and second electrodes 11a, 11b and a magnetic element arranged between the electrodes. The magnetic element is composed of magnetic layers 11b, 11d and a non-magnetic layer 11c arranged between the magnetic layers.

One of the two magnetic layers 11b, 11d functions as a magnetization fixed section whose magnetization direction is fixed, while the other thereof functions as a magnetization free section whose magnetization direction is changed due to spin-polarized electrons.

It is preferable that the non-magnetic layer 11c serving as an intermediate layer is a non-magnetic conductive layer. However, for example, the non-magnetic layer 11c may be a non-magnetic insulating layer functioning as a tunnel barrier layer.

A current control section 12 is connected to the first and second electrodes 11a, 11e, and controls the magnetization direction of the magnetization free section in such a manner that a spin injection current is made to flow between the magnetic layers 11b, 11d, for example, based on the input signal IN.

A conductive tube 14 is constituted of, for example, a carbon nanotube, and functions as a moving element. The conductive tube 14 has a fixed end and a free end. A third electrode 13 is connected to the fixed end of the conductive tube 14, and a lead layer 16 is connected to the third electrode 13. Further, a magnetic fine particle 15 is arranged at the free end of the conductive tube 14.

Here, the conductive tube 14 is illustrated as being of one. However, a plurality of conductive tubes 14 may extend toward the upper part of the magnetic field generation section 11 from the third electrode 13.

The magnetic field generation section 11, the third electrode 13 and the lead layer 16 are buried in an insulating layer 17. On the insulating layer 17, insulating layers 19, 20 surrounding the conductive tube 14 are provided. As a result, a cavity 18 is formed, and the conductive tube 14 is arranged in the cavity 18.

The magnetic switching element (switch unit) is constituted by the above elements.

B. Modified Example

Figure 3:
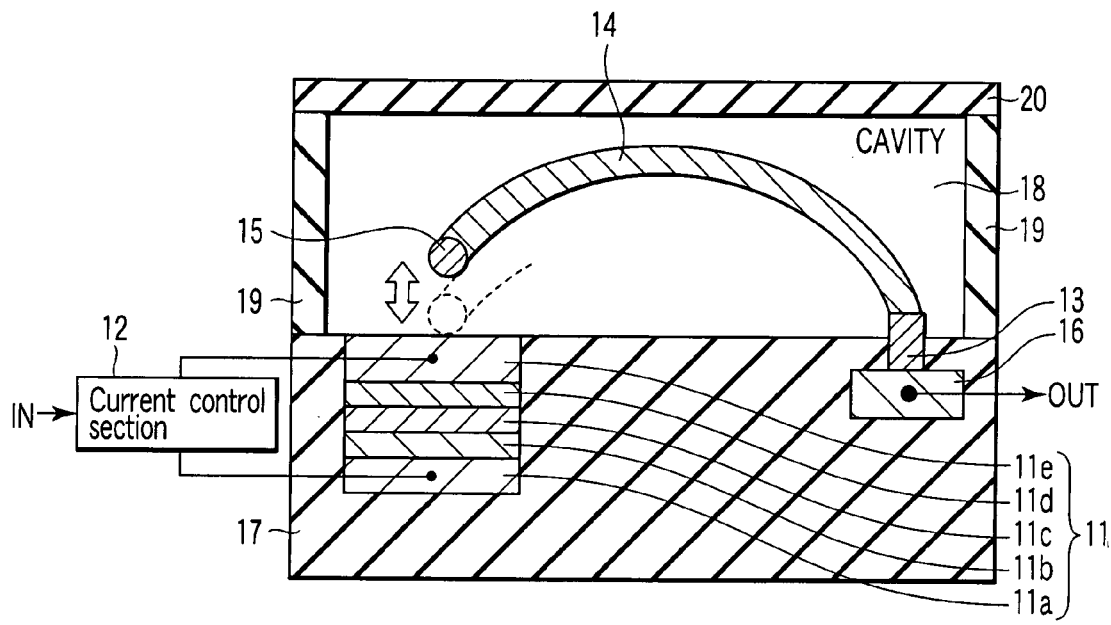
FIG. 3 is a cross sectional view showing a first modified example of the first embodiment.

FIG. 3 shows a first modified example of the first embodiment.

A plan view is the same as FIG. 1. The modified example is characterized in that an upper surface of the third electrode 13 is upper than an upper surface of the second electrode 11e.

In this modified example, the third electrode 13 has a shape projected from the insulating layer 17.

Provided that above-described condition is satisfied, part or the whole of a side wall of the third electrode 13 of part projected from the insulating layer 17 may be covered with an insulating layer.

With the configuration described above, growth of the conductive tube 14 becomes easy, so that reliability of a device is improved.

Figure 4:
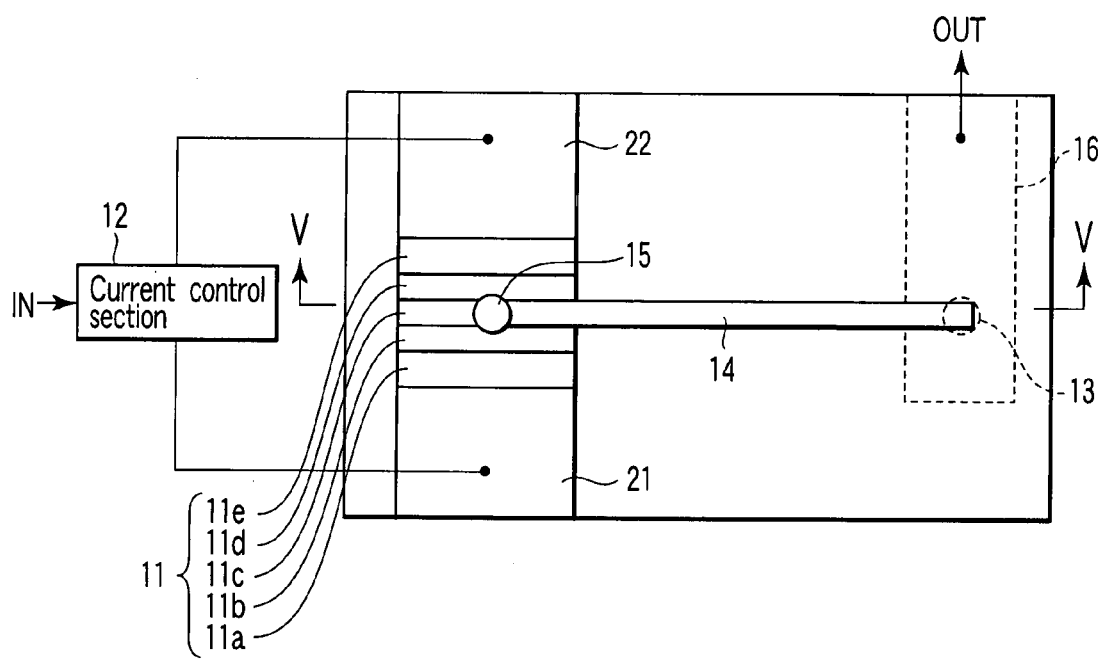
FIG. 4 is a plan view showing a second modified example of the first embodiment.
Figure 5:
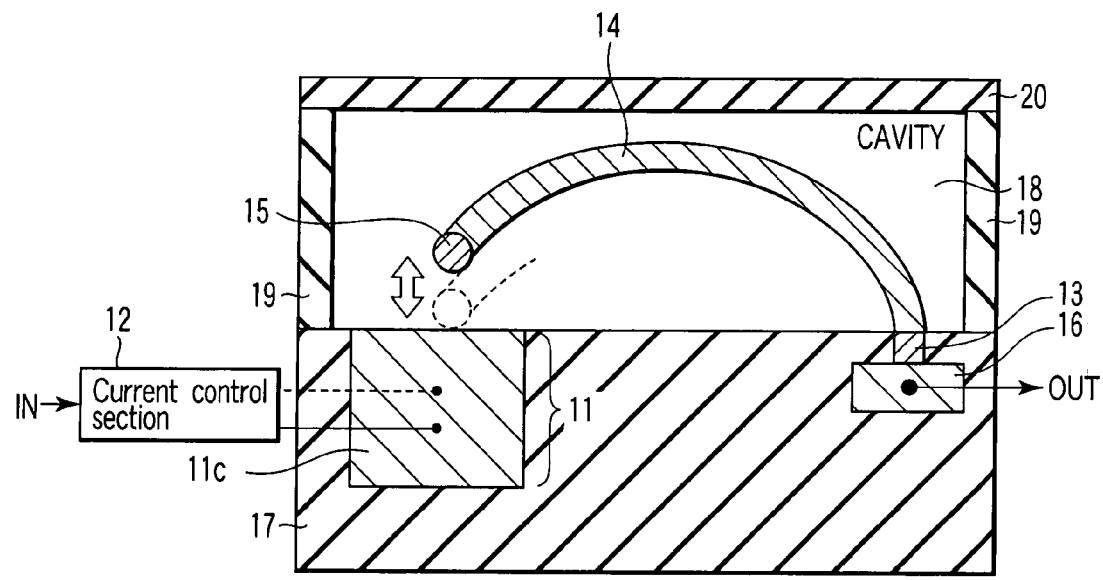
FIG. 5 is a cross sectional view taken along a line V-V of FIG. 4.

FIG. 4 shows a second modified example of the first embodiment. FIG. 5 is a cross sectional view taken along a line V-V of FIG. 4.

A characteristic of the modified example resides in structure of the magnetic field generation section 11. The respective layers 11a to 11e constituting the magnetic field generation section 11 are stacked in not a vertical direction (up and down direction), but a lateral direction (right and left direction).

Here, a lead layer 21 is connected to the first electrode 11a, and a lead layer 22 is connected to the second electrode 11e. However, the lead layer 21 may be integrated with the first electrode 11a, and also the lead layer 22 may be integrated with the second electrode 11e.

In addition, the respective layers 11a to 11e constituting the magnetic field generation section 11 may be stacked in an oblique direction, neither in the vertical direction nor in the lateral direction.

In other words, the respective layers 11a to 11e may be stacked in any direction as long as the spin injection current crosses interfaces of the respective layers 11a to 11e.

C. Basic Operation

A basic operation is performed in such a manner that the spin-polarized electrons are made to flow into the magnetic element to thereby control a composite magnetic field composed of a magnetic field generated from the magnetization fixed section and a magnetic field generated from the magnetization free section. Specifically, a spatial position of the magnetic fine particle 15 is changed in accordance with the magnetization direction of the magnetization free section in order to perform ON/OFF operation of the amount of current flowing between the third electrode 13 and the first or second electrode 11a, 11e.

For example, when the magnetization directions of the magnetic layers 11b, 11d are in a parallel state (the same direction), the composite magnetic field is generated, and then, the magnetic fine particle 15 moves by the magnetic force. On the other hand, when the magnetization direction of the magnetic layers 11b, 11d is in an anti-parallel direction (opposite directions), the composite magnetic field disappears, and the magnetic fine particle 15 returns to the initial position by the elastic force of the conductive tube 14.

In the case where the magnetic fine particle 15 is separated from the first or second electrode 11a, 11e in an initial state that the magnetic field is not generated, a normally-off-type switching element is constituted, while in the case where the magnetic fine particle 15 comes into contact with the first or second electrode 11a, 11e in the initial state that the magnetic field is not generated, a normally-on-type switching element is constituted.

D. Layout

The Layout of the first electrode 11a, the second electrode 11e, the third electrode 13 and the lead layers 16, 21 and 22 is not limited to the present embodiment. Their shapes, extending directions and the like can be set freely in the condition not to interfere with one another.

A planar shape of the magnetic element within the magnetic field generation section 11 is also not limited to the present embodiment. For example, the planar shape of the magnetic element may adopt a square, a diamond shape, a circle, an oval and the like in addition to a rectangle.

Further, the magnetic field generation section 11 can be also set so as to become shapes such as a column and a square pillar as a whole. Furthermore, the magnetic field generation section 11 may become a shape in which an upper layer becomes tapered-shape at the tip end compared with a lower layer as a whole, in such a manner that planar shapes of the respective layers 11a to 11e constituting the magnetic field generation section 11 are formed with a dimension gradually decreasing as going from the lower layer to the upper layer.

E. Size

An average size of the respective layers 11a to 11e constituting the magnetic field generation section 11 is as follows. That is, when its planar shape is made to be a four-sided figure, each one side is preferably not more than 200 nm, and further, most preferably not more than 100 nm.

This is because magnetization control of the magnetization free layer due to the spin injection current becomes easy when the size of the magnetic element is as small as possible.

Further, it is preferable that a diameter of the conductive tube 14 is made not more than 100 nm, and preferably, the diameter is made degree of several-tens nm.

The reason is as follows. That is, since a distance between the magnetic field generation section 11 and the third electrode 13 is proportional to the diameter of the conductive tube 14, a size of the switch unit becomes large when the diameter becomes large excessively, so that miniaturization of the magnetic switching element cannot be realized.

F. Others

As to the number of the conductive tube 14, it is preferable that plural conductive tubes 14 are provided in order to decrease ON resistance. In this case, the plural conductive tubes 14 may be coupled physically with each other, or may be separated from each other. As a matter of course, some of the plural conductive tubes 14 may be coupled, and the others may be separated.

A positional relationship between the magnetic fixed section and the magnetic free section is that any section may be at its upper side or lower side. Further, the magnetic layers 11b, 11d constituting these sections may be an in-plane magnetization film whose magnetization direction is in parallel to a film plane, or may be a perpendicular magnetization film whose magnetization direction is perpendicular to a film plane.

G. Conclusion

As described above, according to the first embodiment, the ON/OFF operation of the switch is executed due to mechanical contact/non-contact operation, and consequently, an ON/OFF resistance ratio can be infinity. In addition, since the conductive tube is constituted of a material having metallic characteristic, a signal channel is in all metal, and thus it is possible to decrease the ON resistance.

Furthermore, as will be described later, such a magnetic switching element is formed by the semiconductor process. Therefore, ultra miniaturization is possible, and thus, it is possible to realize the switching element in nano-level.

(2) SECOND EMBODIMENT

A second embodiment relates to a magnetic switching element in which a channel of an input signal IN and a channel of an output signal OUT are separated from each other, the signals causing a switch to perform ON/OFF operation.

A. Basic Structure

Figure 6:
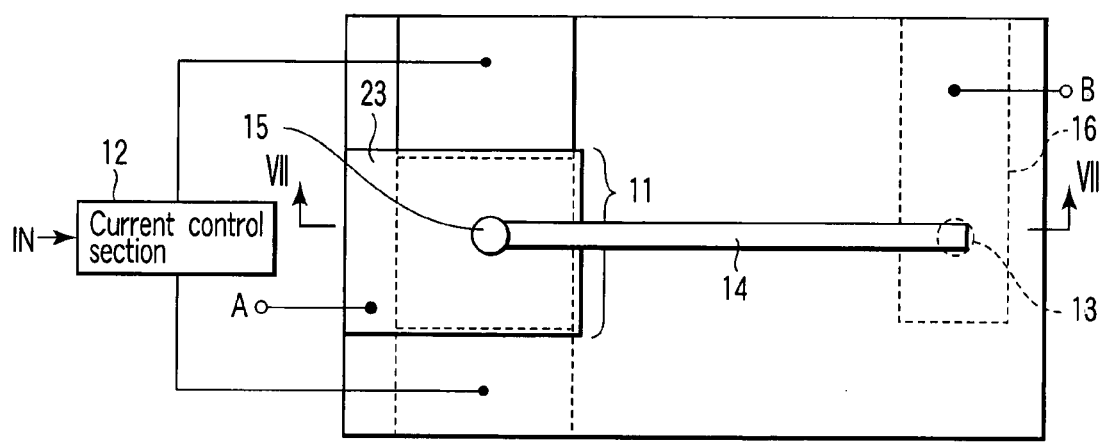
FIG. 6 is a plan view of a magnetic switching element according to a second embodiment.
Figure 7:
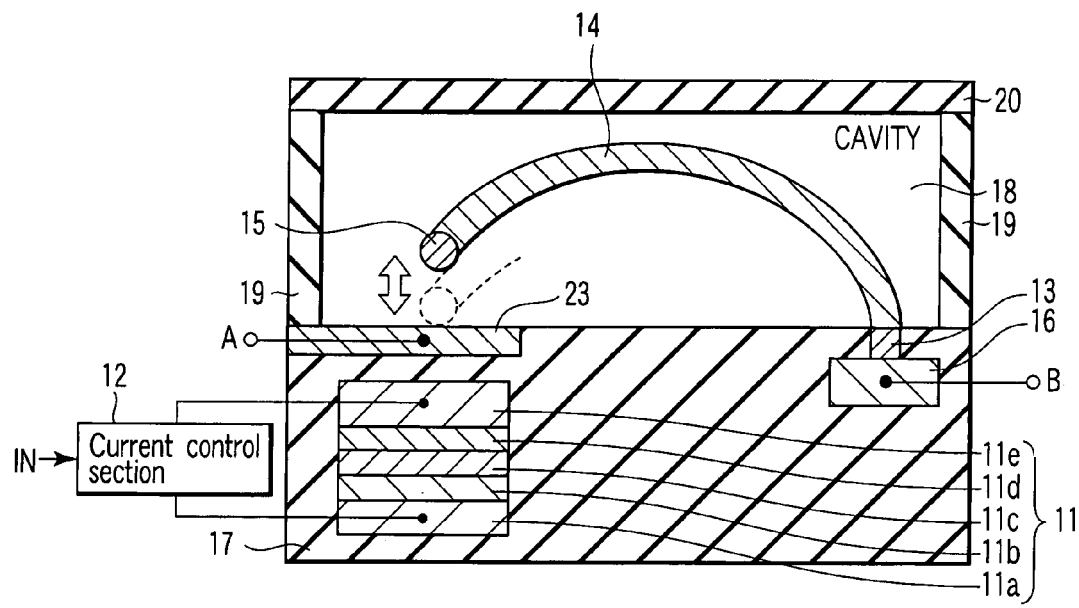
FIG. 7 is a cross sectional view taken along a line VII-VII of FIG. 6.

FIG. 6 is a plan view of the magnetic switching element according to the second embodiment. FIG. 7 is a cross sectional view taken along a line VII-VII of FIG. 6.

A structure of a magnetic field generation section 11 is the same as that of the first embodiment, and is composed of first and second electrodes 11a, 11e, and a magnetic element arranged between the electrodes. The magnetic element is composed of magnetic layers 11b, 11d, and a non-magnetic layer 11c arranged between the magnetic layers.

In the present embodiment, the channel of the input signal IN and the channel of the output signal OUT are separated from each other. For this reason, the second electrode 11e of the magnetic field generation section 11 is buried completely on the inside of an insulating layer 17. Instead, a fourth electrode 23 which is insulated from the first or second electrode 11a, 11e is arranged on a surface area of the insulating layer 17.

A position of the fourth electrode 23 is set, for example, between the magnetic field generation section 11 and the magnetic fine particle 15. The fourth electrode 23 is connected to a terminal A serving as one end of the switch.

A current control section 12 is connected to the first and second electrodes 11a, 11e, and for example, based on the input signal IN, controls the magnetization direction of the magnetization free section in such a manner that a spin injection current is made to flow between the magnetic layers 11b, 11d.

Like the first embodiment, a conductive tube 14 is constituted by, for example, a carbon nanotube, and functions as a moving element. A third electrode 13 is connected to a fixed end of the conductive tube 14, and a lead layer 16 is connected to the third electrode 13. The lead layer 16 is connected to a terminal B serving as the other end of the switch.

The magnetic fine particle 15 is arranged at a free end of the conductive tube 14.

Insulating layers 19, 20 surrounding the conductive tube 14 are provided on the insulating layer 17. As a result, a cavity 18 is formed, and then, the conductive tube 14 is arranged within the cavity 18.

The magnetic switching element (switch unit) is constituted by the above elements.

B. Modified Example

Figure 8:
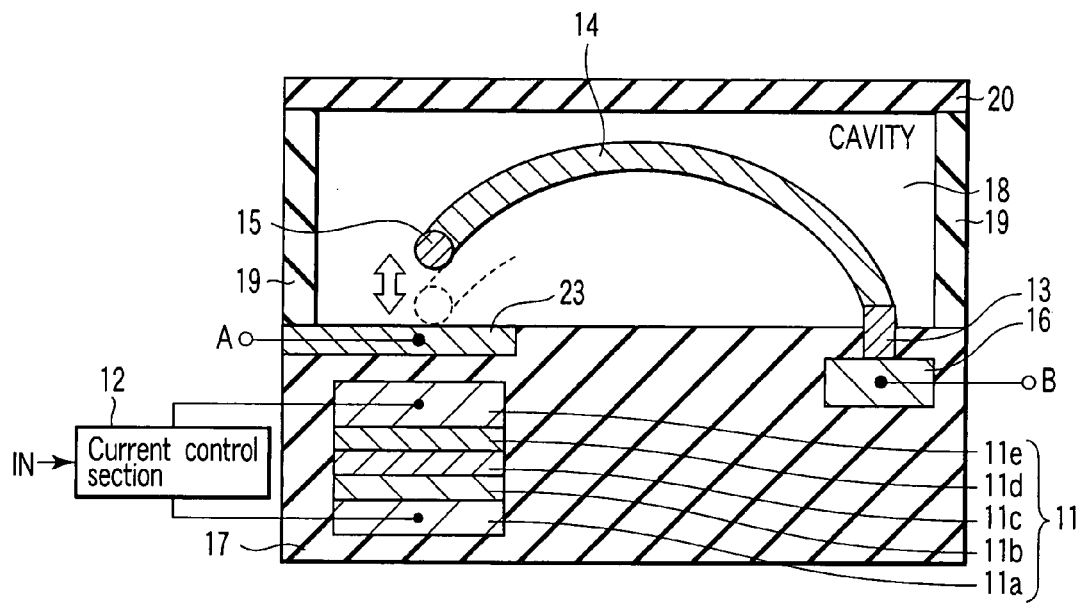
FIG. 8 is a cross sectional view showing a first modified example of the second embodiment.

FIG. 8 shows the first modified example of the second embodiment.

A plan view is the same as FIG. 6. The modified example is characterized in that an upper surface of the third electrode 13 is upper than an upper surface of the fourth electrode 23.

In this modified example, the third electrode 13 has a shape projected from the insulating layer 17.

Provided that above-described condition is satisfied, part or the whole of a side wall of the third electrode 13 of part projected from the insulating layer 17 may be covered with an insulating layer.

With the configuration described above, growth of the conductive tube 14 becomes easy, so that reliability of a device is improved.

Figure 9:
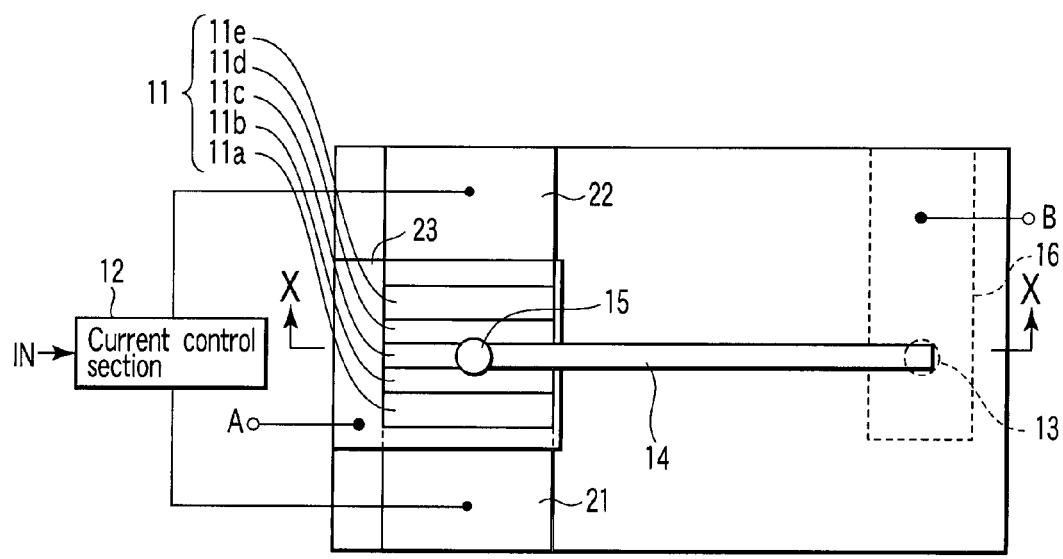
FIG. 9 is a plan view showing a second modified example of the second embodiment.
Figure 10:
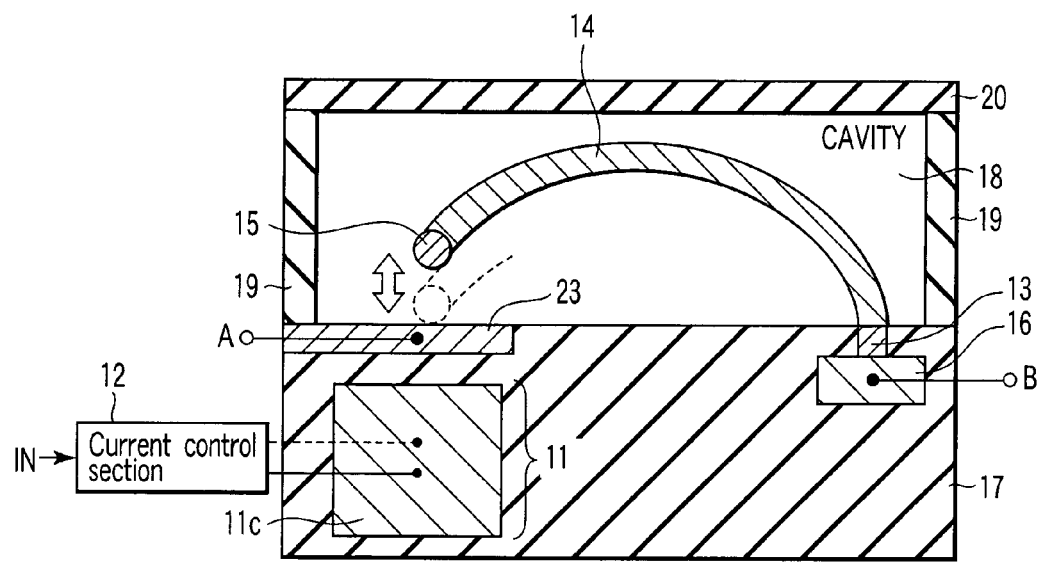
FIG. 10 is a cross sectional view taken along a line X-X of FIG. 9.

FIG. 9 shows a second modified example of the second embodiment. FIG. 10 is a cross sectional view taken along a line X-X of FIG. 9.

A characteristic of the modified example resides in structure of the magnetic field generation section 11. The respective layers 11a to 11e constituting the magnetic field generation section 11 are stacked in not a vertical direction (up and down direction), but a lateral direction (right and left direction).

Here, a lead layer 21 is connected to the first electrode 11a, and a lead layer 22 is connected to the second electrode 11e. However, the lead layer 21 may be integrated with the first electrode 11a, and also the lead layer 22 may be integrated with the second electrode 11e.

In addition, the respective layers 11a to 11e constituting the magnetic field generation section 11 may be stacked in an oblique direction, neither in the vertical direction nor in the lateral direction.

In other words, the respective layers 11a to 11e may be stacked in any direction as long as the spin injection current crosses interfaces of the respective layers 11a to 11e.

C. Basic Operation

Like the first embodiment, a basic operation is performed in such a manner that the spin-polarized electrons are made to flow into the magnetic element to thereby control a composite magnetic field composed of a magnetic field generated from the magnetization fixed section and a magnetic field generated from the magnetization free section.

Specifically, a magnetization direction of the magnetization free section within the magnetic field generation section 11 is determined while causing the spin injection current to flow between the first electrode 11a and the second electrode 11e. Then, a spatial position of the magnetic fine particle 15 is changed in accordance with the above magnetization direction, and connection/disconnection operation between the third electrode (terminal B) 13 and the fourth electrode (terminal A) 23 is controlled.

For example, when the magnetization directions of the magnetic layers 11b, 11d are in a parallel state (the same direction), the composite magnetic field is generated, and then, the magnetic fine particle 15 moves due to the magnetic force. On the other hand, when the magnetization directions of the magnetic layers 11b, 11d are in an anti-parallel state (opposite directions), the composite magnetic field disappears, and the magnetic fine particle 15 returns to the initial position due to the elastic force of the conductive tube 14.

In the case where the magnetic fine particle 15 is separated from the first or second electrode 11a, 11e in an initial state that the magnetic field is not generated, a normally-off-type switching element is constituted, while in the case where the magnetic fine particle 15 comes into contact with the first or second electrode 11a, 11e in the initial state that the magnetic field is not generated, a normally-on-type switching element is constituted.

D. Layout

The layout of the first electrode 11a, the second electrode 11e, the third electrode 13, the fourth electrode 23 and the lead layers 16, 21 and 22 is not limited to the present embodiment. Their shapes, extending directions and the like can be set freely in the condition not to interfere with one another.

A planar shape of the magnetic element within the magnetic field generation section 11 is also not limited to the present embodiment. For example, the planar shape of the magnetic element may adopt a square, a diamond shape, a circle, an oval and the like in addition to a rectangle.

Further, the magnetic field generation section 11 can be also set so as to become shapes such as a column and a square pillar as a whole. Furthermore, the magnetic field generation section 11 may become a shape in which an upper layer becomes tapered-shape at the tip end compared with a lower layer as a whole, where planar shapes of the respective layers 11a to 11e constituting the magnetic field generation section 11 are formed with a dimension gradually decreasing toward the upper-layer from the lower layer.

E. Size

An average size of the respective layers 11a to 11e constituting the magnetic field generation section 11 is as follows. That is, when its planar shape is made to be a four-sided figure, each one side is preferably not more than 200 nm, and further, most preferably not more than 100 nm.

This is because magnetization control of the magnetization free layer due to the spin injection current becomes easy when the size of the magnetic element is as small as possible.

Further, it is preferable that a diameter of the conductive tube 14 is made not more than 100 nm, more preferably, the diameter is made degree of several-tens nm.

The reason is as follows. Since a distance between the third electrode 13 and the fourth electrode 23 is proportional to the diameter of the conductive tube 14, a size of the switch unit becomes large when the diameter becomes large excessively, so that miniaturization of the magnetic switching element cannot be realized.

F. Others

As to the number of the conductive tube 14, it is preferable that plural conductive tubes are provided in order to decrease ON resistance. In this case, plural conductive tubes 14 may be coupled physically with each other, or may be separated from each other. As a matter of course, some of the plural conductive tubes 14 may be coupled, and the others may be separated.

A positional relationship between the magnetic fixed section and the magnetic free section is that any section may be at its upper side or lower side. Further, the magnetic layers 11b, 11d constituting these sections may be an in-plane magnetization film whose magnetization direction is in parallel to a film plane, or may be a perpendicular magnetization film whose magnetization direction is perpendicular to a film plane.

G. Conclusion

As described above, like the first embodiment, according to the second embodiment, the ON/OFF operation of the switch is executed due to the mechanical contact/non-contact operation. For this reason, an ON/OFF resistance ratio can be infinity. Further, since the conductive tube is constituted of a material having metallic characteristic, a signal channel is in all metal, and thus it is possible to decrease the ON resistance. Furthermore, such a magnetic switching element is formed by the semiconductor process. Therefore, ultra miniaturization is possible, and it is possible to realize the switching element in nano-level.

(3) THIRD EMBODIMENT

A third embodiment has a characteristic in the conductive tube. In the first and the second embodiments, the conductive tube is caused to grow from a flat surface substantially in parallel to a surface beneath which the magnetic field generation section is buried. However, in the third embodiment, the conductive tube is formed substantially in parallel to a surface beneath which a magnetic field generation section is buried.

A. Basic Structure

Figure 11:
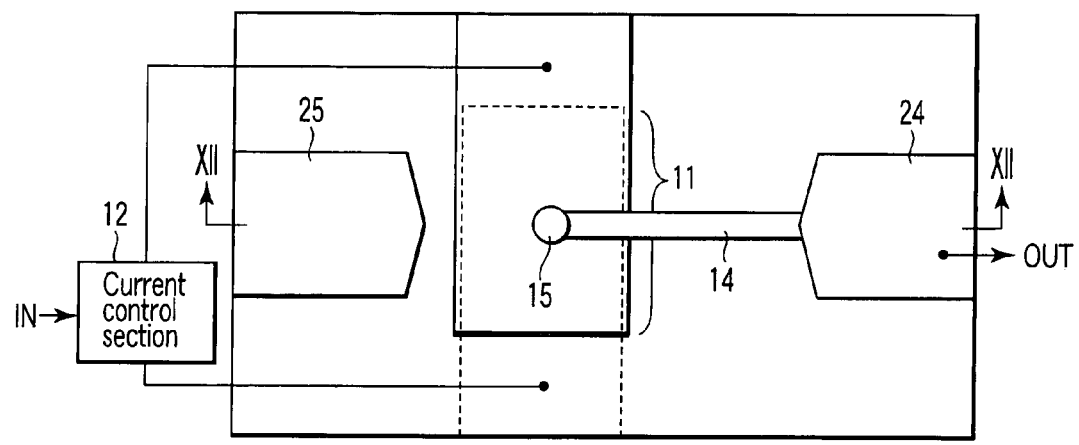
FIG. 11 is a plan view of a magnetic switching element according to a third embodiment.
Figure 12:
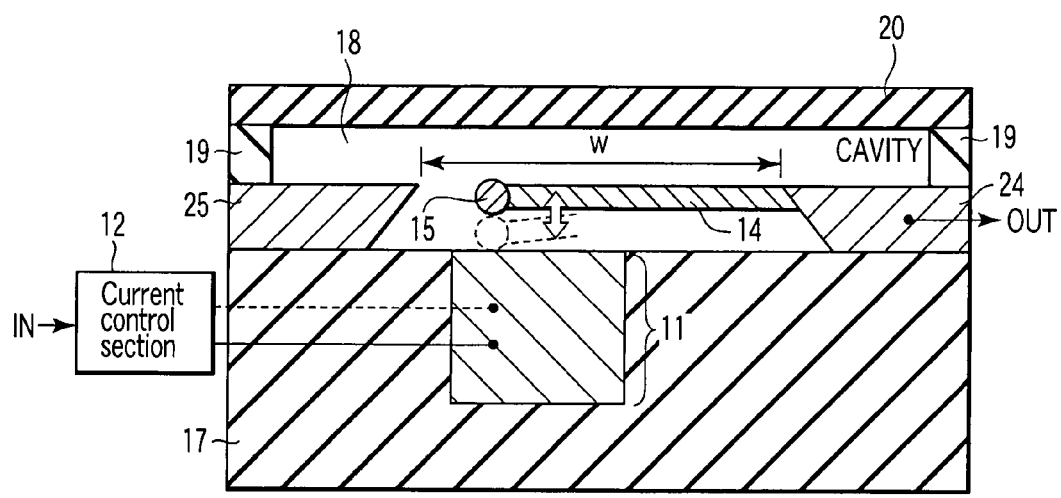
FIG. 12 is a cross sectional view taken along a line XII-XII of FIG. 11.

FIG. 11 is a plan view of a magnetic switching element according to the third embodiment. FIG. 12 is a cross sectional view taken along a line XII-XII of FIG. 11.

A structure of the magnetic field generation section 11 is the same as that of the first embodiment. That is, the respective layers constituting the magnetic field generation section 11 may be stacked in the vertical direction as shown in FIGS. 1 and 2, or alternatively, may be stacked in the lateral direction as shown in FIGS. 4 and 5.

Like the first embodiment, the magnetic field generation section 11 is buried within an insulating layer 17. However, in the third embodiment, a third electrode 24 for obtaining an output signal OUT is arranged on the insulating layer 17.

Further, in the third embodiment, a fifth electrode 25 is newly arranged on the insulating layer 17 in such a manner as to face to the third electrode 24.

The fifth electrode 25 is used to determine a growth direction of the conductive tube when the conductive tube 14 is formed. When applying a voltage between the third and the fifth electrodes 24, 25, the conductive tube 14 grows linearly toward the fifth electrode 25 from the third electrode 24. For this reason, in the present embodiment, the conductive tube 14 extends in parallel to the surface of the insulating layer 17.

Here, when the tip end of each of the third and fifth electrodes 24, 25 is sharpened, an electric field is concentrated between sharpened parts, and therefore, a direction control at the time of growth of the conductive tube 14 becomes facilitated.

As a method of sharpening the tip ends of the third and fifth electrodes 24, 25, for example, the third and fifth electrodes 24, 25 are made to be tapered-shape at the tip end as a planar shape, and are made to be overhang shape as a cross sectional shape.

A current control section 12 controls the magnetizing direction of the magnetizing free section within the magnetic field generation section 11 due to supply of the spin injection current to the magnetic element within the magnetic field generation section 11 based on, for example, an input signal IN.

The conductive tube 14 is constituted of, for example, a carbon nanotube, and functions as a moving element. The third electrode 24 is connected to the fixed end of the conductive tube 14, and the output signal OUT is obtained from the third electrode 24. Further, a magnetic fine particle 15 is arranged at the free end of the conductive tube 14.

Insulating layers 19, 20 surrounding the conductive tube 14 are provided on the insulating layer 17. As a result, a cavity 18 is formed, and the conductive tube 14 is arranged within the cavity 18.

The magnetic switching element (switch unit) is constituted by the above elements.

B. Modified Example

FIG. 13 shows a first modified example of the third embodiment.

A cross sectional view is the same as FIG. 12. The modified example is characterized in that plural conductive tubes 14 extend toward the fifth electrode 25 from the third electrode 24.

It is possible to reduce the ON resistance of the switching element by forming plural conductive tube 14.

Here, when there is a difference in growing speed among plural conductive tubes 14, some of them arrive at the fifth electrode 25 and come into contact with the fifth electrode 25 in some cases.

While supposing such a case, the fifth electrode 25 is made to be in a floating state after growth of the conductive tube 14, and when the fifth electrode 25 is used as the switching element, the problem is not taken place on the operation.

Alternatively, instead of this, the voltage may be applied between the third electrode 24 and the fifth electrode 25 after growth of the conductive tube 14, so that the tube coming into contact with the fifth electrode 25 may be disconnected electrically. By doing this, the problem does not take place on the switching operation even though the fifth electrode 25 is not in the floating state.

FIG. 14 shows a second modified example of the third embodiment.

A cross sectional view is the same as FIG. 12. Like the first modified example of FIG. 13, the modified example is characterized in that plural conductive tubes 14 extend toward the fifth electrode 25 from the third electrode 24.

However, in the second modified example, there are provided plural tapered portions at the tip ends of the third and fifth electrodes 24, 25 such that the plural conductive tubes 14 are surely formed.

As a consequence, it is possible to allow the plural conductive tubes 14 to grow reliably, which is effective for reduction of the ON resistance of the switching element.

Like the first modified example of FIG. 13, even though some of the plural conductive tubes 14 arrive at the fifth electrode 25, problems on the switch operation do not take place if the fifth electrode 25 is made floating state after growth of the conductive tube 14.

Alternatively, instead of this, the voltage is applied between the third electrode 24 and the fifth electrode 25 after growth of the conductive tube 14, the tube coming into contact with the fifth electrode 25 may be disconnected electrically. By doing this, the problem does not take place on the switching operation even though the fifth electrode 25 is not in the floating state.

C. Basic Operation

Since a basic operation is the same as the first embodiment, its explanation will be omitted here.

D. Layout

The layout of the magnetic field generation section 11, the third electrode 24 and the fifth electrode 25 is not limited to the present embodiment. Their shapes, extending directions and the like can be set freely in the condition not to interfere with one another.

E. Size

A size of the magnetic field generation section 11 is as follows. That is, like the first embodiment, when its planar shape is made to be a four-sided figure, each one side is preferably not more than 200 nm, and further, most preferably not more than 100 nm. Further, it is preferable that a diameter of the conductive tube 14 is made not more than 100 nm, and more preferably, the diameter is made degree of several-tens nm.

Preferably, a width w (refer to FIG. 12) from the third electrode 24 to the fifth electrode 25 is set to a value within the range from 100 nm to several μm. The width w is equal to the size of the magnetic field generation section 11 or is larger than that of the magnetic field generation section 11.

F. Others

In the first and second modified examples of the third embodiment, some of the plural conductive tubes 14 may be physically coupled with each other.

G. Conclusion

As described above, according to the third embodiment, the ON/OFF resistance ratio can be infinity, and the ON resistance can be decreased, like the first embodiment. Further, such a magnetic switching element is formed by the semiconductor process. Therefore, ultra miniaturization is possible, and thus, it is possible to realize the switching element in nano-level.

(4) FOURTH EMBODIMENT

A fourth embodiment is obtained by combining the second embodiment and the third embodiment. That is, a conductive tube is formed linearly, and a channel of an input signal IN and a channel of an output signal OUT are separated, the signals causing a switch to perform ON/OFF operation.

A. Basic Structure

Figure 15:
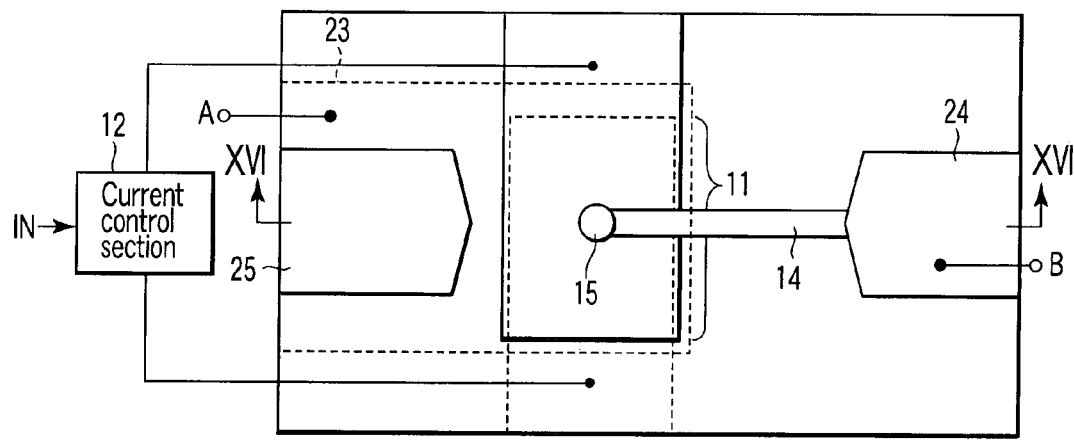
FIG. 15 is a plan view of a magnetic switching element according to a fourth embodiment.
Figure 16:
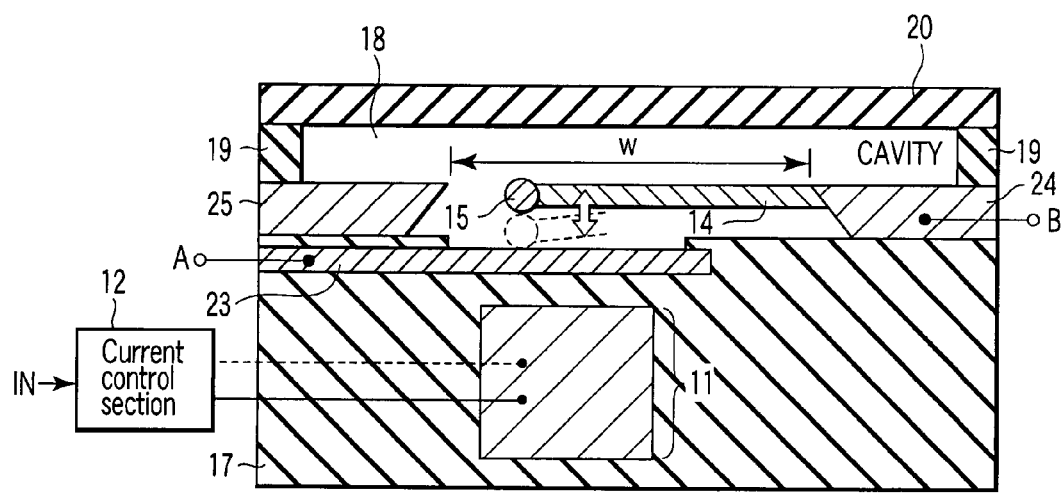
FIG. 16 is a cross sectional view taken along a line XVI-XVI of FIG. 15.

FIG. 15 is a plan view of a magnetic switching element according to the fourth embodiment. FIG. 16 is a cross sectional view taken along a line XVI-XVI of FIG. 15.

A structure of a magnetic field generation section 11 is the same as that of the second embodiment. That is, the respective layers constituting the magnetic field generation section 11 may be stacked in the vertical direction as shown in FIGS. 6 and 7, or alternatively, may be stacked in the lateral direction as shown in FIGS. 9 and 10.

Like the second embodiment, the magnetic field generation section 11 is buried in an insulating layer 17. However, in the fourth embodiment, a third electrode 24 connected to a terminal B serving as the other terminal of the switch is arranged on the insulating layer 17.

Further, in the fourth embodiment, a fifth electrode 25 is newly arranged on the insulating layer 17 so as to face to the third electrode 24.

Furthermore, since the channel of the input signal IN and the channel of the output signal OUT are separated, the magnetic field generation section 11 is completely buried on the inside of the insulating layer 17. Instead, in the surface region of the insulating layer 17, the fourth electrode 23 is arranged which is isolated respectively from the magnetic field generation section 11 and the fifth electrode 25.

A position of the fourth electrode 23 is set, for example, between the magnetic field generation section 11 and the magnetic fine particle 15. The fourth electrode 23 is connected to a terminal A serving as one terminal of the switch.

A current control section 12 supplies a spin injection current to the magnetic field generation section 11, for example, based on the input signal IN, and controls the magnetization direction of the magnetization free section in the magnetic field generation section 11.

Like the second embodiment, a conductive tube 14 grows linearly toward the fifth electrode 25 from the third electrode 24. For this reason, in the present embodiment, the conductive tube 14 extends in parallel to the surface of the insulating layer 17.

Here, like the third embodiment, it is preferable that the tip end of each of the third and fifth electrodes 24, 25 is sharpened.

Insulating layers 19, 20 surrounding the conductive tube 14 are provided on the insulating layer 17. As a result, a cavity 18 is formed, and the conductive tube 14 is arranged in the cavity 18.

By the above elements, the magnetic switching element (switch unit) is constituted.

B. Modified Example

Also in the fourth embodiment, the first and second modified examples (refer to FIGS. 13 and 14) of the third embodiment can be applied as they are.

C. Basic Operation

Since a basic operation is the same as that of the second embodiment, its explanation will be omitted here.

D. Layout

The layout of the magnetic field generation section 11, the third electrode 24, the fourth electrode 23 and the fifth electrode 25 is not limited to the present embodiment. Their shapes, extending directions and the like can be set freely in the condition not to interfere with one another.

E. Size

A size of the magnetic field generation section 11 is as follows. That is, like the second embodiment, when its planar shape is made to be a four-sided figure, each one side is preferably not more than 200 nm, and further, most preferably not more than 100 nm. Further, it is preferable that a diameter of the conductive tube 14 is made not more than 100 nm, and more preferably, the diameter is made degree of several-tens nm.

It is preferable that a width w (refer to FIG. 12) from the third electrode 24 to the fifth electrode 25 is set to a value within the range from 100 nm to several μm. The width w is equal to the size of the magnetic field generation section 11 or is larger than that of the magnetic field generation section 11.

F. Others

In the case where the first and second modified examples of the third embodiment are applied to the fourth embodiment, some of the plural conductive tubes 14 may be physically coupled with each other.

G. Conclusion

As described above, according to the forth embodiment, the ON/OFF resistance ratio can be infinity, and the ON resistance can be decreased, like the second embodiment. Further, such a magnetic switching element is formed by the semiconductor process. Therefore, ultra miniaturization is possible, and thus, it is possible to realize the switching element in nano-level.

(5) FIFTH EMBODIMENT

A fifth embodiment has a characteristic in the number of magnetic field generation sections. That is, one magnetic field generation section is provided in the first to the fourth embodiments, while in the fifth embodiment, motion of a conductive tube is controlled by plural magnetic field generation sections.

Figure 17:
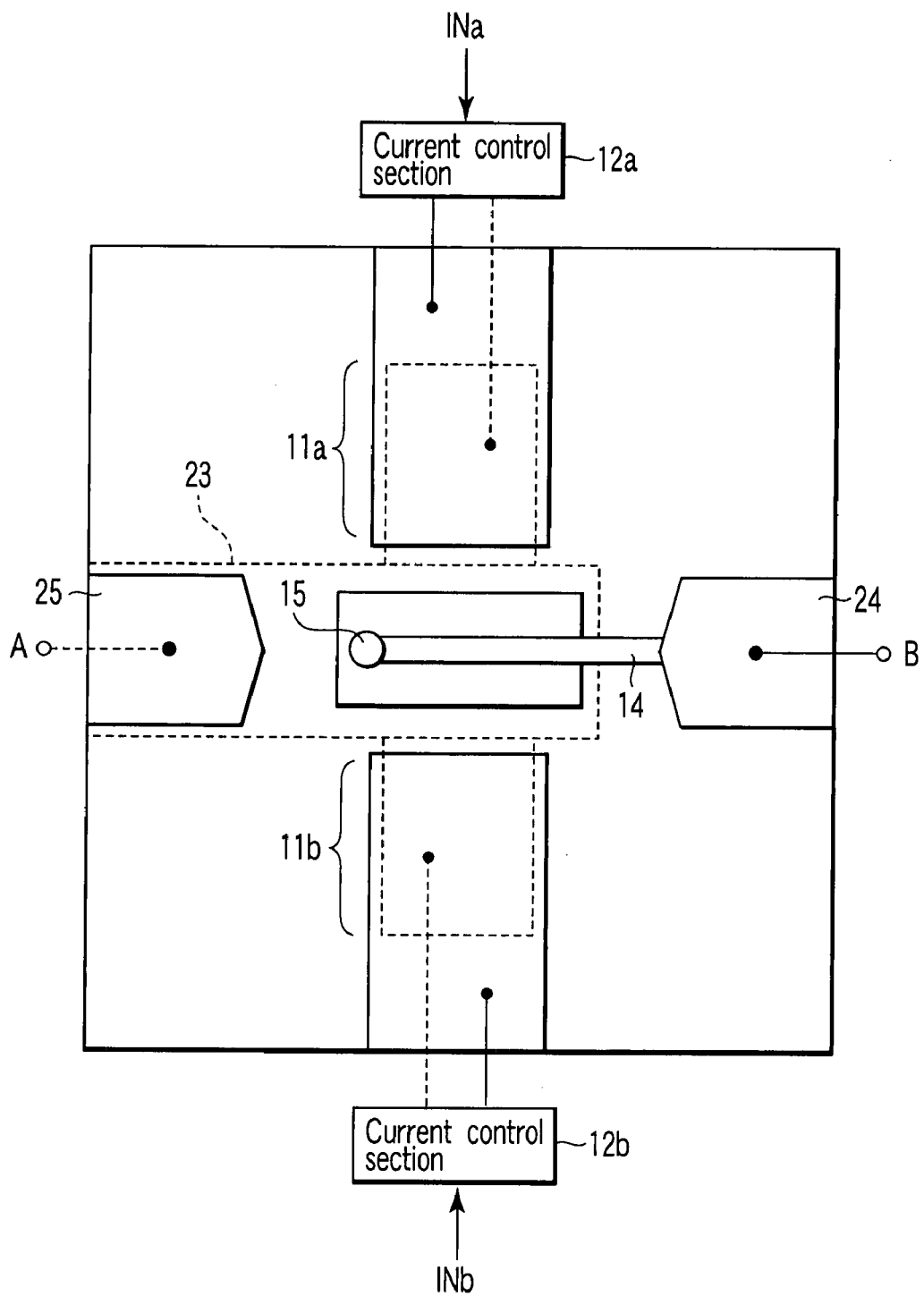
FIG. 17 is a plan view of a magnetic switching element according to a fifth embodiment.

FIG. 17 is a plan view of a magnetic switching element according to the fifth embodiment.

The magnetic switching element is the same as the magnetic switching element of FIGS. 15 and 16 being the fourth embodiment except for the number and the position of magnetic field generation sections.

In the fifth embodiment, two magnetic field generation sections 11a, 11b exist.

A structure of each of the magnetic field generation sections 11a, 11b is the same as that of the second embodiment. That is, the respective layers constituting the magnetic field generation sections 11a, 11b may be stacked in the vertical direction as shown in FIGS. 6 and 7, or alternatively, may be stacked in the lateral direction as shown in FIGS. 9 and 10.

The magnetic field generation sections 11a, 11b are arranged, for example, at a position where the conductive tube 14 is to be sandwiched. A third electrode (terminal B) 24 is connected to the fixed end of the conductive tube 14, and a magnetic fine particle 15 is arranged at the free end of the conductive tube 14.

A fifth electrode 25 is arranged at a position opposite to the third electrode 24. The conductive tube 14 extends toward the fifth electrode 25 from the third electrode 24.

A fourth electrode (terminal A) 23 is arranged directly below the conductive tube 14. Motion of the conductive tube 14 is controlled due to a magnetic field generated from the magnetic field generation sections 11a, 11b, and the switch becomes ON-state in such a manner that the magnetic fine particle 15 comes into contact with the fourth electrode 23.

In the switching element of FIG. 17, the magnetic switching element of FIGS. 15 and 16 being the fourth embodiment is presupposed. However, it is possible to set the number of the magnetic field generation sections to plural number in the magnetic switching element according to the first to third embodiments.

(6) SIXTH EMBODIMENT

A sixth embodiment has a characteristic in the number of magnetic fine particles. That is, in the first to the fourth embodiments, the magnetic fine particle is arranged at the free end of the conductive tube. However, in the sixth embodiment, plural magnetic fine particles are arranged within the conductive tube.

FIG. 18 is a plan view of a magnetic switching element according to the sixth embodiment. FIG. 19 is a cross sectional view taken along a line XIX-XIX of FIG. 18.

The magnetic switching element is the same as the magnetic switching element of FIGS. 11 and 12 being the third embodiment except for the structure of a conductive tube 14 and the number of magnetic fine particles 15.

A structure of a magnetic field generation section 11 is the same as that of the first embodiment. That is, the respective layers constituting the magnetic field generation sections 11 may be stacked in the vertical direction as shown in FIGS. 1 and 2, or alternatively, may be stacked in the lateral direction as shown in FIGS. 4 and 5.

The conductive tube 14 is arranged while lying over from a third electrode 24 to a fifth electrode 25. One end of the conductive tube 14 is fixed to the third electrode 24 to become a fixed end. Further, the other end of the conductive tube 14 exists on the fifth electrode 25 serving as a supporting stand. However, the other end is not fixed to the fifth electrode 25 to become a free end.

Plural magnetic fine particles 15 are arranged inside the conductive tube 14. In order to realize such a structure, a carbon nanotube with built-in fullerene is utilized, for example.

More specifically, a fullerene composed of, for example, C (carbon)$_{60}$ or C$_{70}$ has a spherical-shell-shaped structure. For that reason, it is possible to realize the structure according to the sixth embodiment if an endohedral compound that contains magnetic fine particles in the spherical shell is built in the carbon nanotube.

The switching operation is performed in such a manner that the magnetic fine particles 15 within the conductive tube 14 are attracted due to a magnetic force, and a center portion of the conductive tube 14 is brought into contact with the magnetic field generation section 11. Since the other end of the conductive tube 14 is only placed on the fifth electrode 25 as the free end, the switching operation is performed smoothly.

Here, the nanotube with the fullerene or the fullerene containing metals built-in is called as peapod.

Further, there is a technique for incorporating a fullerene incorporating magnetic elements such as Gd@C$_{82}$ or Dy@C$_{82}$ in a nanotube. A method for forming a monolayer nanotube with the fullerene built-in on a silicon substrate and a method for forming a monolayer nanotube with the fullerene containing Gd built-in on a silicon substrate are disclosed in, for example, Appl. Phys. Lett. 86, 023109 (2005).

A simple explanation will be given below. First, a catalyst is arranged at a position where a monolayer nanotube is desired to be grown, and the monolayer nanotube is caused to grow by a vapor deposition method. Examples of a raw gas used include hydrocarbon such as ethylene and methane, and alcohol such as ethanol. Gases such as hydrogen, water or oxygen may be mixed to the raw gas.

As the vapor deposition method for growing the monolayer carbon nanotube, it is possible to use a thermal CVD method, a plasma CVD method or the like.

The monolayer carbon nanotube formed in such a way as above is annealed at 470° C. in a mixed gas atmosphere in which a ratio of nitrogen and oxygen is 4:1. As a result, the tip end of the carbon nanotube which does not come into contact with the silicon substrate is made to be an opening end due to oxidization.

Thereafter, the silicon substrate having the above structure and the fullerene containing the magnetic metal are enclosed together in a quartz ampoule, and its state is kept during two days at 500° C., thereby to obtain the fullerene containing the magnetic metal.

Since Gd or Dy are the magnetic elements, the nanotube with the fullerene containing the magnetic elements such as Gd@C$_{82}$ or Dy@C$_{82}$ built-in can be deformed due to the magnetic force, so that the vicinity of the center of the nanotube can be brought into contact/non-contact with the magnetic field generation section by using this characteristic.

In the switching elements of FIGS. 18 and 19, the magnetic switching elements of FIGS. 11 and 12 being the third embodiment have been presupposed. However, in the magnetic switching element of the first embodiment, it is possible to arrange plural magnetic fine articles in the conductive tube.

(7) SEVENTH EMBODIMENT

A seventh embodiment is obtained by combining the fourth embodiment and the sixth embodiment. That is, plural magnetic fine particles are incorporated in a conductive tube, and a channel of an input signal IN and a channel of an output signal OUT are separated, the signals causing the switch to perform ON/OFF operation.

Figure 20:
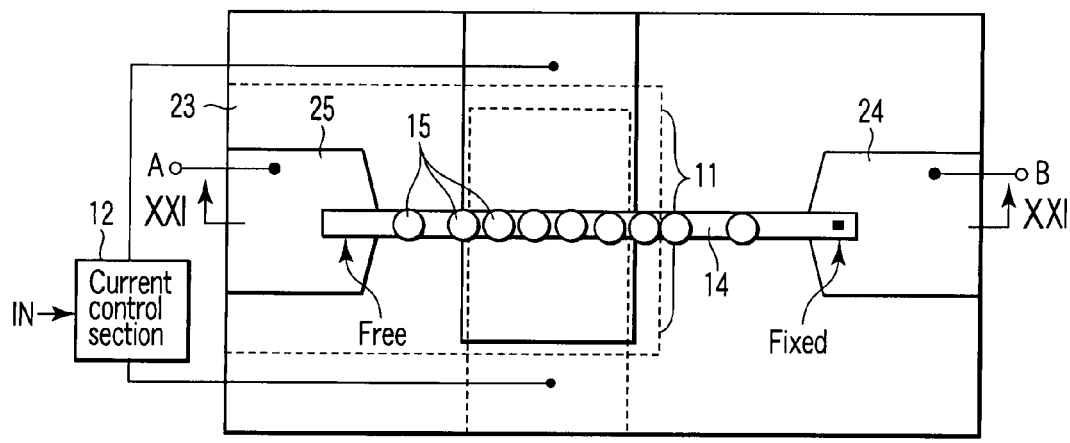
FIG. 20 is a plan view of a magnetic switching element according to a seventh embodiment.
Figure 21:
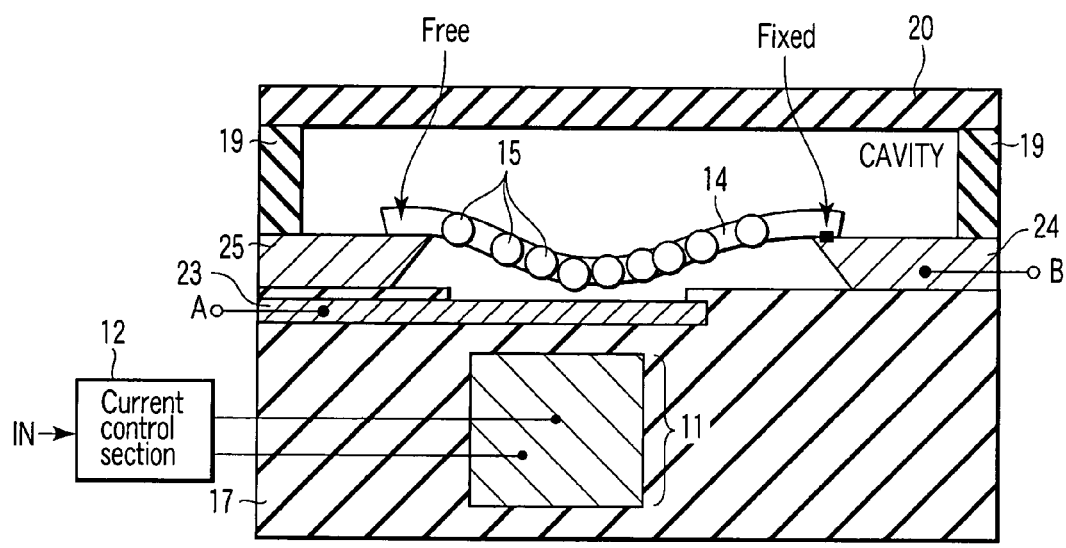
FIG. 21 is a cross sectional view taken along a line XXI-XXI of FIG. 20.

FIG. 20 is a plan view of a magnetic switching element according to the seventh embodiment. FIG. 21 is a cross sectional view taken along a line XXI-XXI of FIG. 20.

The conductive tube 14 is arranged while lying over from a third electrode (terminal B) 24 to a fifth electrode 25. One end of the conductive tube 14 is fixed to the third electrode 24 to become a fixed end. Further, the other end of the conductive tube 14 exists on the fifth electrode 25 serving as a supporting stand. However, the other end is not fixed to the fifth electrode 25 to become a free end.

Like the sixth embodiment, plural magnetic fine particles 15 are arranged uniformly inside the conductive tube 14.

Further, the channel of the input signal IN is separated from the channel of the output signal OUT. For this reason, the magnetic field generation section 11 is buried completely on the inside of an insulating layer 17. Instead, a fourth electrode (terminal A) 23 which is respectively insulated from the magnetic field generation section 11 and the fifth electrode 25 is arranged in the surface area of the insulating layer 17.

The switching operation is performed in such a manner that the magnetic fine particles 15 within the conductive tube 14 are attracted due to a magnetic force, and a center portion of the conductive tube 14 is brought into contact with the magnetic field generation section 11. Since the other end of the conductive tube 14 is only placed on the fifth electrode 25 as the free end, the switching operation is performed smoothly.

In the switching elements of FIGS. 20 and 21, the magnetic switching elements of FIGS. 15 and 16 being the fourth embodiment have been presupposed. However, for example, in the magnetic switching element of the second embodiment, it is possible to arrange plural magnetic fine particles in the conductive tube.

3. Material Example

There will be explained about material examples.

(1) Magnetization Fixed Section and Magnetization Free Section

A magnetization fixed section and a magnetization free section constituting a magnetic element each are composed of a ferromagnetic material. As the ferromagnetic material, for example, a ferromagnetic material with the most suitable magnetic characteristic is selected from the followings, in response to applications of a switching element according to an example of the present invention:

A. "Iron (Fe) simple substance", "Cobalt (Co) simple substance", "Nickel (Ni) simple substance", and "alloy containing at least one element selected from the group consisting of Iron (Fe), Cobalt (Co), Nickel (Ni), Manganese (Mn) and Chrome (Cr)";

B. "NiFe based alloy referred to as Permalloy", and "soft magnetic material such as CoNbZr based alloy, FeTaC based alloy, CoTaZr based alloy, FeAlSi based alloy, FeB based alloy, and CoFeB based alloy"; and C. "Half metal magnetic oxide such as Heusler alloy, magnetic semiconductor, $CrO_2$, $Fe_3O_4$, and $La_1$—XSrXMnO$_3$, or half metal magnetic nitride".

Here, the "magnetic semiconductor" can be constituted of at least one magnetic element selected from the group consisting of Iron (Fe), Cobalt (Co), Nickel (Ni), Chrome (Cr) and Manganese (Mn), and a compound semiconductor or oxide semiconductor. Specific examples thereof include (Ga, Cr)N, (Ga, Mn)N, MnAs, CrAs, (Ga, Cr)As, ZnO:Fe, and (Mg, Fe)O.

D. "Amorphous magnetic materials including Boron (B) such as CoFeB", and "Amorphous magnetic materials including 3d-transition metal and rare earth metal such as GdFeCo, TbFeCo".

Further, as the material used for the magnetization fixed section and the magnetization free section, a continuous magnetic substance may be constituted, or the material may have a complex structure in which fine particles made of a magnetic substance are deposited in a non-magnetic matrix.

An example of the complex structure includes one that is called "granular magnetic substance".

The magnetization fixed section and the magnetization free section may be constituted by plural magnetic layers with antiferromagnetic coupling or ferromagnetic coupling. For example, the magnetization fixed section and the magnetization free section may have a stuck structure of ferromagnetic layer/non-magnetic layer/ferromagnetic layer.

In the case where an antiferromagnetic coupling structure referred to as a synthetic antiferromagnetic (SAF) structure is adopted, it is preferable that a non-magnetic metal layer such as Ruthenium (Ru), Iridium (Ir) or Chrome (Cr) and an antiferromagnetic substance are used as a non-magnetic layer arranged between two ferromagnetic layers. If he film thickness of the non-magnetic layer is made a value within the range of 0.2 nm to 3 nm, the antiferromagnetic coupling structure is formed easily.

Further, the magnetization fixed section and the magnetization free section may have a multilayered structure composed of a plurality of magnetic layers. In this case, the following materials may be used:

A. Two-layered structure composed of [(Co or CoFe alloy)/(Permalloy alloy composed of NiFe or NiFeCo, or Ni)];

B. Three-layered structure composed of [(Co or CoFe alloy)/(Permalloy alloy composed of NiFe or NiFeCo, or Ni)/(Co or CoFe alloy)]; and C. Multi-layer structure composed of [(Co or CoFe alloy)/(Pt or Pd)], for instance, one of Co/Pt, Co/Pd, CoFe/Pt and CoFe/Pd.

(2) Anti-Ferromagnetic Layer: AF

The magnetization direction of the magnetization fixed section can be fixed absolutely in such a manner that the antiferromagnetic layer is brought into contact with the magnetization fixed section. The antiferromagnetic layer is arranged so as to come into contact with a surface of a fixed section which does not contact a non-magnetic intermediate layer. The antiferromagnetic layer is selected from the group consisting of, for example, iron manganese (FeMn), platinum manganese (PtMn), palladium manganese (PdMn), and palladium platinum manganese (PdPtMn).

(3) Non-Magnetic Layer

The non-magnetic layer is constituted by a metal, an insulator, a semiconductor or the like. The non-magnetic layer is classified into two of low resistance material and high resistance material from aspect of material constituting the non-magnetic layer.

Examples of the low resistance material include copper (Cu), gold (Au), silver (Ag), aluminum (Al), and an alloy containing at least one element selected from the group consisting of copper (Cu), gold (Au), silver (Ag) and aluminum (Al).

If the thickness of the non-magnetic layer (intermediate layer) made of such a low resistance material is set to a value within the range of 1 nm to 60 nm, a magnetization reversal efficiency can be enhanced.

Examples of the high resistance material include an insulator such as oxide, nitride or fluoride containing at least one element selected from the group consisting of aluminum (Al), titanium (Ti), tantalum (Ta), cobalt (Co), nickel (Ni), silicon (Si), magnesium (Mg) and iron (Fe), and a semiconductor with large energy gap, such as GaAlAs.

Examples of the oxide among such materials include alumina ($Al_2O_{3-x}$), magnesium oxide (MgO), $SiO_2$, Si—O—N, Ta—O, and Al—Zr—O.

(4) First to Fifth Electrodes

It is preferable that the first to fifth electrodes are composed of metallic materials with low resistance.

4. Method of Manufacturing Conductive Tube and Magnetic Fine Particle

It is preferable for the conductive tube to indicate metallic property as an electrical characteristic, and the conductive tube is composed of a carbon nanotube, for example.

In this case, a diameter of the tube is set to a value within the range of 5 nm to 200 nm. Such a carbon nanotube is referred to as a multilayered carbon nanotube. Further, in some occasions, a tube whose diameter exceeds several tens nm may be also called a carbon fiber.

Hereinafter, there will be described an example of a method of manufacturing a conductive tube and magnetic fine particles by taking the switching element of the first embodiment as an example.

First, as shown in FIG. 22, a dummy electrode 27, which is made of a conductive material such as tungsten, is formed on a magnetic field generation section 11 via an insulating layer 26. Further, on a third electrode 13, magnetic fine particles (magnetic metal) 15 are formed which become a catalyst when a conductive tube (carbon nanotube) is caused to grow.

Here, Fe, Co, Ni or the like is used as the magnetic fine particles 15. Further, the magnetic fine particles 15 may be Fe-based acetate, Co-based acetate, or Ni-based acetate.

The magnetic fine particles 15 are not necessary in the case where the third electrode 13 it self becomes a catalyst when the conductive tube is caused to grow, that is, in the case where the third electrode 13 is composed of a magnetic metal (refer to FIG. 23).

Figure 24:
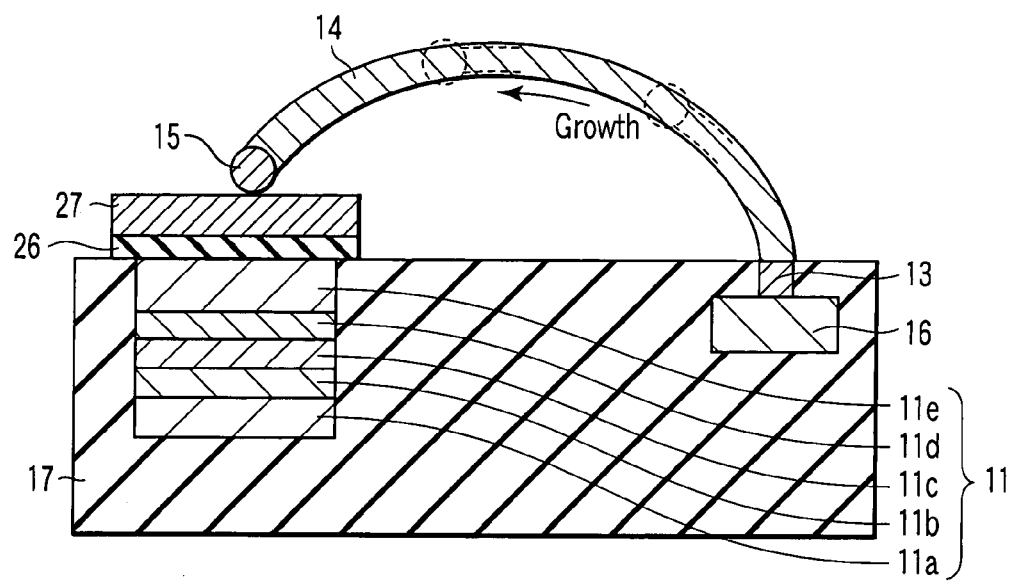
FIG. 24 is a cross sectional view showing one process of a manufacturing method according to an example of the present invention.

Thereafter, as shown in FIG. 24, a conductive tube 14 is caused to grow toward the dummy electrode 27 from the third electrode 13.

As the growth method at this time, a method is known which causes a monolayer carbon nanotube to grow by a thermal CVD method. Examples of a raw gas used include hydrocarbon such as ethylene or methane, and alcohol such as ethanol. Further, gases such as hydrogen, water, and oxygen may be mixed to the raw gas. A growth temperature is set to a value within the range of 400° C. to 900° C.

As to detail of the growth method, there is described in, for example, Appl. Phys. A69, 305-308 (1999), or Jpn. J. Appl. Phys. 42, 2416 (2003).

Growth is terminated when the tip end of the conductive tube 14 arrives at a position where the tip end is about to touch an upper part of the magnetic field generation section 11, for example, the dummy electrode 27.

Figure 25:
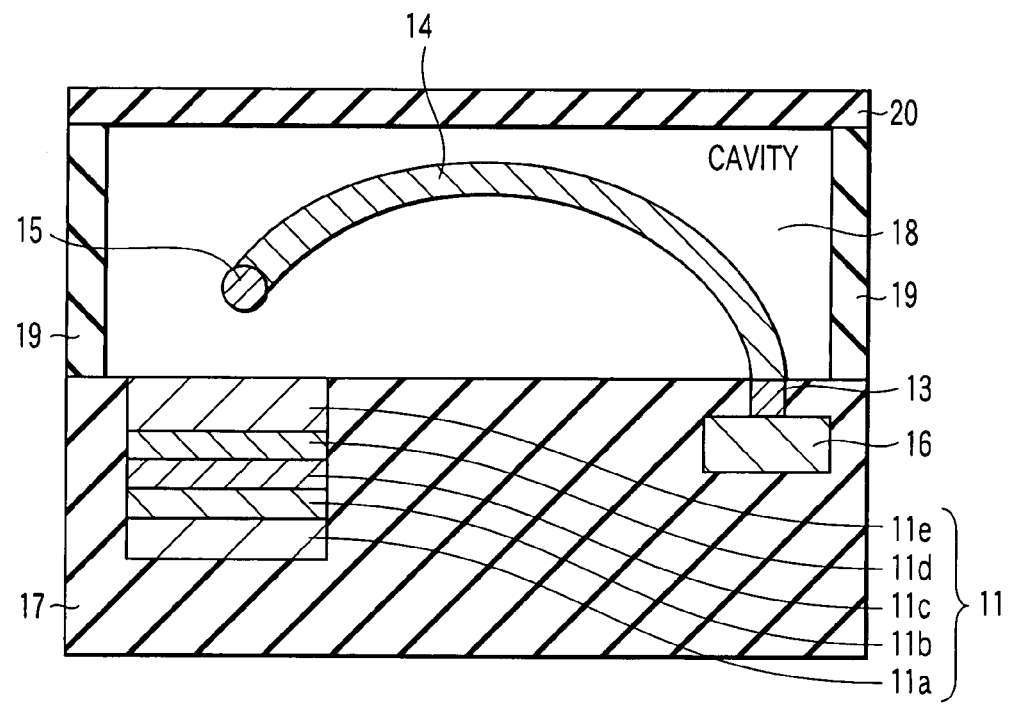
FIG. 25 is a cross sectional view showing one process of a manufacturing method according to an example of the present invention.

Finally, when removing the insulating layer 26 and the dummy electrode 27 by wet etching, the conductive tube 14 as the moving element is formed as shown in FIG. 25.

Here, an etching liquid of the wet etching should be composed of a substance which does not erode the magnetic fine particles 15 (or the third electrode 13) as the catalyst of the conductive tube 14, or the second electrode 11e within the magnetic field generation section 11 which comes into contact with the etching liquid at the time of etching.

Instead of this, for example, the second and third electrodes 11e, 13 and the magnetic fine particles 15 may be composed of an alloy insusceptible to corrosion, containing Ni, Fe, Co, FePt, CoFe or the like. Further, after terminating growth of the conductive tube 14, the surface of the magnetic fine particle 15 may be coated with a conductive non-magnetic material.

A cavity 18 in which the conductive tube 14 is arranged can be formed easily in such a manner that after covering the conductive tube 14 with a dummy layer made of, for example, carbon, insulating layers 19, 20 are formed, and then the dummy layer is removed.

In the case where the dummy layer is composed of a resist, removal of the dummy layer can be performed by a vaporization method of ashing.

By the way, in the case where the above-described manufacturing method is applied to the second embodiment, the dummy electrode 27 may be used as a fourth electrode which becomes one end (terminal A) of the switch. In this case, a process for etching the dummy electrode 27 becomes unnecessary.

In addition, the position of the dummy electrode 27 is not limited to the upper part of the magnetic field generation section 11. For example, the dummy electrode 27 may be arranged at periphery of the magnetic field generation section 11, the upper part of the third electrode 13, or the like.

Furthermore, although control of length or the like of the conductive tube becomes somewhat difficult in comparison with above case, it is possible to cause the conductive tube to grow in the condition of no dummy electrode. In this case, the length of the conductive tube is controlled due to the growth speed determined by the growth condition.

Moreover, as materials of the conductive tube, it is possible to use materials excellent in mechanical elasticity, such as Si-nanotube, in addition to the above carbon.

5. Switching Principle

A switching principle of the magnetic switching element of an example of the present invention will be described.

The basic structure of the magnetic field generation section has, as already described, the magnetic element and the first and second electrodes which put the magnetic element therebetween. The magnetic element is composed of the magnetization fixed section (magnetic layer), the magnetization free section (magnetic layer) and the non-magnetic layer (intermediate layer) arranged between these magnetic layers.

In an example of the present invention, the magnetization direction of the magnetization free section is made to be parallel or anti-parallel with respect to the magnetization direction of the magnetization fixed section depending on ON/OFF operation of the spin injection current. Then, motion of the conductive tube is controlled depending on a leakage magnetic field from the magnetic field generation section to carry out the switching.

Moreover, when the magnetic free section is composed of a magnetic multi-domain, the domain structure of the magnetic free section is changed by controlling ON/OFF and direction (+/−) of the spin injection current. Thus, the motion of the conductive tube is controlled in accordance with a leakage magnetic field from the magnetic field generation section and switching is executed.

(1) CASE A

FIG. 26 shows CASE A of the switching principle.

In the CASE A, the magnetic layer 11b becomes the magnetization fixed section, and the magnetic layer 11d becomes the magnetization free section. However, to the contrary, even though the magnetic layer 11b becomes the magnetization free section and the magnetic layer 11d becomes the magnetization fixed section, the switching principle is not changed. In FIG. 26, in order to magnetize and fix the magnetic layer 11b, it is preferable that an antiferromagnetic layer is further provided between the magnetic layer 11b and the first electrode 11a.

As the presupposed condition, the magnetic layer 11d as the magnetization free section has no hysteresis. Further, assume that the magnetic layers 11b, 11d, in the initial state, maintain the anti-parallel state due to magnetostatic coupling or negative exchange interaction.

In this case, when the spin injection current is OFF (initial state), no flowing of electrons is generated between the first and second electrodes 11a, 11e, and the magnetic layers 11b, 11d remain to be the anti-parallel state.

At this time, as shown in, for example, FIG. 27, the magnetic field lines which come out from the magnetic layers 11b, 11d become the state to be closed between the magnetic layers 11b, 11d. Consequently, values of the leakage magnetic field on the external part of the magnetic element become very small.

Particularly, provided that absolute values of magnetization of the magnetic layers 11b, 11d are set to be substantially the same, the leakage magnetic field in this state becomes approximately zero. More specifically, since no magnetic field is generated from the magnetic element within the magnetic field generation section, it is impossible to change the spatial position of the conductive tube containing the magnetic fine particles, so that the switch remains the OFF state in the case of normally-off-type while the switch remains the ON state in the case of normally-on-type.

To the contrary, when the spin injection current is made ON state, electron flow is generated between the first and the second electrodes, the magnetization direction of the magnetic layer 11d as the magnetization free section is reversed, and the magnetic layers 11b, 11d are changed into the parallel state from the anti-parallel state.

At this time, as shown in, for example, FIG. 28, the magnetization of the magnetic layers 11b, 11d is not cancelled. For this reason, the magnetic field lines leak to outside from the magnetic layers 11b, 11d, so that the magnetic field lines generated from the magnetic layers 11b, 11d become opened state.

Therefore, a state takes place where a magnetic field is generated from the magnetic element within the magnetic field generation section, so that the spatial position of the conductive tube containing the magnetic fine particles changes by the magnetic force according to the magnetic field (to approach to the magnetic field generation section or to recede from the magnetic field generation section).

That is, in the case of the normally-off-type, the switch changes into ON from OFF, while in the case of the normally-on-type, the switch changes into OFF from ON.

By the way, in the CASE A, the magnetic field generation section has not the hysteresis characteristic. For this reason, when the spin injection current is made zero, the magnetic field generation section as the switch returns to the initial state again.

FIG. 29 shows a relationship between the spin injection current and a resistance value of the magnetic element.

The resistance value represents a magnetization state of the magnetic layers 11b, 11d.

When the value of the spin injection current is zero, the magnetic element is in the anti-parallel state, and its resistance value becomes large.

When the spin injection current flow in a positive direction and its current value exceeds predetermined value, the magnetic element becomes the parallel state and its resistance value becomes small.

Here, in the CASE A, there are two ways in which the spin injection current is zero, and the spin injection current is made to flow in the positive direction. The positive direction is a direction in which the electrons flow from the magnetic layer 11b serving as the magnetization fixed section toward the magnetic layer 11d serving as the magnetization free section (opposite direction as the spin injection current).

(2) CASE B

Figure 30:
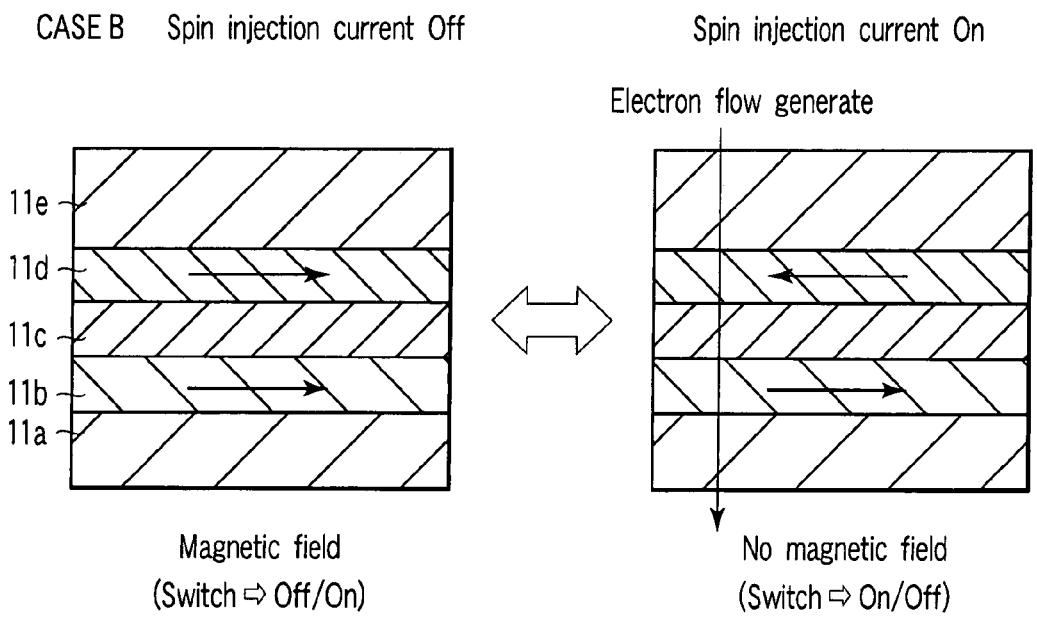
FIG. 30 is a view showing CASE B of the switching principles according to an example of the present invention.

FIG. 30 shows CASE B of the switching principle.

In comparison with the CASE A, the CASE B has a characteristic in that in the initial state, the magnetic layers 11b, 11d maintain the parallel state due to positive exchange interaction.

In this case, the magnetic layers 11b, 11d are in the parallel state when the spin injection current is made OFF (initial state), and thus, the magnetic layers 11b, 11d become the state in which the magnetic field is generated from the magnetic field generation section. At this time, the switch is in the OFF state in the case of normally-off-type, while the switch is in the ON state in the case of normally-on-type.

On the contrary, when the spin injection current is made to be ON state, the magnetization direction of the magnetic layer 11d serving as the magnetization free section is reversed, so that the magnetic layers 11b, 11d change into the anti-parallel state from the parallel state.

Accordingly, a state takes place where the magnetic field is not generated from the magnetic field generation section, so that the magnetic force does not act on the conductive tube or the magnetic fine particles. At this time, the switch changes to ON from OFF in the case of normally-off-type, while the switch changes to OFF from ON in the case of normally-on-type.

When the spin injection current is made zero, the switch returns to the initial state again.

Figure 31:
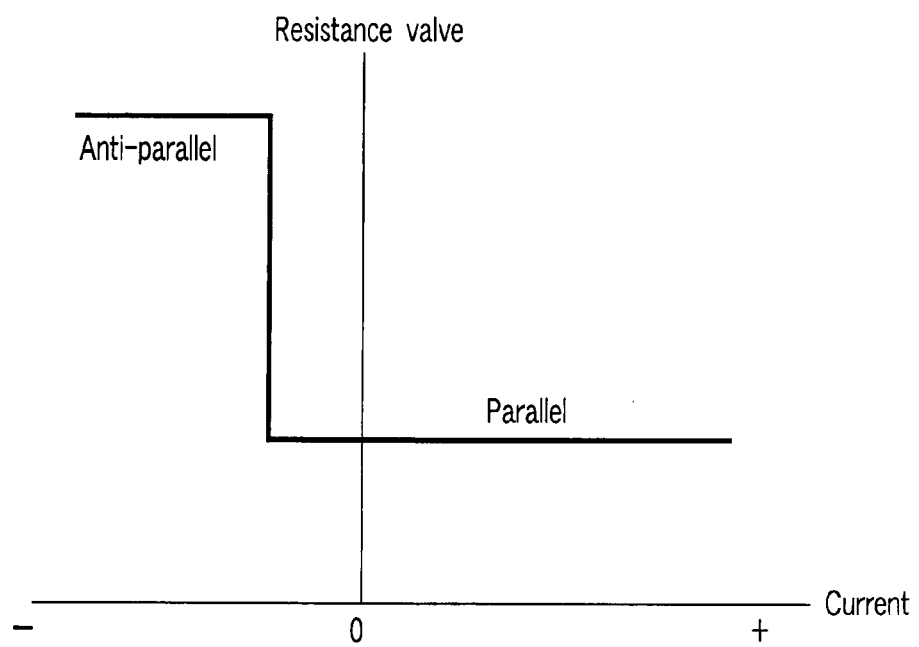
FIG. 31 is a view showing a relationship between a resistance value and a current that flows through the magnetic element of CASE B.

FIG. 31 shows a relationship between the spin injection current and a resistance value of the magnetic element.

The resistance value represents a magnetization state of the magnetic layers 11b, 11d.

When the value of the spin injection current is zero, the magnetic element is in the parallel state, and its resistance value becomes small.

When the spin injection current is made to flow in a negative direction and its current value exceeds a predetermined value, the magnetic element becomes the anti-parallel state and its resistance value becomes large.

Here, in the CASE B, there are two ways in which the spin injection current is zero, and the spin injection current is made to flow in the negative direction. The negative direction is a direction in which the electrons flow from the magnetic layer 11d serving as the magnetization free section toward the magnetic layer 11b serving as the magnetization fixed section (opposite direction as the spin injection current).

(3) CASE C

Figure 32:
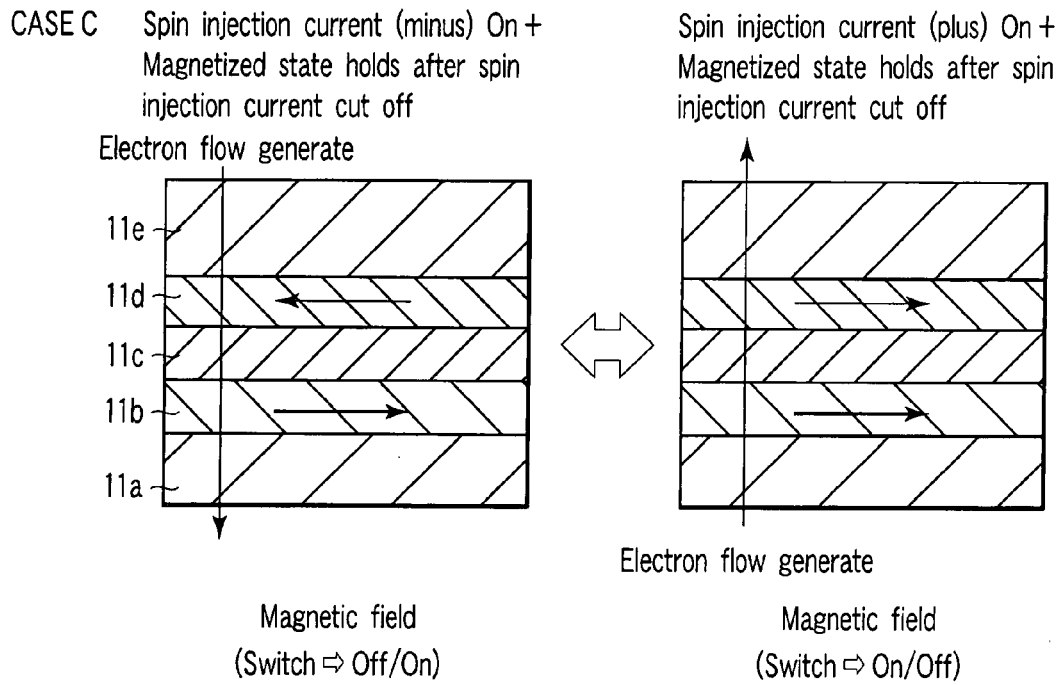
FIG. 32 is a view showing CASE C of the switching principles according to an example of the present invention.
Figure 33:
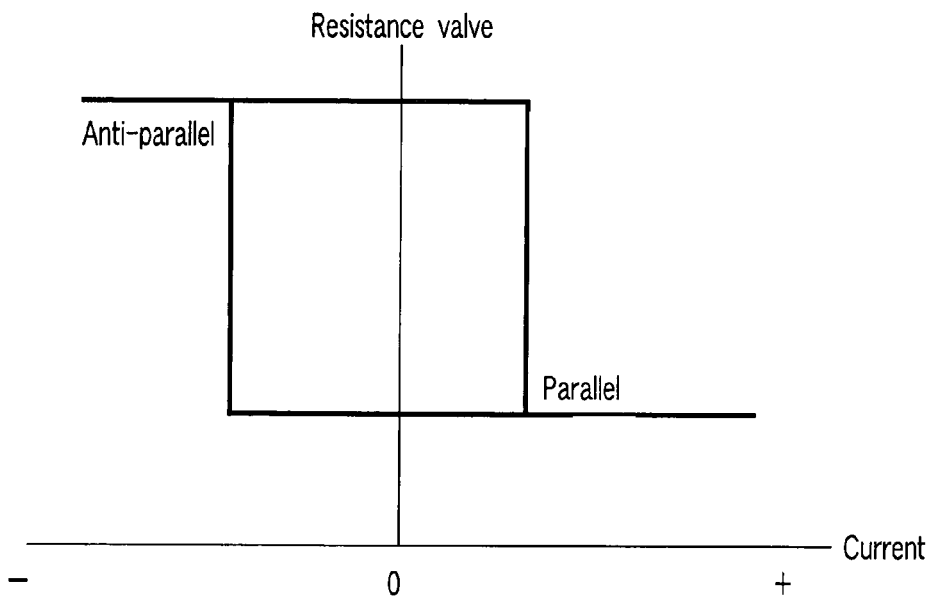
FIG. 33 is a view showing a relationship between a resistance value and a current that flows through the magnetic element of CASE C.

FIG. 32 shows CASE C of the switching principle. FIG. 31 shows a relationship between the spin injection current and a resistance value of the magnetic element.

The CASE C is a case where although an interlayer coupling of the magnetic layers 11b, 11d is weak, the hysteresis of the magnetic layer 11d serving as the magnetization free section is large.

In the CASE C, the magnetic layer 11b becomes the magnetization fixed section, and the magnetic layer 11d becomes the magnetization free section. However, to the contrary, the magnetic layer 11b may become the magnetization free section and the magnetic layer 11d may become the magnetization fixed section. In order to magnetize and fix the magnetic layer 11b, it is preferable that an anti-ferromagnetic layer is further provided between the magnetic layer 11b and the first electrode 11a.

First, when the spin injection current is made to flow in the negative direction and its current value exceeds a predetermined value (critical current), the magnetic element becomes the anti-parallel state and its resistance value becomes large. In the anti-parallel state, as shown in, for example, FIG. 27, the magnetic field lines which come out from the magnetic layers 11b, 11d become the state to be closed between the magnetic layers 11b, 11d. Consequently, values of the leakage magnetic field on the external part of the magnetic element become small.

Therefore, it is impossible to change the spatial position of the conductive tube containing the magnetic fine particles, so that the switch remains to be the OFF state.

Thereafter, even though the spin injection current is cut off, this state remains since the magnetization free section has the hysteresis. That is, the magnetic element within the magnetic field generation section remains to be the anti-parallel state to become a non-volatile switch.

To the contrary, when the spin injection current is made to flow in the positive direction and its current value exceeds a predetermined value (critical current), the magnetic element becomes the parallel state and its resistance value becomes small. In the parallel state, as shown in, for example, FIG. 28, the magnetic field lines which come out from the magnetic layers 11b, 11d become the open state, and thus, values of the leakage magnetic field leaked on the external part of the magnetic element become large.

Therefore, the spatial position of the conductive tube containing the magnetic fine particles changes by the magnetic force according to the magnetic field (to approach to the magnetic field generation section or to recede from the magnetic field generation section).

That is, the switch changes to ON from OFF.

Thereafter, even though the spin injection current is cut off, this state remains since the magnetization free section has the hysteresis. That is, the magnetic element within the magnetic field generation section remains to be the parallel state, to become a non-volatile switch.

In the CASE C, there are three ways in which the spin injection current is zero, the spin injection current is made to flow in the negative direction, and the spin injection current is made to flow in the positive direction.

(4) CASE D

FIG. 34 shows CASE D of the switching principle.

The CASE D is characterized in that, in an initial state, the magnetic layer 11b serving as the magnetization fixed section has a synthetic antiferromagnetic (SAF) structure, and that the magnetic layer 11*d* serving as the magnetization free section is in a heat fluctuation state (state in which magnetic pole is not determined as a whole).

When the spin injection current is OFF (initial state), no electron flow occurs between the first and second electrodes 11*a*, 11*e*, and the magnetic layer 11*d* serving as the magnetization free section is in the heat fluctuation state.

At this time, in the magnetization fixed section having the SAF structure, the magnetization of the plural magnetic layers which are antiferromagnetically coupled is cancelled, and therefore, there is no leakage magnetic field from the magnetization fixed section. Further, since the magnetic layer 11*d* constituting the magnetization free section is also in the heat fluctuation state, the magnetization direction is not determined in the state that no spin injection current flows, and thus, there is no generation of the magnetic field.

Accordingly, since no magnetic field is generated from the magnetic element within the magnetic field generation section, it is impossible to change the spatial position of the conductive tube containing the magnetic fine particles, and thus, the switch is in the OFF state.

To the contrary, when the spin injection current is made ON, flow of the electrons is generated between the first and second electrodes 11*a*, 11*e*, so that the magnetization direction of the magnetic layer 11*d* serving as the magnetization free section is determined. For example, in the case where the flow of the electrons heads toward the magnetization free section from the magnetization fixed section, the magnetization of the magnetic layer 11*d* serving as the magnetization free section faces to the right direction on the drawing. At this time, as described above, the magnetization of the plural antiferromagnetic coupling magnetic layers is cancelled in the magnetization fixed section having the SAF structure. As a consequence, the leakage magnetic field from the magnetization fixed section can be approximately zero. For this reason, a state is established in which the magnetic field is generated from the magnetic layer 11*d* where the magnetic pole is determined as a whole.

Therefore, the spatial position of the conductive tube containing the magnetic fine particles changes by the magnetic force according to the magnetic field (to approach to the magnetic field generation section or to recede from the magnetic field generation section).

That is, the switch changes to ON from OFF.

By the way, when the spin injection current is cut off in the CASE D, the switch returns to the initial state (the heat fluctuation state of the magnetic layer 11*d*) again.

In the CASE D, the electrons are made to flow in the direction toward the magnetization free section from the magnetization fixed section (opposite direction as the spin injection current), so that the magnetization of the magnetic layer 11*d* is made to face to the right. However, instead of this, the electrons are made to flow in the direction toward the magnetization fixed section from the magnetization free section, so that the magnetization of the magnetic layer 11*d* may be made to face to the left.

(5) CASE E

FIG. 35 shows CASE E of the switching principle.

The CASE E is characterized in that the magnetic layer 11*b* serving as the magnetization fixed section has the SAF structure, and that the magnetic layer 11*d* serving as the magnetization free section has the hysteresis. In order to magnetize and fix the magnetic layer 11*b*, it is preferable that an antiferromagnetic layer is provided between the magnetic layer 11*b* and the first electrode 11*a*.

First, when the spin injection current is made to flow in the positive direction and its current value exceeds predetermined value (critical current), the magnetization direction of the magnetic layer 11*d* serving as the magnetization free section faces to the right, and the magnetic element becomes the parallel state.

At this time, in the magnetization fixed section having the SAF structure, the magnetization of the plural magnetic layers which are antiferromagnetically coupled is cancelled. Consequently, regardless of presence/absence or direction of the spin injection current, the leakage magnetic field from the magnetization fixed section can be made to be approximate zero.

Therefore, the conductive tube containing the magnetic fine particles acts upon the magnetic field from the magnetic layer 11*d* serving as the magnetization free section.

Thereafter, even though the spin injection current is cut off, this state remains since the magnetization free section has the hysteresis. That is, the magnetic element within the magnetic field generation section remains the parallel state.

To the contrary, when the spin injection current is made to flow in the negative direction and its current value exceeds a predetermined value (critical current), the magnetization direction of the magnetic layer 11*d* serving as the magnetization free section faces to the left, and the magnetic element becomes the anti-parallel state.

At this time, in the magnetization fixed section having the SAF structure, the magnetization of the plural magnetic layers which are antiferromagnetically coupled is cancelled. For this reason, regardless of presence/absence or direction of the spin injection current, the leakage magnetic field from the magnetization fixed section can be made to be approximate zero.

Accordingly, the conductive tube containing the magnetic fine particles acts upon the magnetic field with the opposite direction to the above-described case from the magnetic layer 11*d* serving as the magnetization free section.

Thereafter, even though the spin injection current is cut off, this state remains since the magnetization free section has the hysteresis. That is, the magnetic element within the magnetic field generation section remains the anti-parallel state.

In the CASE E, the direction of the magnetic field lines of the generated magnetic field changes depending on the direction (magnetization direction of the magnetic layer 11*d*) of the spin injection current. The switching is carried out by utilizing a repulsive force and an attractive force acting upon between the magnetic fine particles and the magnetic field generation section such that the switching is performed with difference of direction of the lines of the magnetic force. The switching is made, for example, in such a manner that the polarity of the fine particles is controlled while adjusting the coercive force and the magnetic anisotropy of the magnetic fine particles provided at the conductive tube.

Note that, in the CASE A to the CASE E, the thickness or planar shape of the magnetic layer 11*d* may be different from the magnetic layer 11*b*. For example, a shape as a whole of the magnetic field generation section is made to be trapezoid, and the planar shape may become small gradually with heading toward the second electrode 11*e* from the first electrode 11*a*.

(6) CASE F

Figure 36:
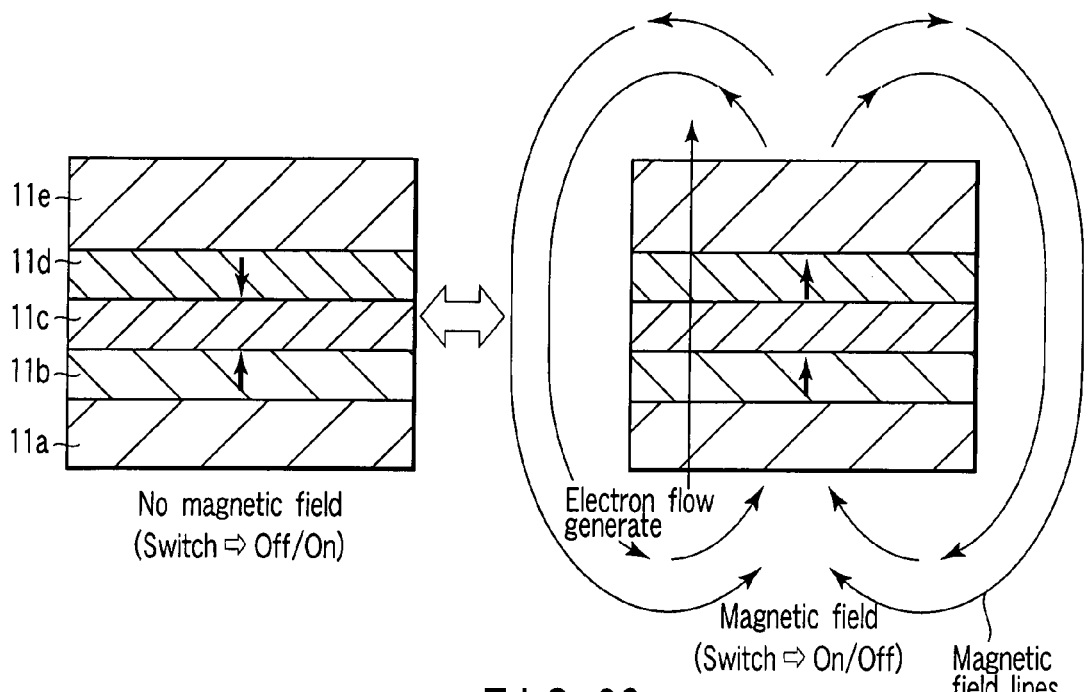
FIG. 36 is a view showing CASE F of the switching principles according to an example of the present invention.

FIG. 36 shows CASE F of the switching principle.

CASE F is a modified example of CASE A. The difference of CASE F from CASE A is that each of the magnetic layers 11*b*, 11*d* is a perpendicular magnetic film.

The perpendicular magnetic film is a magnetic film having what is called a perpendicular magnetic anisotropy in which the direction of magnetization becomes perpendicular (upward or downward) to the film plane.

Here, the film plane means a surface of a film when regarding the magnetic layer as a "film". Therefore, the direction perpendicular to the film plane is a direction in which to laminate a magnetic pinned layer, the magnetic free layer, and non-magnetic layers.

In the initial state, magnetization of the magnetic layers 11b, 11d is in the anti-parallel state. At this time, the magnetic element generates no magnetic field.

On the other hand, when the spin injection current flows to the magnetic element, the magnetization of the magnetic layers 11b, 11d is in the parallel state. At this time, the magnetic element generates the magnetic field.

Therefore, if the magnetic element of CASE F is employed as the magnetic field generation section, the magnetic switching element of the present invention can be implemented.

(7) CASE G

Figure 37:
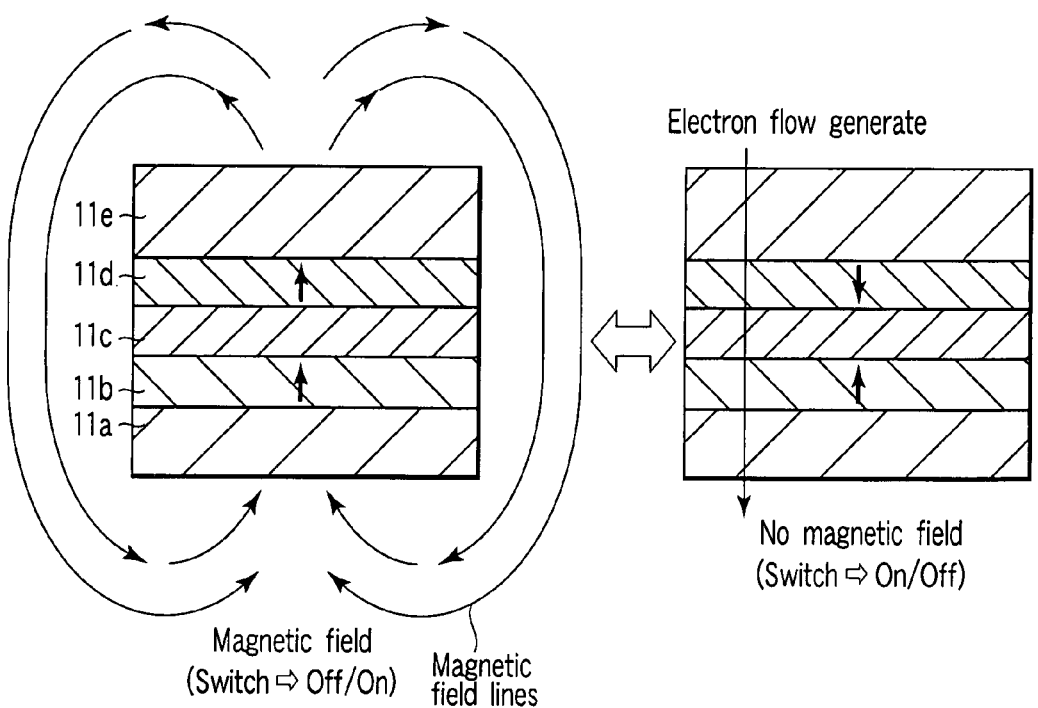
FIG. 37 is a view showing CASE G of the switching principles according to an example of the present invention.

FIG. 37 shows CASE G of the switching principle.

CASE G is a modified example of CASE B. The difference of CASE G from CASE B is that each of the magnetic layers 11b, 11d is a perpendicular magnetic film.

In the initial state, magnetization of the magnetic layers 11b, 11d is in the parallel state. At this time, the magnetic element generates the magnetic field.

On the other hand, when the spin injection current flows to the magnetic element, the magnetization of the magnetic layers 11b, 11d is in the anti-parallel state. At this time, the magnetic element generates no magnetic field.

Therefore, if the magnetic element of CASE G is employed as the magnetic field generation section, the magnetic switching element of the present invention can be implemented.

(8) CASE H

Figure 38:
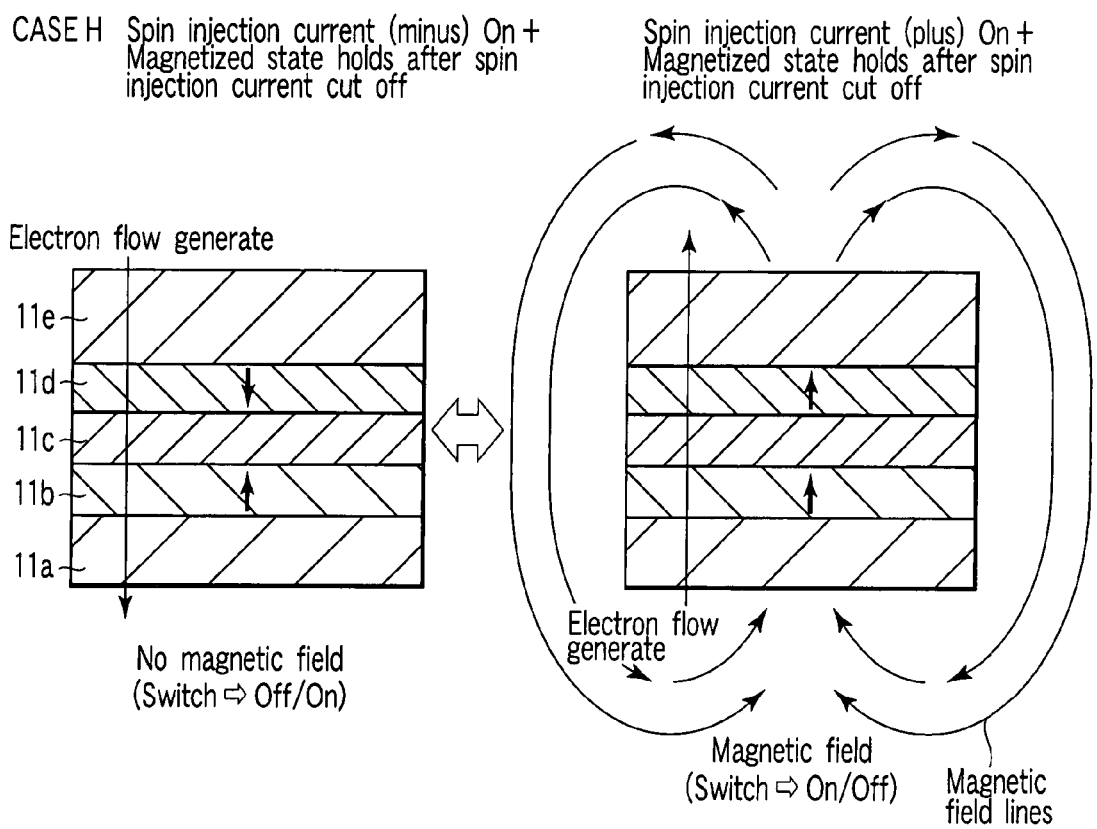
FIG. 38 is a view showing CASE H of the switching principles according to an example of the present invention.

FIG. 38 shows CASE H of the switching principle.

CASE H is a modified example of CASE C. The difference of CASE H from CASE C is that each of the magnetic layers 11b, 11d is a perpendicular magnetic film.

When the spin injection current passing from the magnetic pinned section (for example, the magnetic layer 11b) to the magnetic free section (for example, the magnetic layer 11d) flows to the magnetic element, the electron flows from the magnetic layer 11d to the magnetic layer 11b. As a result, the magnetization of the magnetic layers 11b, 11d is in the anti-parallel state. At this time, the magnetic element generates no magnetic field.

On the other hand, when the spin injection current passing from the magnetic free section (for example, the magnetic layer 11d) to the magnetic pinned section (for example, the magnetic layer 11b) flows to the magnetic element, the electron flows from the magnetic layer 11b to the magnetic layer 11d. As a result, the magnetization of the magnetic layers 11b, 11d is in the parallel state. At this time, the magnetic element generates the magnetic field.

Therefore, if the magnetic element of CASE H is employed as the magnetic field generation section, the magnetic switching element of the present invention can be implemented.

(9) CASE I

Figure 39:
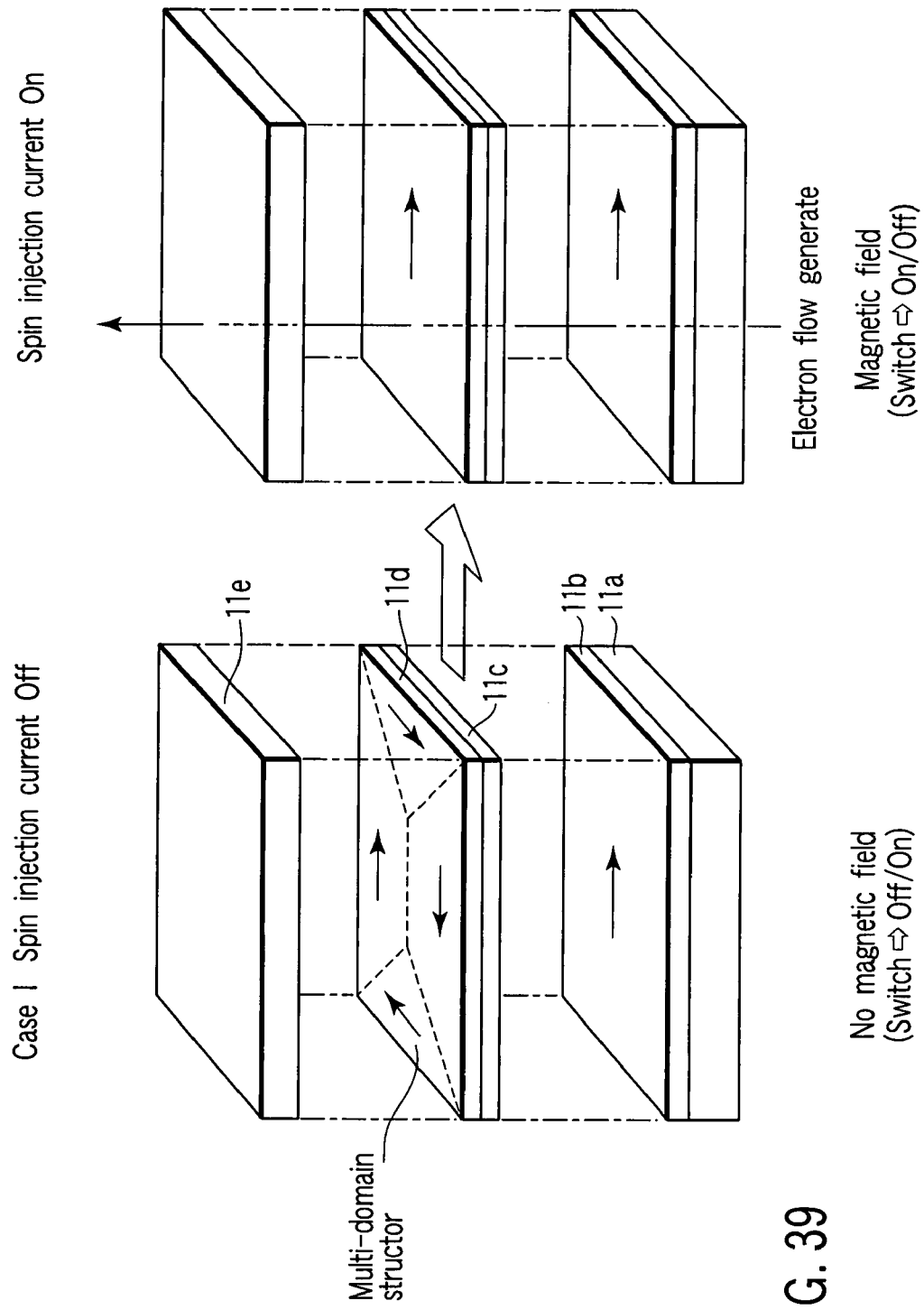
FIG. 39 is a view showing CASE I of the switching principles according to an example of the present invention.

FIG. 39 shows CASE I of the switching principle.

The characteristic of CASE I is that in the initial state, the magnetic free section, i.e. the magnetic layer 11d has a multi-domain structure.

The multi-domain structure is a structure in which the magnetic layer has a plurality of magnetic domains.

In the present CASE, the magnetic layer 11d has four domains, but the number of domains is not limited to this.

In the initial state, the magnetic layer 11d has a multi-domain structure. At this time, the magnetic element generates no magnetic field.

On the other hand, when the spin injection current passing from the magnetic layer 11d to the magnetic layer 11b flows to the magnetic element, the electron flows from the magnetic layer 11b to the magnetic layer 11d.

For this reason, the multi-domain structure of the magnetic layer 11d is broken. In other words, magnetization of the magnetic layer 11d is subjected to spin torque caused by the spin-polarized electrons from the magnetic layer 11b, and faces in the same direction as the direction of magnetization of the magnetic layer 11b.

As a result, magnetization of the magnetic layers 11b, 11d becomes in the parallel state. At this time, the magnetic element generates the magnetic field.

Therefore, if the magnetic element of CASE I is employed as the magnetic field generation section, the magnetic switching element of the present invention can be implemented.

(10) CASE J

Figure 40:
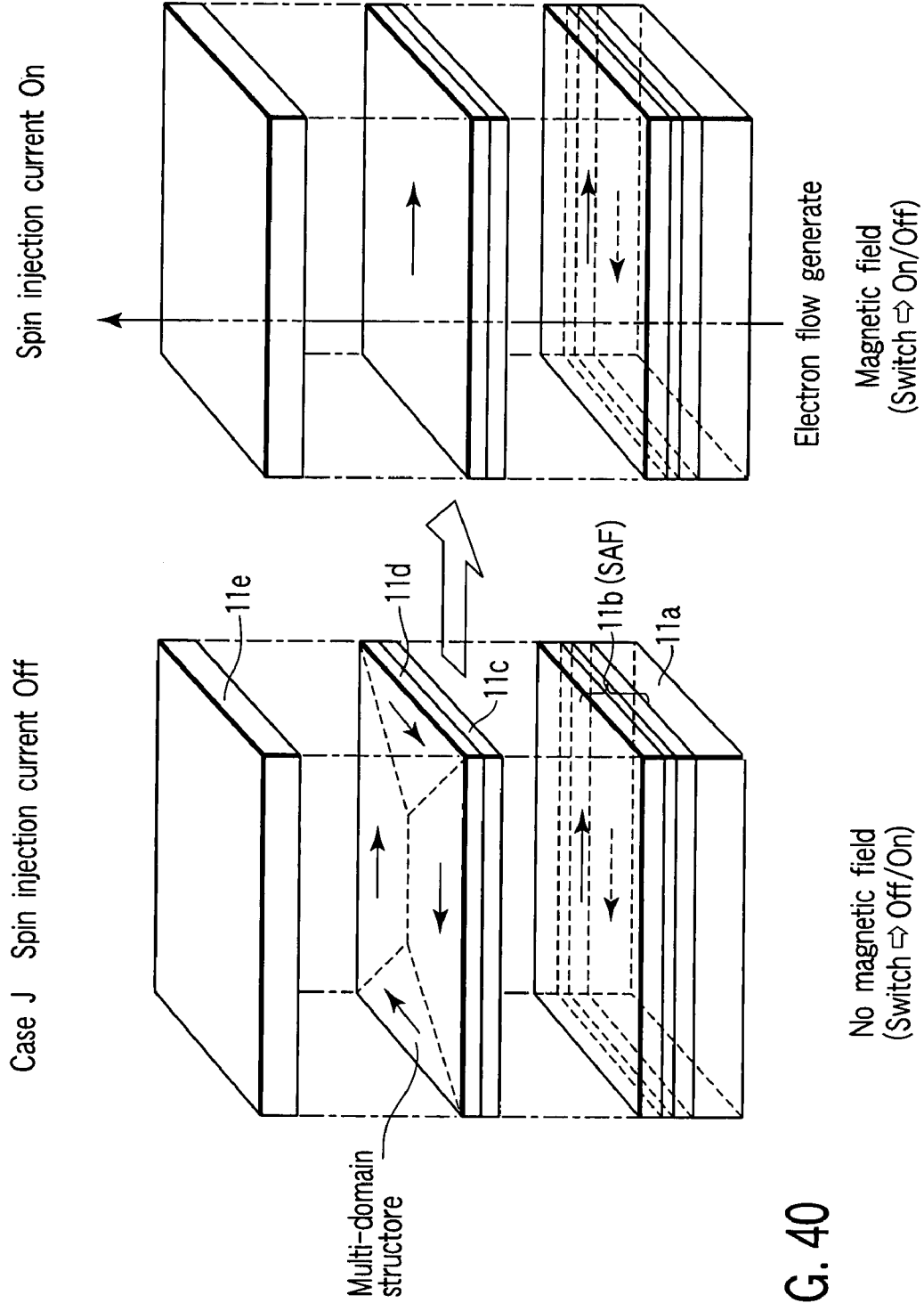
FIG. 40 is a view showing CASE J of the switching principles according to an example of the present invention.

FIG. 40 shows CASE J of the switching principle.

CASE J is a modified example of CASE I. The difference of CASE J from CASE I is that the magnetic layer 11b has SAF (synthetic anti-ferromagnetic) structure.

The magnetic layer 11b is the magnetic pinned section.

In this case, since the magnetic pinned section has no magnetic field generated outside the section, switching of the magnetic switching element can be controlled by only presence/absence of the magnetic field from the magnetic layer 11d serving as the magnetic free layer.

Therefore, in CASE J, there is no influence from the leakage magnetic field of the magnetic pinned section and the controllability of the switching is enhanced.

(11) CASE K

Figure 41:
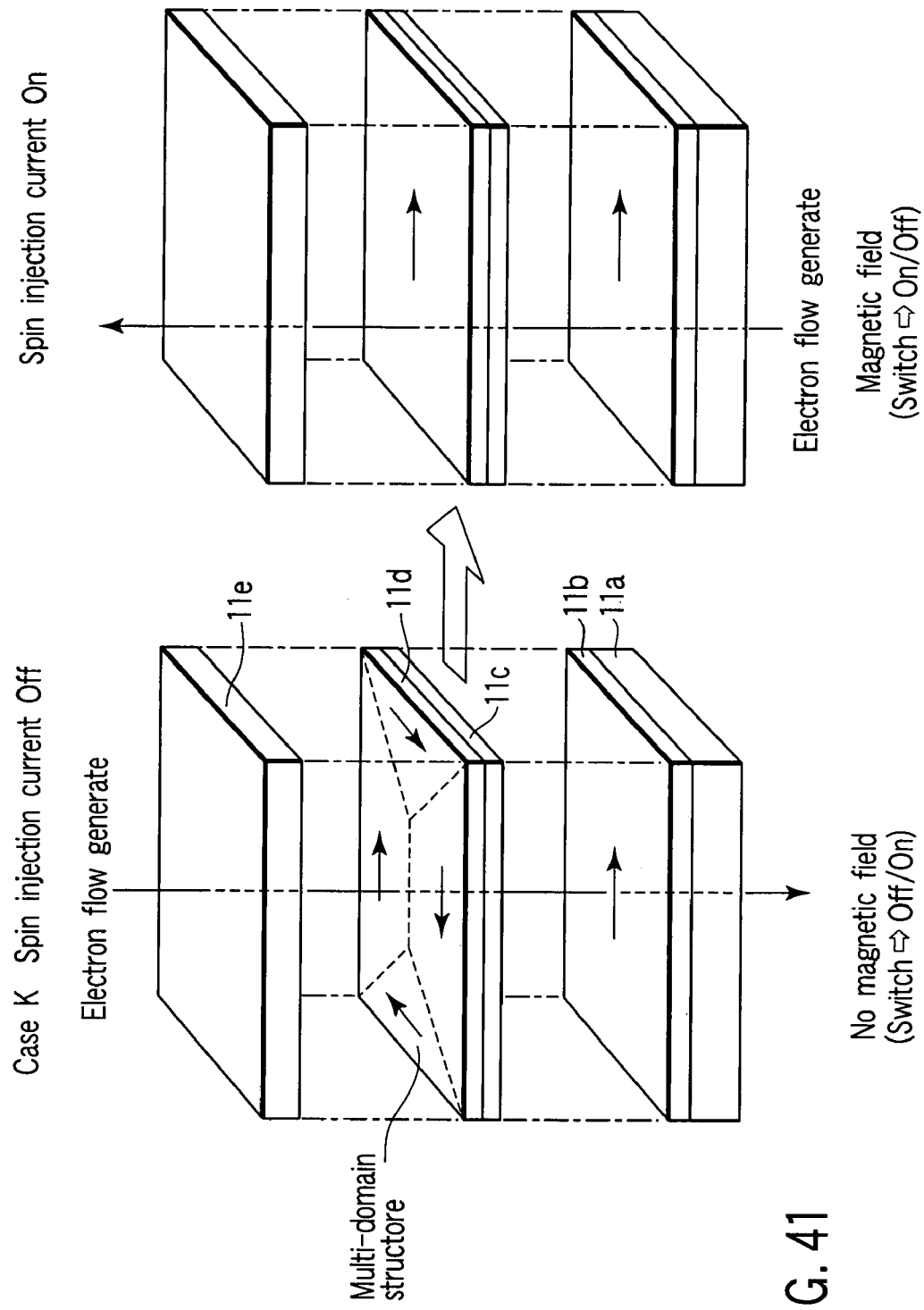
FIG. 41 is a view showing CASE K of the switching principles according to an example of the present invention.

FIG. 41 shows CASE K of the switching principle.

The characteristic of CASE K is that the magnetic free section, i.e. the magnetic layer 11d has the multi-domain structure, similarly to CASE I.

When a small amount of the current passing from the magnetic layer 11b to the magnetic layer 11d flows to the magnetic element, the electron flows from the magnetic layer 11d to the magnetic layer 11b. At this time, the multi-domain structure is formed in the magnetic layer 11d. For this reason, the magnetic element generates no magnetic field.

On the other hand, when the spin injection current passing from the magnetic layer 11d to the magnetic layer 11b flows to the magnetic element, the electron flows from the magnetic layer 11b to the magnetic layer 11d.

For this reason, the multi-domain structure of the magnetic layer 11d is broken. In other words, magnetization of the magnetic layer 11d is subjected to the spin torque caused by the spin-polarized electrons from the magnetic layer 11b, and faces in the same direction as the direction of magnetization of the magnetic layer 11b.

As a result, magnetization of the magnetic layers 11b, 11d becomes in the parallel state. At this time, the magnetic element generates the magnetic field.

Therefore, if the magnetic element of CASE K is employed as the magnetic field generation section, the magnetic switching element of the present invention can be implemented.

(12) CASE L

Figure 42:
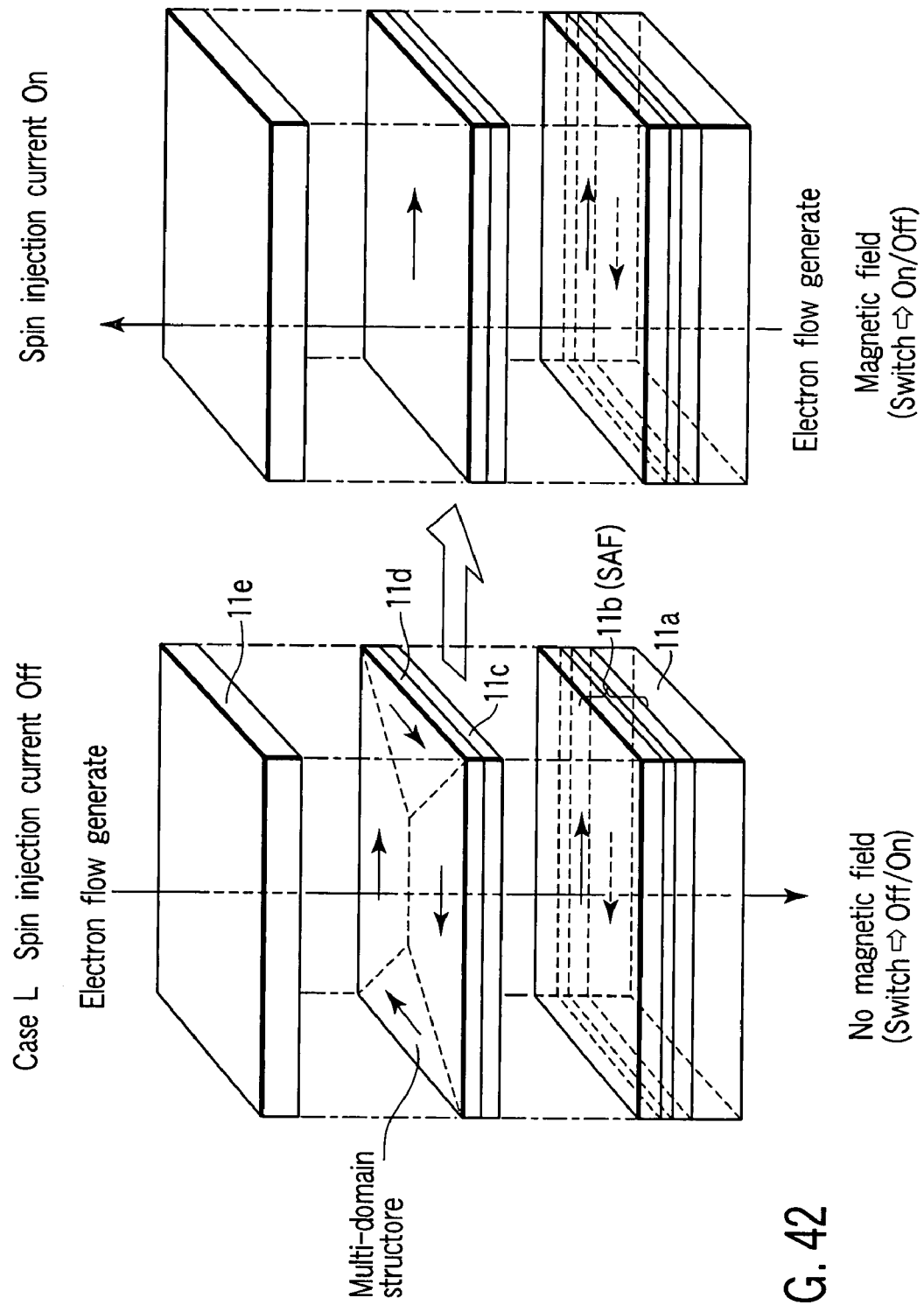
FIG. 42 is a view showing CASE L of the switching principles according to an example of the present invention.

FIG. 42 shows CASE L of the switching principle.

CASE L is a modified example of CASE K. The difference of CASE L from CASE K is that the magnetic layer 11b has the SAF structure.

The magnetic layer 11b is the magnetic pinned section.

In this case, since the magnetic pinned section has no magnetic field generated outside the section, switching of the magnetic switching element can be controlled by only presence/absence of the magnetic field from the magnetic layer 11d serving as the magnetic free layer.

Therefore, in CASE L, there is no influence from the leakage magnetic field of the magnetic pinned section and the controllability of the switching is enhanced.

(13) CASE M

Figure 43:
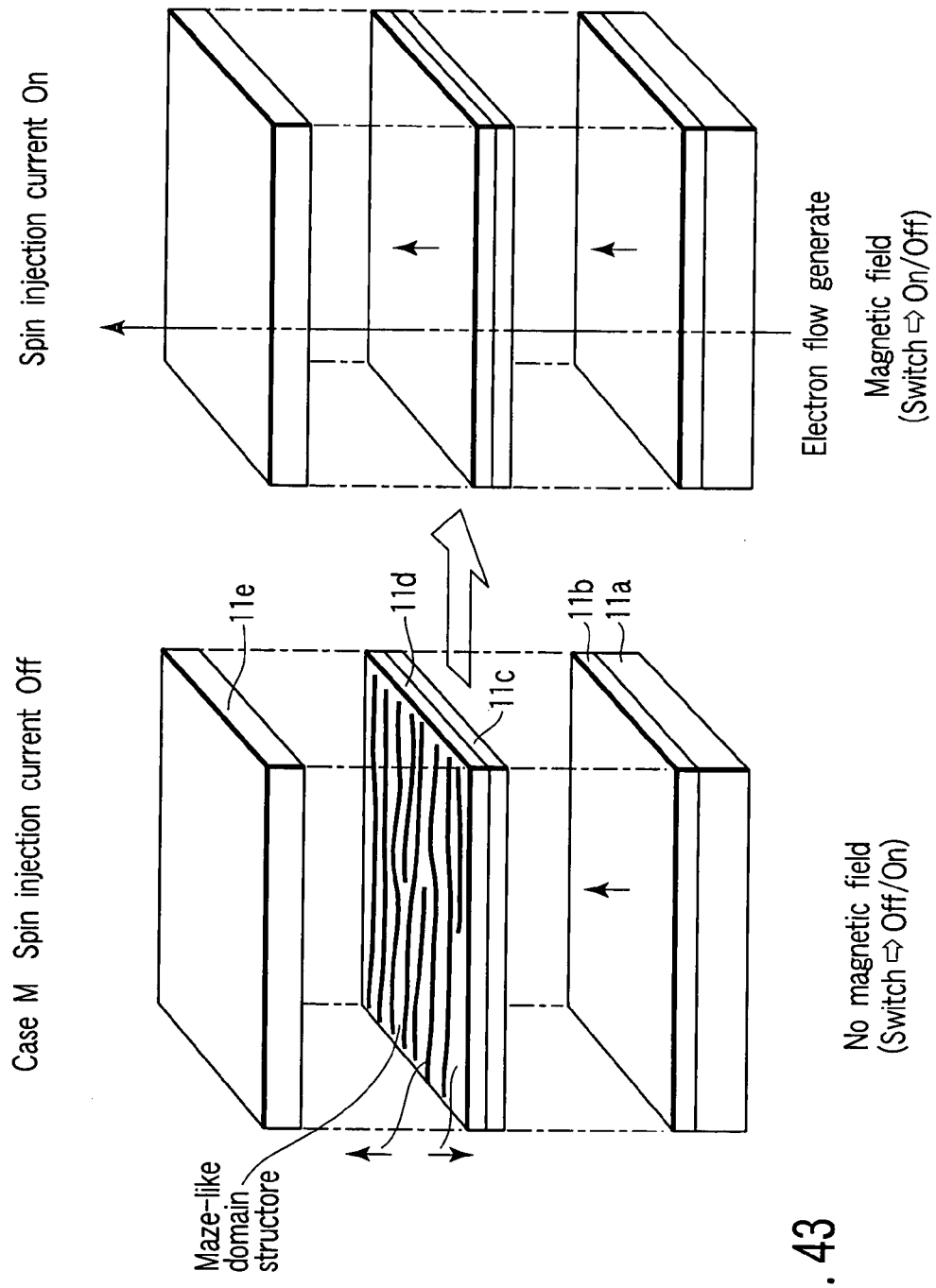
FIG. 43 is a view showing CASE M of the switching principles according to an example of the present invention.

FIG. 43 shows CASE M of the switching principle.

The characteristic of CASE M is that in the initial state, the magnetic free section, i.e. the magnetic layer 11d has a maze-like domain structure.

The maze-like domain structure is a structure having complicated magnetic domains such as the maze.

In the present CASE, lines in the magnetic layer 11d represent upward magnetization, and spaces arranged therein represent downward magnetization.

In the initial state, the magnetic layer 11d has a maze-like domain structure. At this time, the magnetic element generates no magnetic field.

On the other hand, when the spin injection current passing from the magnetic layer 11d to the magnetic layer 11b flows to the magnetic element, the electron flows from the magnetic layer 11b to the magnetic layer 11d.

For this reason, the maze-like domain structure of the magnetic layer 11d is broken. In other words, magnetization of the magnetic layer 11d is subjected to spin torque caused by the spin-polarized electrons from the magnetic layer 11b, and faces in the same direction as the direction of magnetization of the magnetic layer 11b.

As a result, magnetization of the magnetic layers 11b, 11d becomes in the parallel state. At this time, the magnetic element generates the magnetic field.

Therefore, if the magnetic element of CASE M is employed as the magnetic field generation section, the magnetic switching element of the present invention can be implemented.

(14) CASE N

Figure 44:
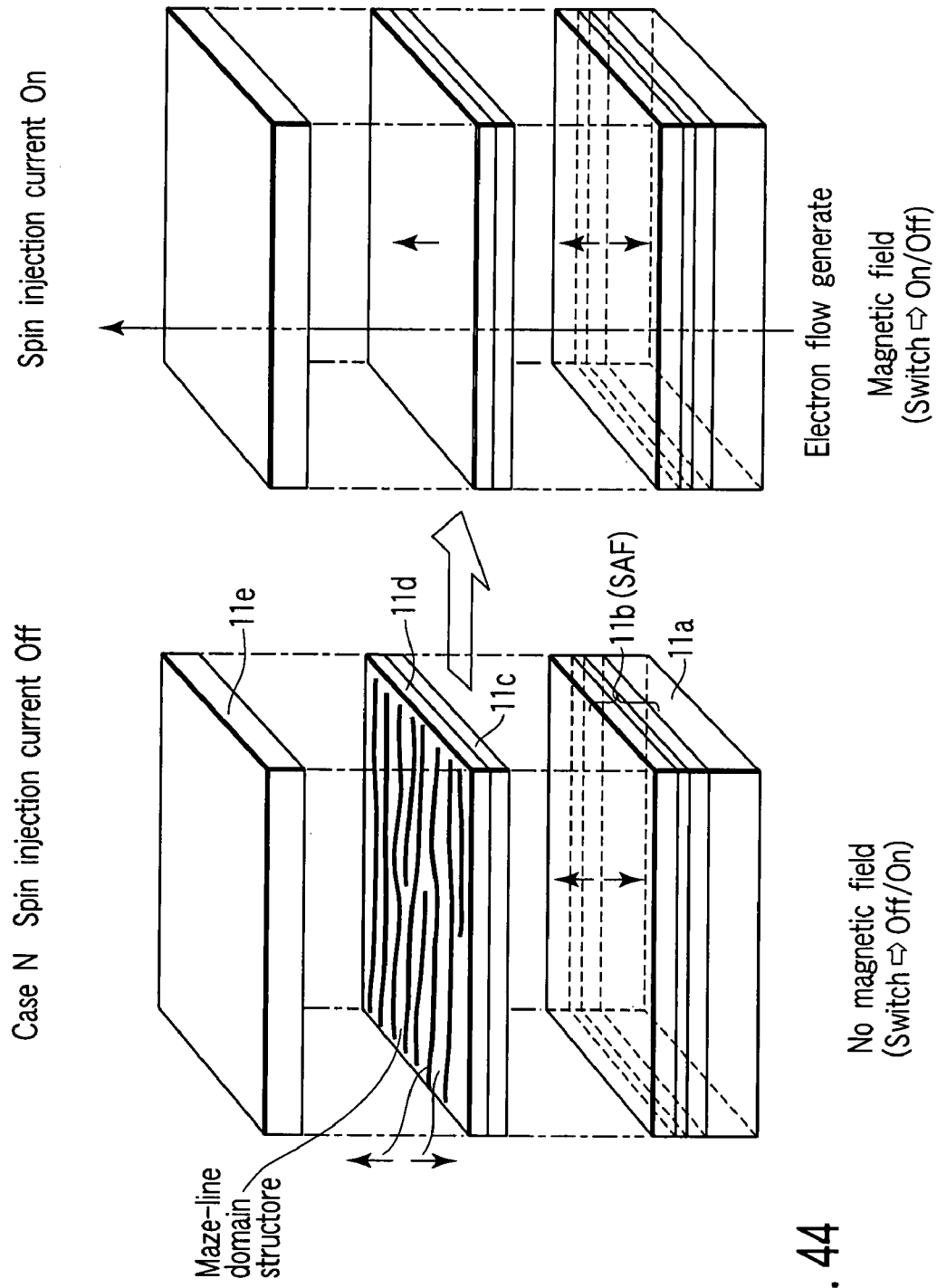
FIG. 44 is a view showing CASE N of the switching principles according to an example of the present invention.

FIG. 44 shows CASE N of the switching principle.

CASE N is a modified example of CASE M. The difference of CASE N from CASE M is that the magnetic layer 11b has the SAF structure.

The magnetic layer 11b is the magnetic pinned section.

In this case, since the magnetic pinned section has no magnetic field generated outside the section, switching of the magnetic switching element can be controlled by only presence/absence of the magnetic field from the magnetic layer 11d serving as the magnetic free layer.

Therefore, in CASE N, there is no influence from the leakage magnetic field of the magnetic pinned section and the controllability of the switching is enhanced.

(15) CASE O

Figure 45:
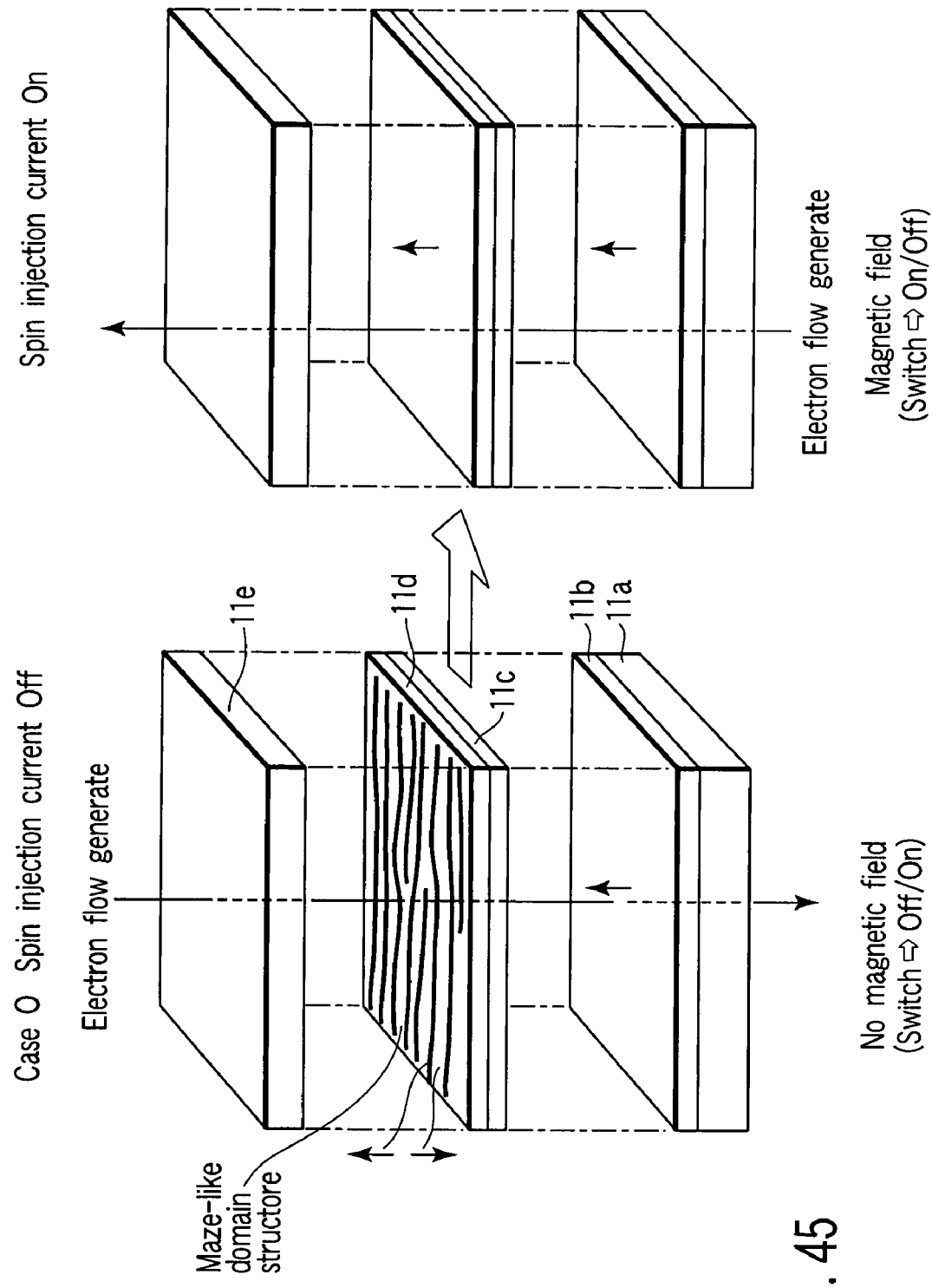
FIG. 45 is a view showing CASE O of the switching principles according to an example of the present invention.

FIG. 45 shows CASE O of the switching principle.

The characteristic of CASE O is that in the initial state, the magnetic free section, i.e. the magnetic layer 11d has the maze-like domain structure, similarly to CASE M.

When a small amount of the current passing from the magnetic layer 11b to the magnetic layer 11d flows to the magnetic element, the electron flows from the magnetic layer 11d to the magnetic layer 11b. At this time, the maze-like domain structure is formed in the magnetic layer 11d. For this reason, the magnetic element generates no magnetic field.

On the other hand, when the spin injection current passing from the magnetic layer 11d to the magnetic layer 11b flows to the magnetic element, the electron flows from the magnetic layer 11b to the magnetic layer 11d.

For this reason, the maze-like domain structure of the magnetic layer 11d is broken. In other words, magnetization of the magnetic layer 11d is subjected to the spin torque caused by the spin-polarized electrons from the magnetic layer 11b, and faces in the same direction as the direction of magnetization of the magnetic layer 11b.

As a result, magnetization of the magnetic layers 11b, 11d becomes in the parallel state. At this time, the magnetic element generates the magnetic field.

Therefore, if the magnetic element of CASE O is employed as the magnetic field generation section, the magnetic switching element of the present invention can be implemented.

(16) CASE P

Figure 46:
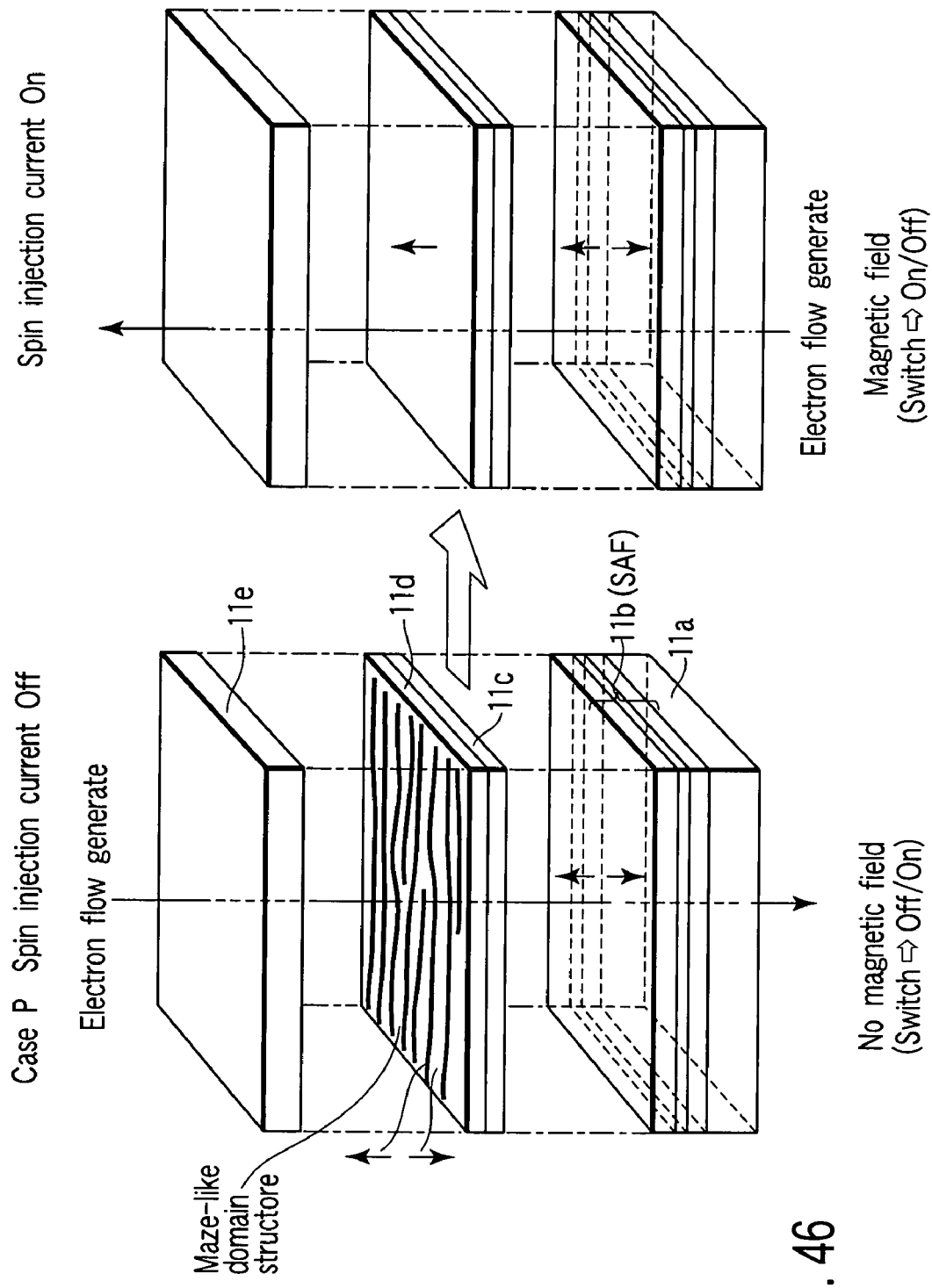
FIG. 46 is a view showing CASE P of the switching principles according to an example of the present invention.

FIG. 46 shows CASE P of the switching principle.

CASE P is a modified example of CASE O. The difference of CASE P from CASE O is that the magnetic layer 11b has the SAF structure.

The magnetic layer 11b is the magnetic pinned section.

In this case, since the magnetic pinned section has no magnetic field generated outside the section, switching of the magnetic switching element can be controlled by only presence/absence of the magnetic field from the magnetic layer 11d serving as the magnetic free layer.

Therefore, in CASE P, there is no influence from the leakage magnetic field of the magnetic pinned section and the controllability of the switching is enhanced.

(17) OTHERS

Figure 47:
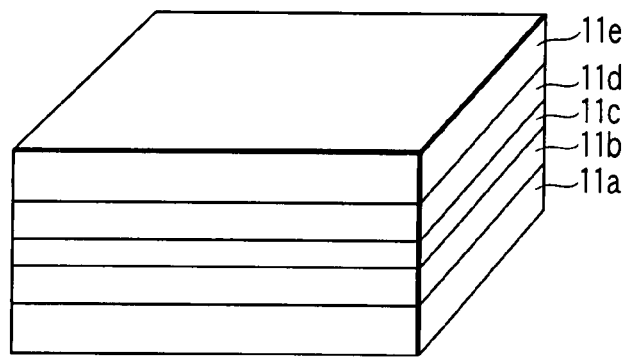
FIG. 47 is a view showing an example of the shape of the magnetic element.
Figure 48:
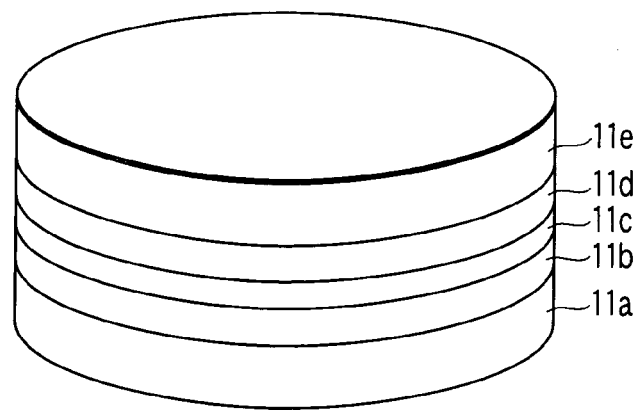
FIG. 48 is a view showing an example of the shape of the magnetic element.
Figure 49:
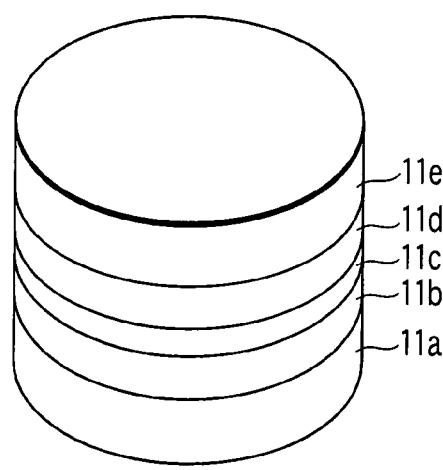
FIG. 49 is a view showing an example of the shape of the magnetic element.

As the shape of the magnetic element, for example, the plane pattern is square as shown in FIG. 47, ellipsoidal as shown in FIG. 48, and circle as shown in FIG. 49.

When the perpendicular magnetic film is employed as the magnetic layer, the number of the magnetic domains is selected from a range from two to indefiniteness as shown in FIG. 50.

6. Manufacturing Method

There will be described about an example of a manufacturing method.

In the example, the case of manufacturing the magnetic switching element of FIGS. 6 and 7 according to the second embodiment will be described.

In FIGS. 6 and 7, the magnetic element within the magnetic field generation section 11 is composed of CoFe (6 nm)/Cu (8 nm)/CoFeB (8 nm). That is, the magnetic layer 11b is defined as the magnetization fixed section, and is composed of CoFe with thickness of 6 nm. Further, the magnetic layer 11d is defined as the magnetization free section, and is composed of CoFeB with thickness of 8 nm. The non-magnetic layer (intermediate layer) 11c is composed of Cu with thickness of 8 nm.

The switching element is formed by the following manufacturing method.

First, the first electrode 11a is formed on a wafer, and then, the wafer is arranged in an ultra vacuum sputtering device. Then, after forming a lamination layer composed of CoFe (6 nm)/Cu (8 nm)/CoFeB (8 nm), the second electrode 11e is formed on the lamination layer.

Next, electron beam (EB) resist is applied thereon, and EB exposure is performed. As a result, a four-sided mask with size of, for example, 70 mm×100 nm is formed. Here, assume that the long side of the four-sided figure is in parallel to the direction of the axis of easy magnetization (direction with magnetic anisotropy) of the magnetic layers 11b, 11d.

Further, using an ion milling device, the first and second electrodes 11a, 11e in the region not covered with the mask and the lamination layer composed of CoFe (6 nm)/Cu (8 nm)/CoFeB (8 nm) are etched to form the magnetic field generation section 11. Thereafter, the mask is separated.

Next, the magnetic field generation section 11 is covered with, for example, an insulating layer made of $SiO_2$, and a surface of the insulating layer is smoothed by the ion milling to expose an upper surface of the second electrode 11e of the magnetic field generation section 11 from the insulating layer. A lead layer is connected to the exposed second electrode 11e.

Similarly, for example, the third electrode 13 made of Ni with column shape of diameter 20 nm is formed due to the EB exposure and the etching. Then, the wafer is arranged in a vacuum chamber, and alcohol gas is introduced toward the wafer at temperature of 40° C. As a result, the carbon nanotube grows on the third electrode 13.

The magnetic switching element is formed by the above manufacturing method.

7. Application

The magnetic switching element according to the example of the present invention can be applied to a signal processing device composed of logic circuits.

(1) First Application

FIG. 51 shows an example of a case where the magnetic switching element according to the example of the invention is used as an inverter circuit.

In the case where the magnetic switching element according to the example of the invention is used as an inverter circuit, one switch unit may be prepared.

When an input signal Vin is "0", no voltage is applied between the first electrode 11a and the second electrode 11e, while when the input signal Vin is "1", voltage is applied between the first electrode 11a and the second electrode 11e. In the state that the voltage is applied between the first electrode 11a and the second electrode 11e, the spin injection current of 50 µA flow into the magnetic element.

In the first application, in order to cause the magnetic switching element to function as the inverter circuit, a channel of the input signal Vin and a channel of an output signal Iout are separated, and further, the magnetic switching element is made to be, for example, the normally-on-type to which the CASE B of the switching principle is applied.

As shown in, for example, FIGS. 38 and 39, the magnetization fixed section and the magnetization free section within the magnetic field generation section 11 are ferromagnetically coupled (parallel state in the initial state) by controlling materials, thickness and the like of the non-magnetic layer (intermediate layer).

Here, as the non-magnetic layer, Cu with thickness of 1.5 nm is used, and as the magnetization free section, CoFeB with thickness of 4 nm is used. The magnetization fixed section is composed of CoFe with thickness of 3 nm functioning as a pinned layer and PtMn serving as an antiferromagnetic layer for fixing magnetization of the pinned layer.

In such a switching element, as shown in waveform diagram of FIG. 52, the magnetic element is in the parallel state when the input signal Vin is "0", and the magnetic field is generated from the magnetic field generation section 11. As a consequence, the terminal A and the terminal B are short circuited, the switch is made ON, and the output signal Iout becomes "1".

Further, when the input signal Vin is "1", the magnetic element is in the anti-parallel state, and the magnetic field is not generated from the magnetic field generation section 11. For this reason, the terminal A is separated from the terminal B, the switch is made OFF, and the output signal Iout becomes "0".

Thus, according to the example of the invention, it is possible to constitute the inverter circuit by using one switch unit.

(2) Second Application

FIG. 55 shows an example of a case where the magnetic switching element according to the example of the invention is used as an AND gate circuit.

In the case where the magnetic switching element according to the example of the invention is used as the AND gate circuit, two switch units connected in series may be used.

In the respective switch units, no voltage is applied between the first electrode 11a and the second electrode 11e when the input signals V1, V2 are "0", while voltage is applied between the first electrode 11a and the second electrode 11e when the input signals V1, V2 are "1". In the state that the voltage is applied between the first electrode 11a and the second electrode 11e, the spin injection current of 50 µA flow into the magnetic element.

In the second application, in order to cause the magnetic switching element to function as the AND gate circuit, a channel of the input signals V1, V2 and a channel of the output signal Iout are separated, and further, the magnetic switching element is made to be, for example, the normally-off-type to which the CASE D of the switching principle is applied.

For example, assume that, in the respective switch units, the magnetization fixed section within the magnetic field generation section 11 has the SAF structure (refer to FIG. 34). That is, two ferromagnetic layers within the magnetization fixed section are antiferromagnetically coupled by controlling materials, thickness and the like of the non-magnetic layer within the magnetization fixed section.

Here, an antiferromagnetically coupled film made of CoFe/Ru/CoFe is used as the magnetization fixed section. Further, PtMn is arranged between the antiferromagnetically coupled film and the first electrode, the magnetization direction is fixed firmly due to exchange bias. In addition, assume that the magnetization free section is made of NiFe, and has a size to become heat fluctuation state at room temperature.

As shown in a waveform diagram of FIG. 56, when the input signals V1, V2 are "00", "01", "10" in such a switching element, the magnetization free section of at least one of two switch units is in the heat fluctuation state, so that the state is established in which no magnetic field is generated from the magnetic field generation section 11.

For this reason, at least one of the two switch units is in the OFF state, so that the input signal Iout becomes "0".

Further, when the input signals V1, V2 are "11", the magnetization direction of the magnetization free section within the two switch units is determined. Consequently, the two switch units are in the ON state, so that the output signal Iout becomes "1".

Thus, according to the example of the invention, it is possible to constitute the AND gate circuit by using two switch units.

(3) Third Application

FIG. 57 shows an example of a case where the magnetic switching element according to the example of the invention is used as OR gate circuit.

In the case where the magnetic switching element according to the example of the invention is used as the OR gate circuit, two switch units connected in parallel may be used.

In the respective switch units, no voltage is applied between the first electrode 11a and the second electrode 11e when the input signals V1, V2 are "0", while voltage is applied between the first electrode 11a and the second electrode 11e when the input signals V1, V2 are "1". In the state that the voltage is applied between the first electrode 11a and the second electrode 11e, the spin injection current of 50 µA flow into the magnetic element.

In the third application, in order to cause the magnetic switching element to function as the OR gate circuit, a channel of the input signals V1, V2 and a channel of the output signal Iout are separated, and further, the magnetic switching element is made to be, for example, the normally-off-type to which the CASE D of the switching principle is applied.

For example, assume that, in the respective switch units, the magnetization fixed section within the magnetic field generation section 11 has the SAF structure (refer to FIG. 34). That is, two ferromagnetic layers within the magnetization fixed section are antiferromagnetically coupled by controlling materials, thickness and of the non-magnetic layer within the magnetization fixed section.

Here, like the second application, an antiferromagnetically coupled film made of CoFe/Ru/CoFe is used as the magnetization fixed section. Further, PtMn is arranged between the antiferromagnetically coupled film and the first electrode, and the magnetization direction is fixed firmly due to exchange bias. In addition, assume that the magnetization free section is made of NiFe, and has a size to become heat fluctuation state at room temperature.

Figures 58, 59:
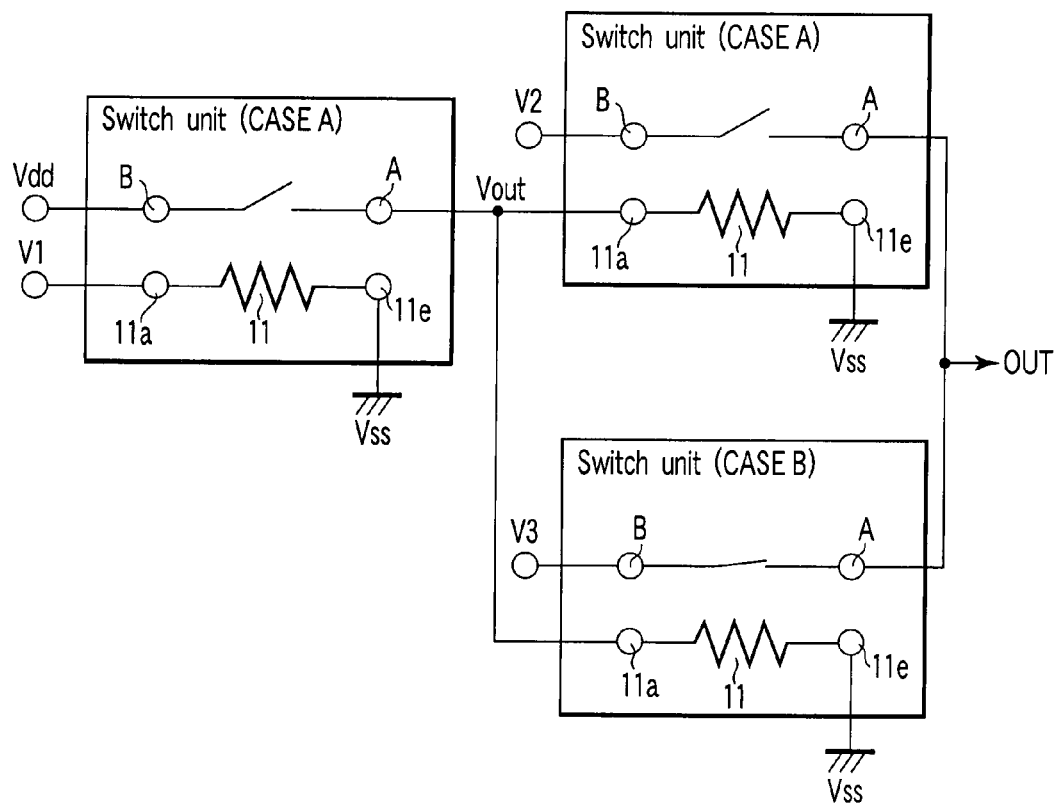
FIG. 58 is a waveform diagram showing an input/output waveform of the OR gate circuit of FIG. 57.
FIG. 59 is a circuit diagram showing an example of a signal processing device using a magnetic switching element.

As shown in a waveform diagram of FIG. 58, when the input signals V1, V2 are "00" in such a switching element, the magnetization free sections of two switch units are in the heat fluctuation state, so that the state is established in which no magnetic field is generated from the magnetic field generation section 11.

For this reason, the two switch units are in the OFF state, so that the input signal Iout becomes "0".

In addition, when the input signals V1, V2 are "01", "10" and "11", the magnetization direction of the magnetization free section within at least one of two switch units is determined. As a consequence, the at least one switch unit is in the ON state, so that the output signal Iout becomes "1".

Thus, according to the example of the invention, it is possible to constitute the OR gate circuit by using two switch units.

(4) The Others

In the case of realizing an information processing device by using the magnetic switching element according to the example of the invention, two methods are available as the method in which plural switch units are related to each other.

One is a method in which an output signal of the front-stage switch unit is used as a control signal of the rear-stage switch unit.

For example, in the information processing device shown in FIG. 59, the CASE A is used as the switching principle of the front-stage switch unit, while the CASE A and the CASE B are used as the switching principle of the rear-stage switch unit, whereby it is possible to realize a multiplexer (selection circuit) which outputs output signals V2, V3 selectively based on the value of the control signal V1.

Figure 60:
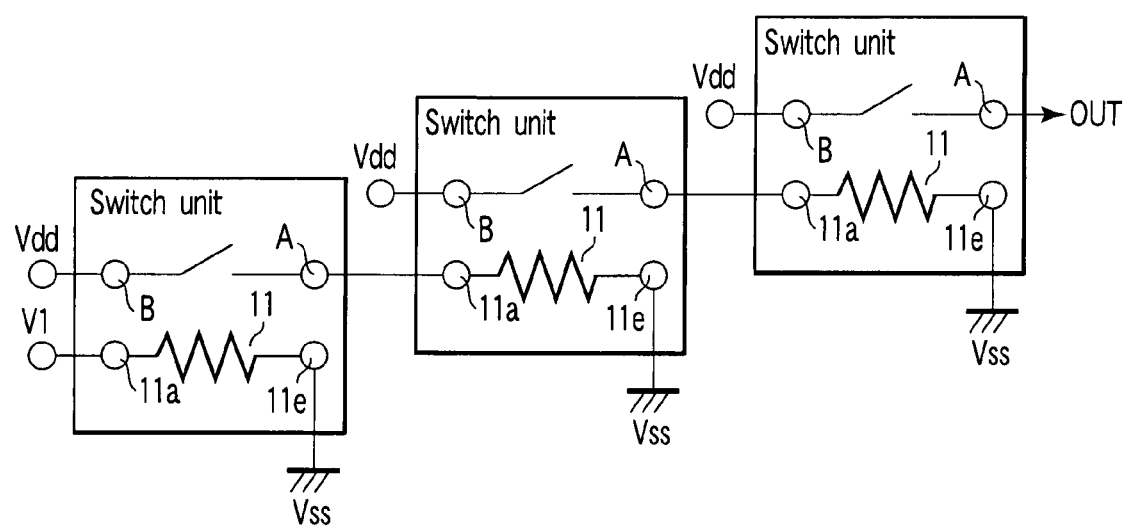
FIG. 60 is a circuit diagram showing an example of a signal processing device using a magnetic switching element.

Further, in the information processing device shown in FIG. 60, it is possible to realize a delay circuit composed of three stages of a buffer in such a manner that the CASE A or the CASE D is used as the switching principle of each switching unit, and these are caused to function as the buffer.

The other is a method in which terminals A or terminals B are connected with each other, or the terminal A is connected to the terminal B with respect to the plural switch units.

According to this method, it is possible to realize the logic circuit such as the AND gate circuit or the OR gate circuit as shown in the second and third applications.

7. Application Example

There will be described an application example.

Because of characteristic of capable of being formed on the silicon substrate, the magnetic switching element according to the example of the invention can be applied to a semiconductor integrated circuit such as a semiconductor memory, a logic LSI or a memory mixed logic LSI.

Further, the example of the invention can be also applied to discrete products in which only one function (for example, an inverter, a multiplexer or the like) is formed in one chip.

Hereinafter, there will be described a case where the example of the invention is applied to a semiconductor memory.

Figure 61:
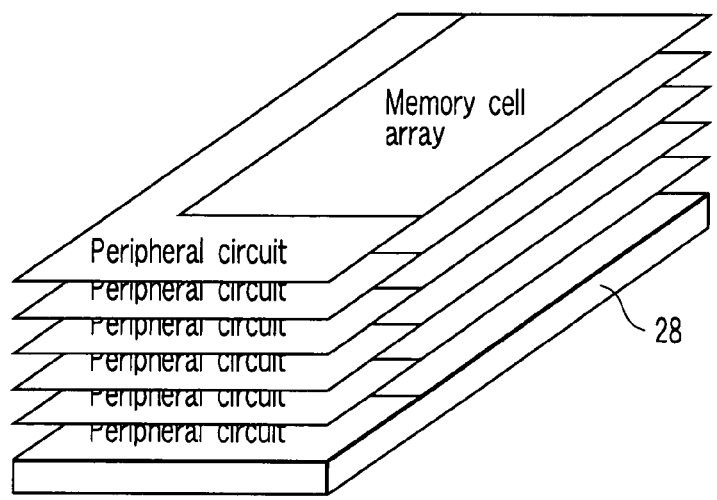
FIG. 61 is a view showing a semiconductor memory to which an example of the present invention is applied.

FIG. 61 shows a semiconductor memory in which a memory cell array is laminated.

As elements composing the semiconductor memory, there are roughly a memory cell array and a peripheral circuit. In the two-dimensional layout in which the memory cell array and the peripheral circuit are arranged flatly on a chip 28, limits already take place in realization of high density of elements due to micro miniaturization.

Accordingly, realization of 3D of the semiconductor memory is investigated. However, although the laminated structure in connection with the memory cell array is realized relatively easy, realization of 3D is very difficult with respect to the peripheral circuit serving as the logic circuit. This is caused by the fact that laminating the MOS transistor as the switch is difficult.

In the example of the invention, the peripheral circuit is composed of the magnetic switching elements instead of the MOS transistor. Therefore, also concerning the peripheral circuit, the laminated structure can be realized relatively easy. Consequently, according to the example of the invention, true realization of 3D can be realized.

Figure 62:
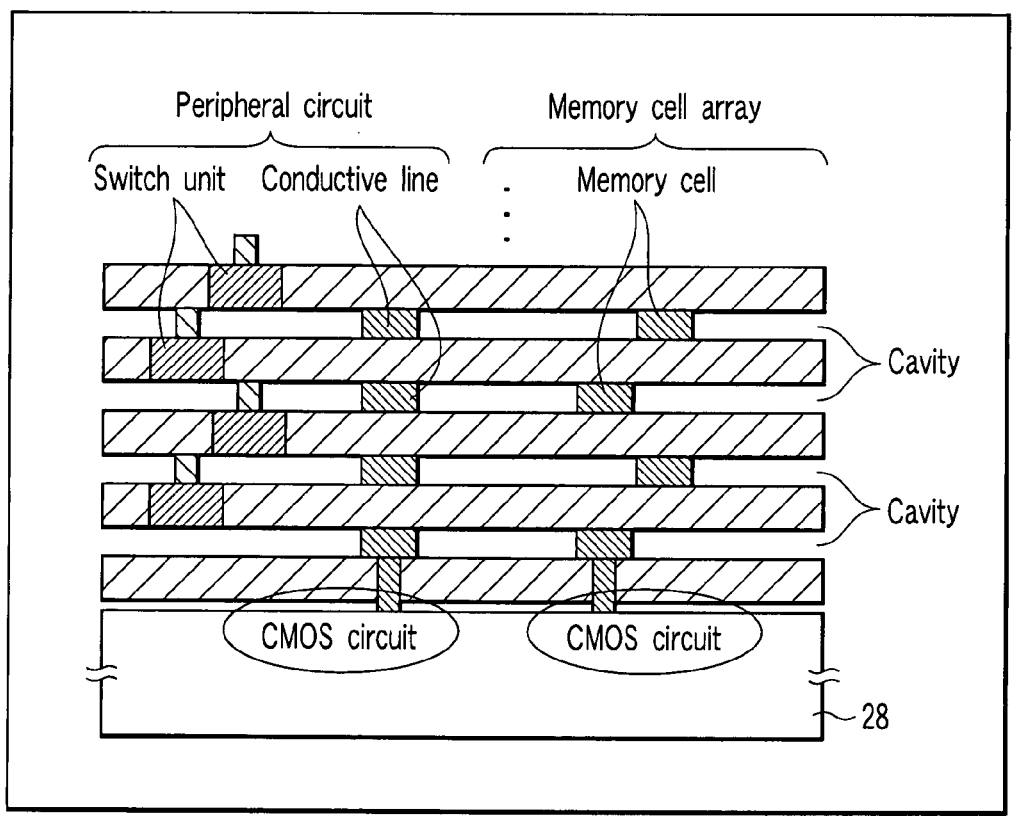
FIG. 62 is a view showing an image of 3D-chip to which an example of the present invention is applied.

FIG. 62 shows an image of the laminated structure of the semiconductor memory with 3D shaped.

On the surface region of the semiconductor substrate (chip) 28, a CMOS circuit is formed. In the memory cell array region, a memory cell (magnetoresistance effect element) is stacked, and in the peripheral circuit region, the switch unit according to the example of the invention is stacked.

Although a wiring is also stacked, the periphery of the wiring is made to be the cavity by utilizing the cavity necessary for the switch unit, and it is possible to realize a so-called aerial wiring structure. In this case, since parasitic capacitance produced between the wirings is reduced, it is possible to contribute to further high speed operation.

Note that application of the example of the invention is not limited to kind of the semiconductor memory. For example, the application to a programmable random access memory (PRAM), a magnetic random access memory (MRAM) or the like is possible.

Furthermore, according to the example of the invention, it is possible to scheme realization of 3D concerning signal processing devices, such as, for example, a micro computer, a micro processor, a graphic processor, a DSP, and an operation processing circuit.

The greatest benefit of realization of 3D in these signal processing devices is that the information transmitting speed can be improved, in other words, it is possible to widen a band width. This is because, in the three-dimensional layout, circuit blocks are adjacent to each other with not a line but a face, so that in comparison with the two-dimensional layout, it is possible to shorten a bus for connecting the circuit blocks with each other and to increase the number of such buses.

In addition, the non-volatile switching element of the present invention can be applied to a programmable logic such as a field programmable gate allay (FPGA).

FIG. 63 shows a structure image of FPGA.

Within the chip 28, wiring channels 30 are arranged vertically and horizontally in advance together with plural logical blocks 29. As a switching matrix necessary for connection between the logical blocks 29, the present example uses the magnetic switching element (switch unit) 31 instead of anti-fuse or SRAM. In this case, rewriting to the switching element becomes possible, and even though the power supply is turned off, the nonvolatile state can remain, which makes it possible to contribute to the power saving.

8. The Others

According to the examples of the present invention, it is possible to provide a magnetic switching element in which the ON/OFF resistance is infinity, the ON resistance is very small, and miniaturization is possible, and further the magnetic switching element is based on new principle capable of maintaining the switch state in nonvolatile, and also a signal processing device using the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic switching element comprising:
   a magnetic element which has a magnetization fixed section whose magnetization direction is fixed, a magnetization free section whose magnetization direction changes due to spin-polarized electrons, and a non-magnetic intermediate layer between the magnetization fixed section and the magnetization free section;
   first and second electrodes which puts the magnetic element therebetween;
   a current control section which is connected to the first and second electrodes, the current control section controlling the magnetization direction of the magnetization free section in such a manner that a current is made to flow between the magnetization fixed section and the magnetization free section;
   a movable conductive tube having a fixed end and a free end;
   a magnetic fine particle provided at the conductive tube; and
   a third electrode connected to the fixed end of the conductive tube.

2. The magnetic switching element according to claim 1, wherein a state that the magnetic fine particle comes into contact with the first electrode, the second electrode or the magnetic element is defined as an ON state, while a state that the magnetic fine particle is separated from the first electrode, the second electrode or the magnetic element is defined as an OFF state.

3. The magnetic switching element according to claim 1, further comprising a fourth electrode independent of the first, second and third electrodes,
   wherein a state that the magnetic particles come into contact with the fourth electrode is defined as an ON state, while a state that the magnetic fine particle is separated from the fourth electrode is defined as an OFF state.

4. The magnetic switching element according to claim 1, further comprising a dummy electrode arranged at a position opposite to the third electrode.

5. The magnetic switching element according to claim 1, wherein the magnetic fine particle is arranged at the free end of the conductive tube.

6. The magnetic switching element according to claim 1, wherein the magnetization of the magnetic element is in an anti-parallel state in a state that the current does not flow, while the magnetization of the magnetic element is in a parallel state in a state that the current flows.

7. The magnetic switching element according to claim 1, wherein the magnetization of the magnetic element is in a parallel state in a state that the current does not flow, while the magnetization of the magnetic element is in an anti-parallel state in a state that the current flows.

8. The magnetic switching element according to claim 1, wherein when the current flows in a first direction, the magnetic element remains in a parallel state even though the current is cut off thereafter, while when current flows in a second direction, the magnetic element remains in an anti-parallel state even though the current is cut off thereafter.

9. The magnetic switching element according to claim 1, wherein the magnetization fixed section has an SAF structure, and the magnetization of the magnetization free section is in a heat fluctuation state in a state that the current does not flow, while the magnetization of the magnetization free section heads toward one direction in a state that the current flows.

10. The magnetic switching element according to claim 1, wherein the magnetization fixed section has an SAF structure, and the magnetization of the magnetization free section heads toward one direction in a state that the current flows in a first direction, while the magnetization of the magnetization free section heads toward another direction opposite to the one direction in a state that the current flows in a second direction.

11. The magnetic switching element according to claim 1, wherein the magnetic switching element is in an OFF state in a state that the current does not flow.

12. The magnetic switching element according to claim 1, wherein the magnetic switching element is in an ON state in a state that the current does not flow.

13. The magnetic switching element according to claim 1, wherein the magnetic switching element is in an OFF state in a state that the current flows in a first direction, while the magnetic switching element is in an ON state in a state that the current flows in a second direction.

14. The magnetic switching element according to claim 1, wherein the non-magnetic intermediate layer is composed of a non-magnetic conductive layer.

15. The magnetic switching element according to claim 1, wherein the conductive tube is arranged within a cavity covered with an insulating layer.

16. A signal processing device comprising:
    switch units each comprising the magnetic switching element according to claim 1,
    wherein a logic circuit is composed of combination of the switch units.

17. The signal processing device according to claim 16, wherein the switch units are stacked on a semiconductor substrate.

18. A magnetic switching element comprising:
    a magnetic element which has a magnetization fixed section whose magnetization direction is fixed, a magnetization free section whose magnetization direction changes due to spin-polarized electrons, and a non-magnetic intermediate layer between the magnetization fixed section and the magnetization free section;
    first and second electrodes which put the magnetic element therebetween;
    a current control section which is connected to the first and second electrodes, the current control section controlling the magnetization direction of the magnetization free section in such a manner that a current is made to flow between the magnetization fixed section and the magnetization free section;

a movable conductive tube having a fixed end and a free end;

a third electrode connected to the fixed end of the conductive tube;

a magnetic fine particle provided at the conductive tube; and a supporting stand which supports the free end of the conductive tube.

19. The magnetic switching element according to claim 18, wherein a state that the magnetic fine particle comes into contact with the first electrode, the second electrode or the magnetic element is defined as an ON state, while a state that the magnetic fine particle is separated from the first electrode, the second electrode or the magnetic element is defined as an OFF state.

20. The magnetic switching element according to claim 18, further comprising a fourth electrode independent of the first, second and third electrodes, wherein a state that the magnetic particles come into contact with the fourth electrode is defined as an ON state, while a state that the magnetic fine particle is separated from the fourth electrode is defined as an OFF state.

21. The magnetic switching element according to claim 18, wherein the magnetic fine particle is included in the conductive tube.

22. The magnetic switching element according to claim 18, wherein the magnetization of the magnetic element is in an anti-parallel state in a state that the current does not flow, while the magnetization of the magnetic element is in a parallel state in a state that the current flows.

23. The magnetic switching element according to claim 18, wherein the magnetization of the magnetic element is in a parallel state in a state that the current does not flow, while the magnetization of the magnetic element is in an anti-parallel state in a state that the current flows.

24. The magnetic switching element according to claim 18, wherein, when the current flows in a first direction, the magnetic element remains in a parallel state even though the current is cut off thereafter, while when current flows in a second direction, the magnetic element remains in an anti-parallel state even though the current is cut off thereafter.

25. The magnetic switching element according to claim 18, wherein the magnetization fixed section has an SAF structure, and the magnetization of the magnetization free section is in a heat fluctuation state in a state that the current does not flow, while the magnetization of the magnetization free section heads toward one direction in a state that the current flows.

26. The magnetic switching element according to claim 18, wherein the magnetization fixed section has an SAF structure, and the magnetization of the magnetization free section heads toward one direction in a state that the current flows in a first direction, while the magnetization of the magnetization free section heads toward another direction opposite to the one direction in a state that the current flows in a second direction.

27. The magnetic switching element according to claim 18, wherein the magnetic switching element is in an OFF state in a state that the current does not flow.

28. The magnetic switching element according to claim 18, wherein the magnetic switching element is in an ON state in a state that the current does not flow.

29. The magnetic switching element according to claim 18, wherein the magnetic switching element is in an OFF state in a state that the current flows in a first direction, while the magnetic switching element is in an ON state in a state that the current flows in a second direction.

30. The magnetic switching element according to claim 18, wherein the non-magnetic intermediate layer is composed of a non-magnetic conductive layer.

31. The magnetic switching element according to claim 18, wherein the conductive tube is arranged within a cavity covered with an insulating layer.

32. A signal processing device comprising:

switch units each comprising the magnetic switching element according to claim 18, wherein a logic circuit is composed of combination of the switch units.

33. The signal processing device according to claim 32, wherein the switch units are stacked on a semiconductor substrate.

* * * * *